US010908016B2

(12) United States Patent
Hirose et al.

(10) Patent No.: US 10,908,016 B2
(45) Date of Patent: Feb. 2, 2021

(54) LIGHT DETECTING DEVICE

(71) Applicant: HAMAMATSU PHOTONICS K.K., Hamamatsu (JP)

(72) Inventors: Masaki Hirose, Hamamatsu (JP); Katsumi Shibayama, Hamamatsu (JP); Takashi Kasahara, Hamamatsu (JP); Toshimitsu Kawai, Hamamatsu (JP); Hiroki Oyama, Hamamatsu (JP); Yumi Kuramoto, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 16/497,885

(22) PCT Filed: Mar. 5, 2018

(86) PCT No.: PCT/JP2018/008301
§ 371 (c)(1),
(2) Date: Sep. 26, 2019

(87) PCT Pub. No.: WO2018/180241
PCT Pub. Date: Oct. 4, 2018

(65) Prior Publication Data
US 2020/0103273 A1 Apr. 2, 2020

(30) Foreign Application Priority Data
Mar. 31, 2017 (JP) .................. 2017-070580

(51) Int. Cl.
*G01J 1/42* (2006.01)
*G01J 1/04* (2006.01)
(Continued)

(52) U.S. Cl.
CPC ............... *G01J 1/0437* (2013.01); *G01J 1/42* (2013.01); *H01L 31/02325* (2013.01); *H01L 31/12* (2013.01)

(58) Field of Classification Search
CPC ... G01J 1/0437; G01J 1/42; G01J 1/04; H01L 31/02325; H01L 31/12; H01L 31/02; G02B 5/28; G02B 5/284; G02B 26/001
See application file for complete search history.

(56) References Cited

U.S. PATENT DOCUMENTS

2003/0151818 A1 8/2003 Wagner et al.
2005/0258518 A1* 11/2005 Yang ................... H01L 31/0203
257/666

(Continued)

FOREIGN PATENT DOCUMENTS

JP 2007-292721 A 11/2007
JP 2008-128912 A 6/2008

(Continued)

OTHER PUBLICATIONS

International Preliminary Report on Patentability dated Oct. 10, 2019 for PCT/JP2018/008301.

*Primary Examiner* — Jonathan M Hansen
(74) *Attorney, Agent, or Firm* — Faegre Drinker Biddle & Reath LLP

(57) ABSTRACT

A light detection device includes: a package including an opening configured to allow light to enter therefrom; a light transmitting unit arranged on an inner surface of the package so as to close the opening; a Fabry-Perot interference filter arranged in the package and configured to transmit light transmitted by the light transmitting unit; and a light detector arranged in the package and configured to detect the light transmitted by the Fabry-Perot interference filter. The light transmitting unit is integrally configured by including: a band pass filter arranged in the package and configured to (Continued)

transmit the light to be incident on the Fabry-Perot interference filter; and at least one lens unit configured to condense the light to be incident on the Fabry-Perot interference filter.

11 Claims, 36 Drawing Sheets

(51) Int. Cl.
  *H01L 31/0232* (2014.01)
  *H01L 31/12* (2006.01)

(56) References Cited

U.S. PATENT DOCUMENTS

| | | | | |
|---|---|---|---|---|
| 2006/0016973 | A1* | 1/2006 | Yang | H01L 31/02325 |
| | | | | 250/239 |
| 2008/0296577 | A1* | 12/2008 | Yuan | H01L 27/14618 |
| | | | | 257/59 |
| 2012/0132809 | A1 | 5/2012 | Findlay | |
| 2014/0204461 | A1* | 7/2014 | Imai | G02B 7/008 |
| | | | | 359/513 |
| 2015/0279827 | A1* | 10/2015 | Tu | H01L 31/0203 |
| | | | | 257/81 |

FOREIGN PATENT DOCUMENTS

| | | |
|---|---|---|
| JP | 2017-161336 A | 9/2017 |
| WO | WO-2015/064758 A1 | 5/2015 |

\* cited by examiner

*Fig.6*
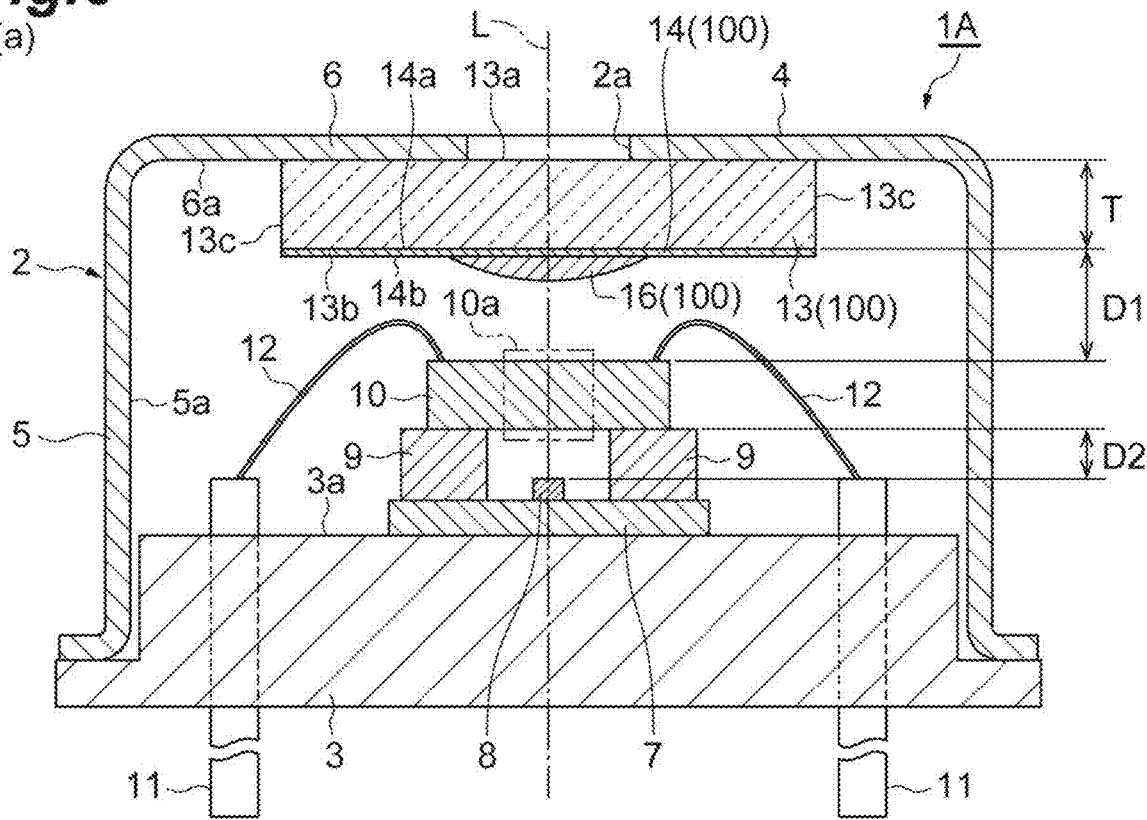
(a)
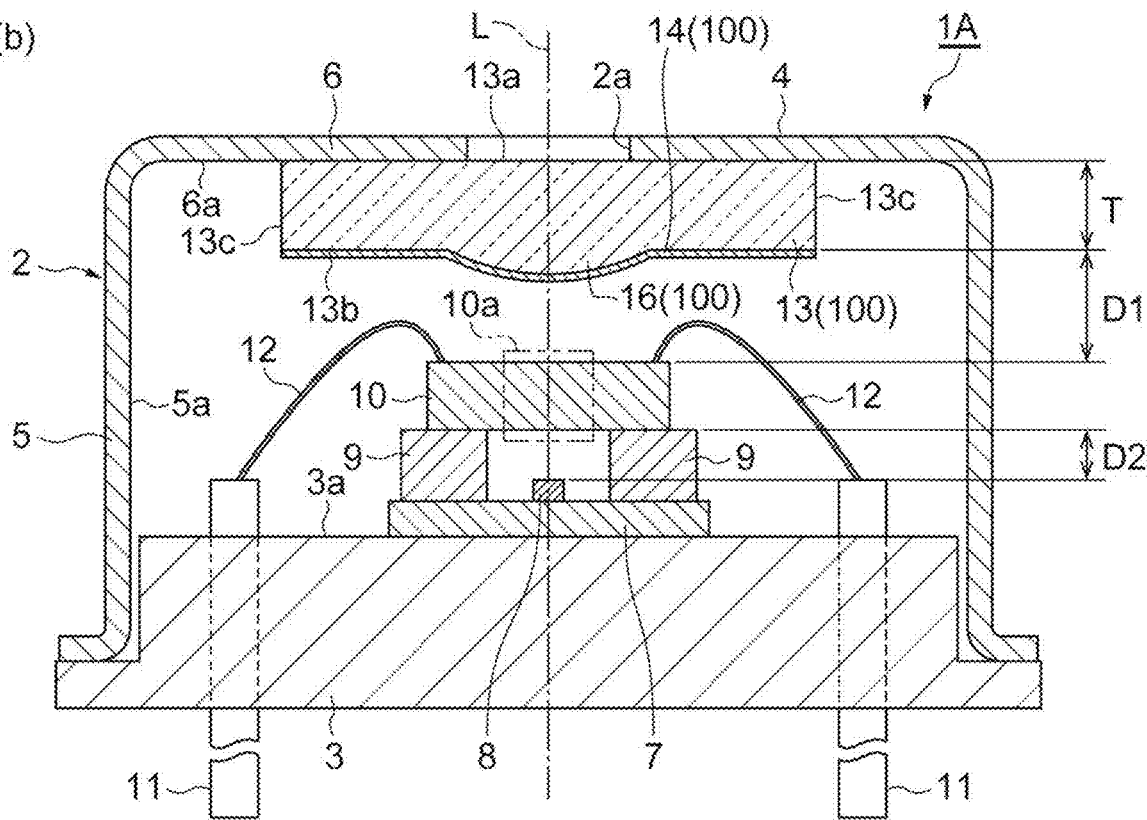
(b)

*Fig.7*
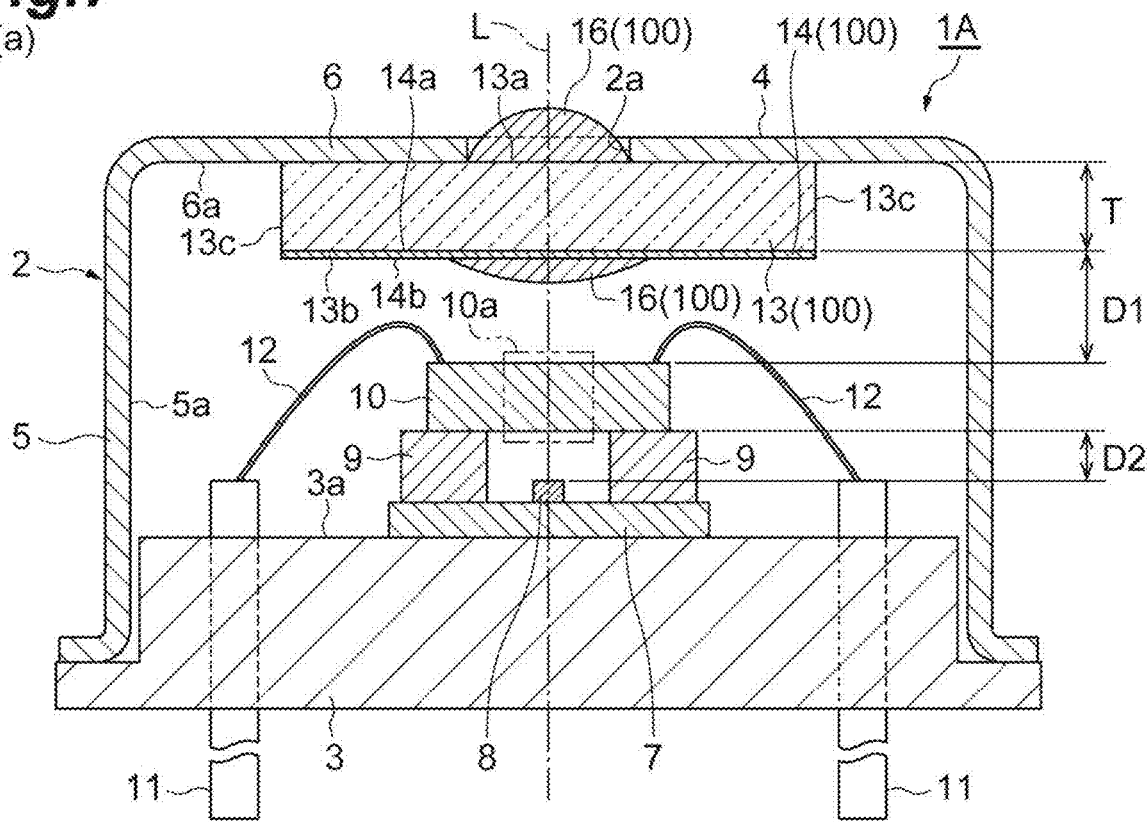
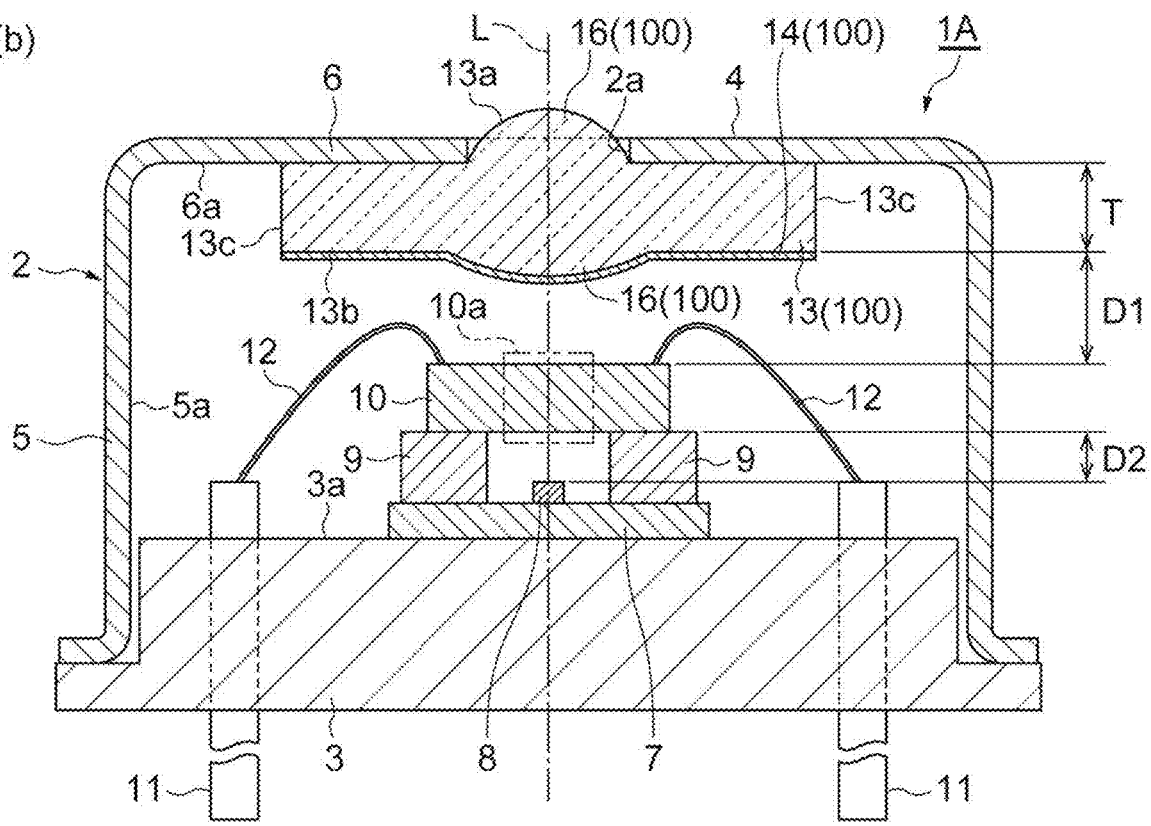

*Fig.10*
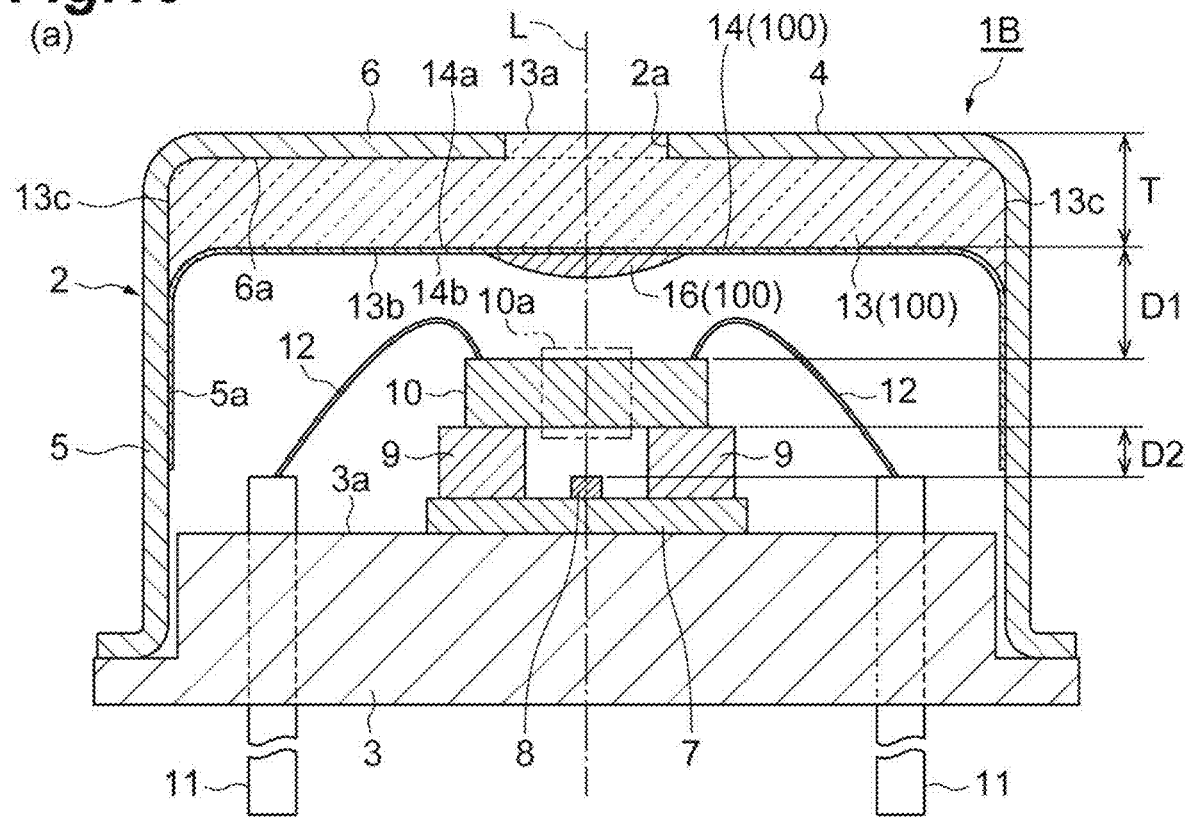
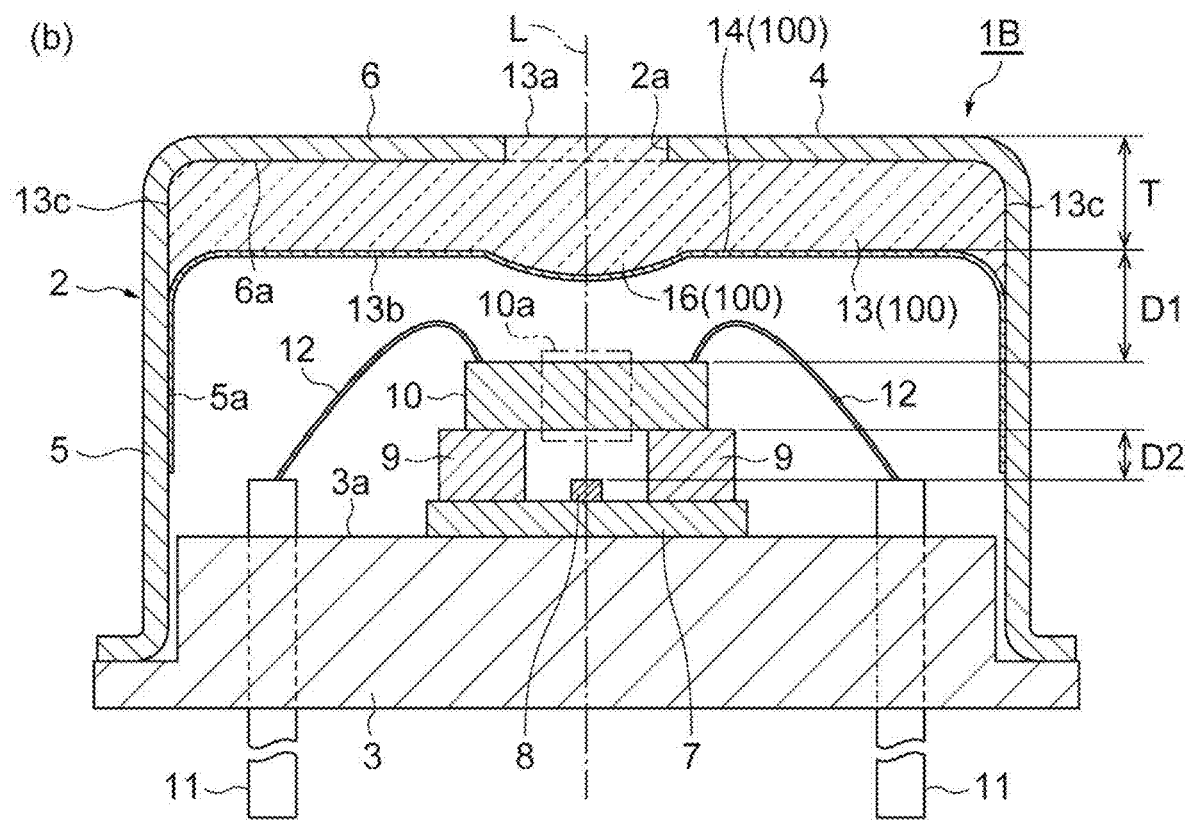

*Fig.11*
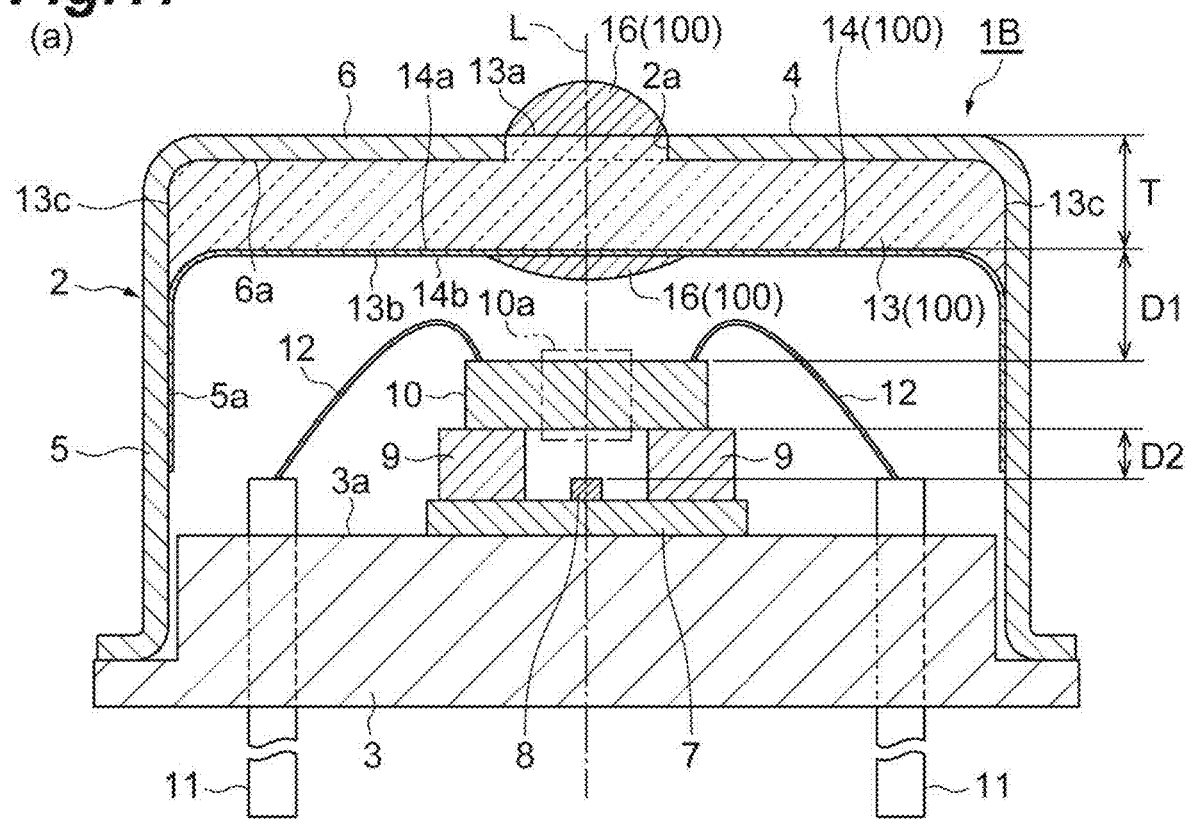
(a)
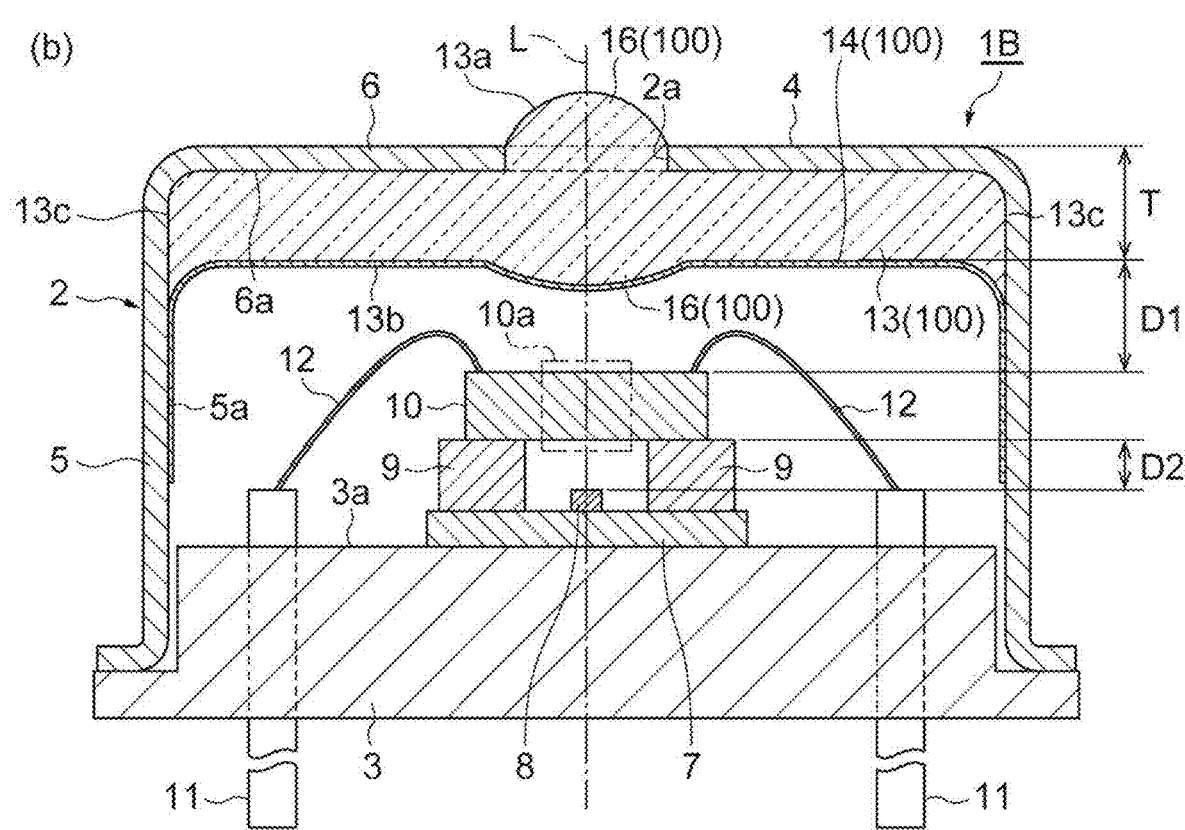
(b)

Fig.14
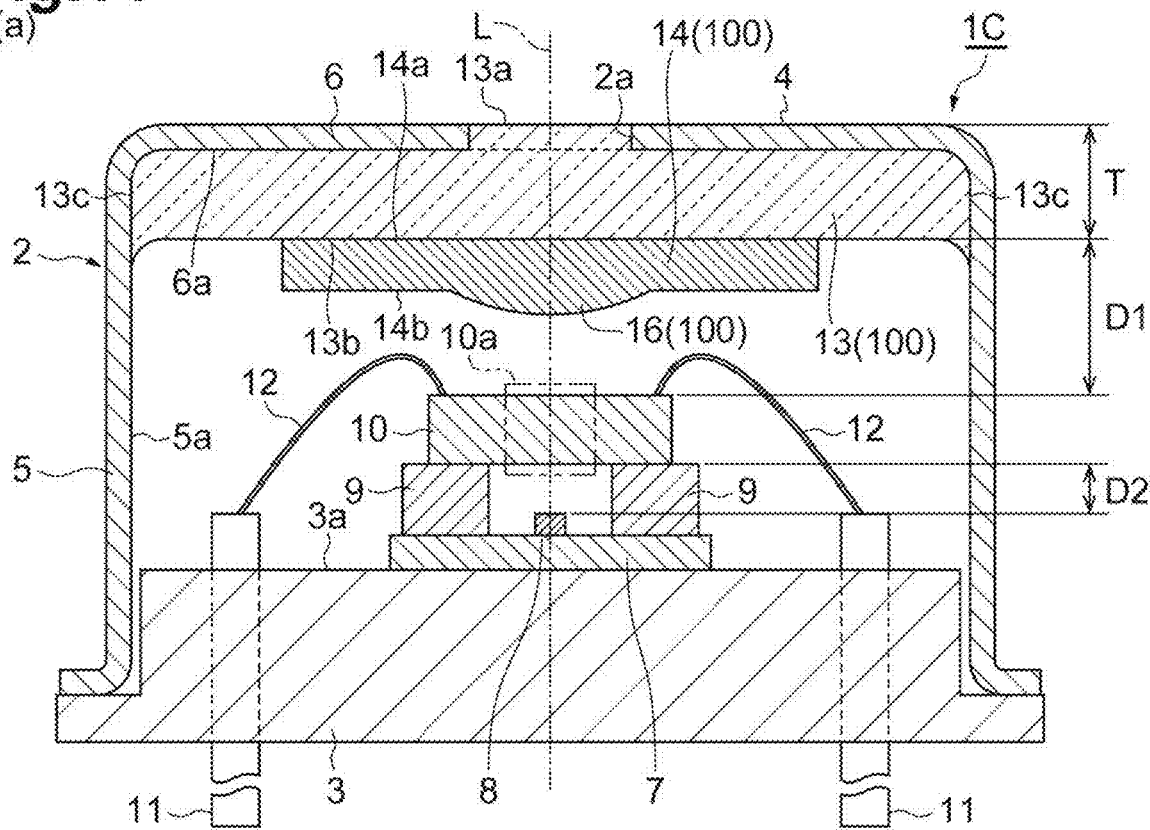
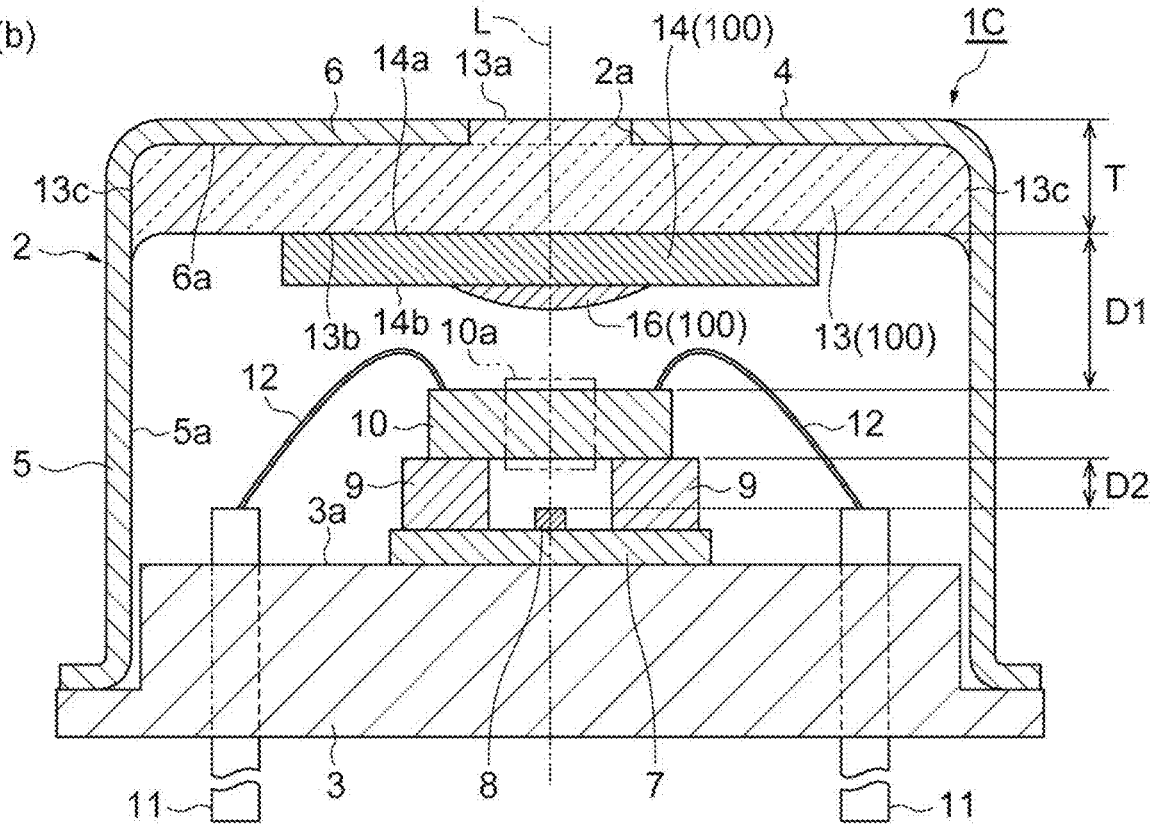

Fig.15
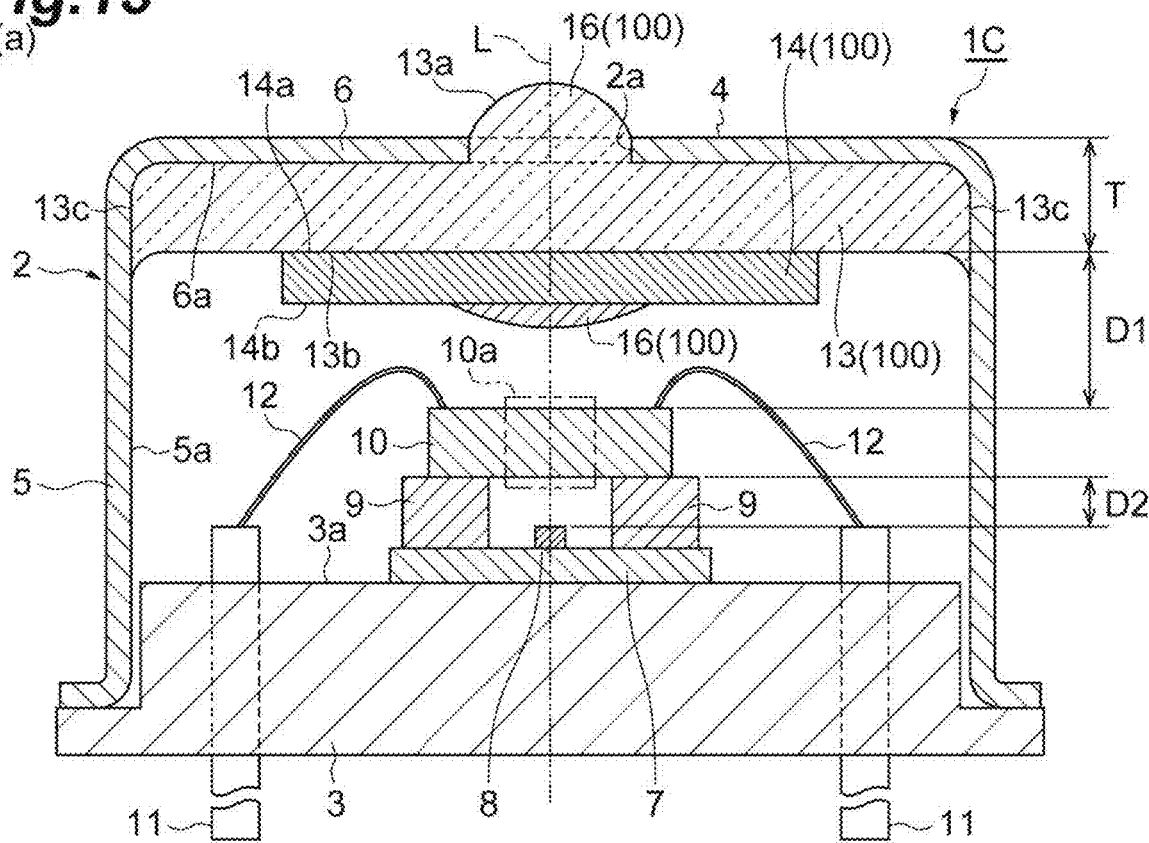
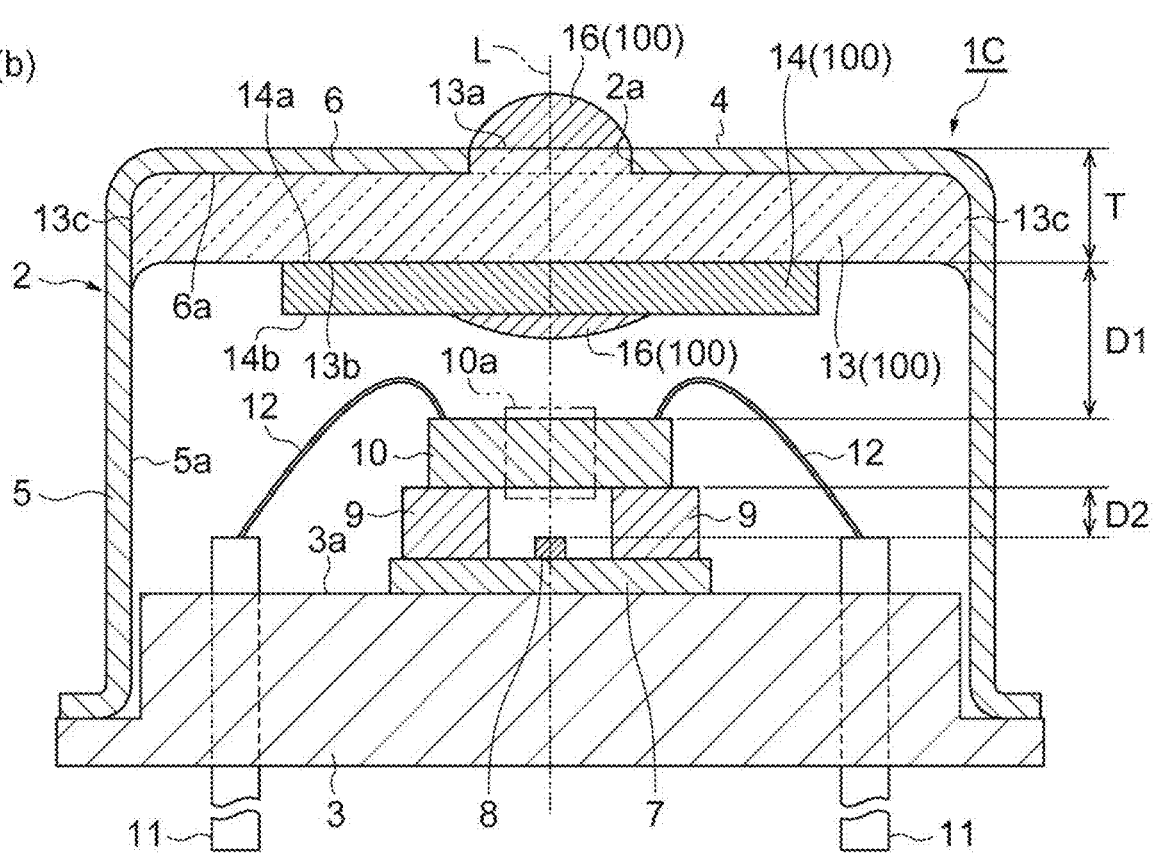

Fig.30
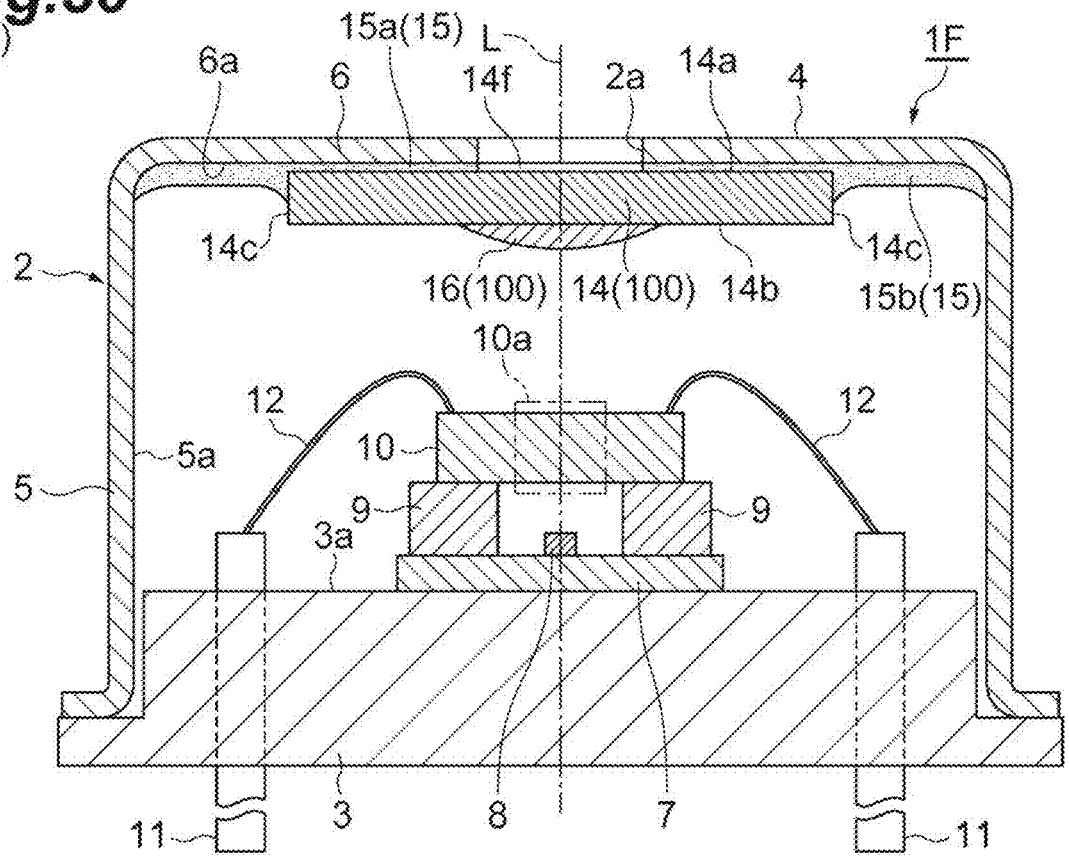
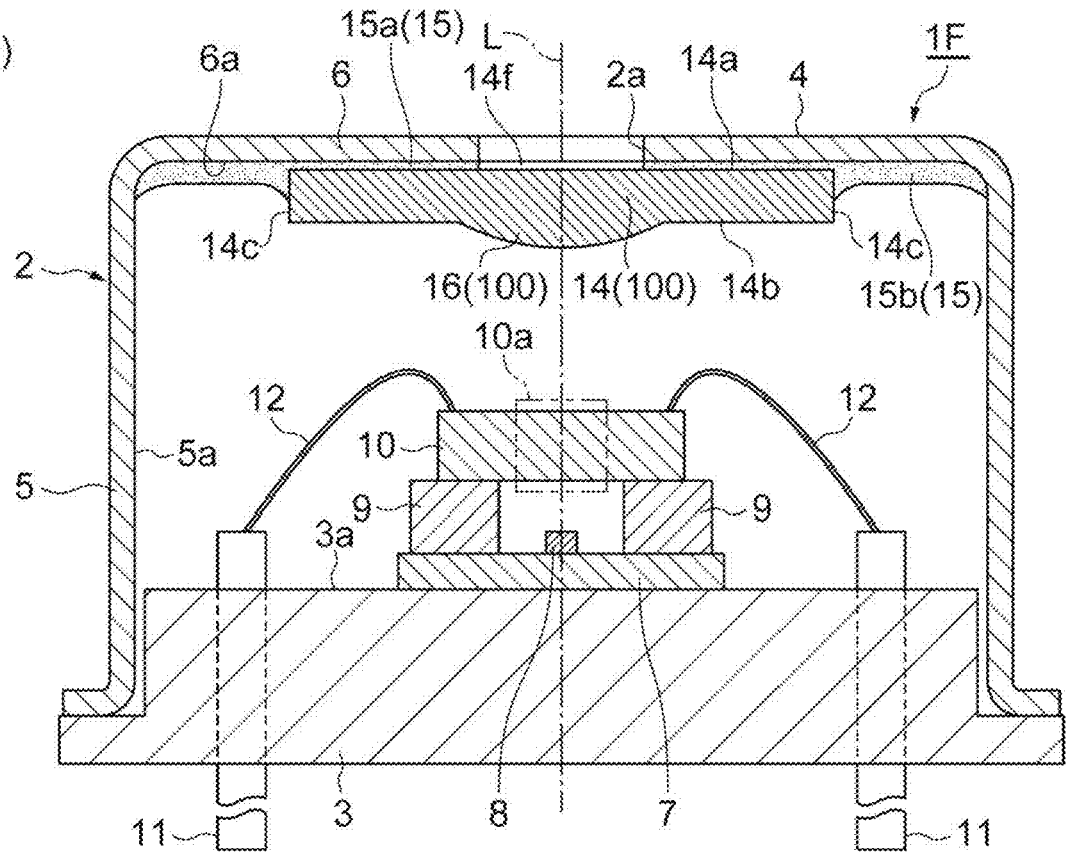

Fig.31
(a)
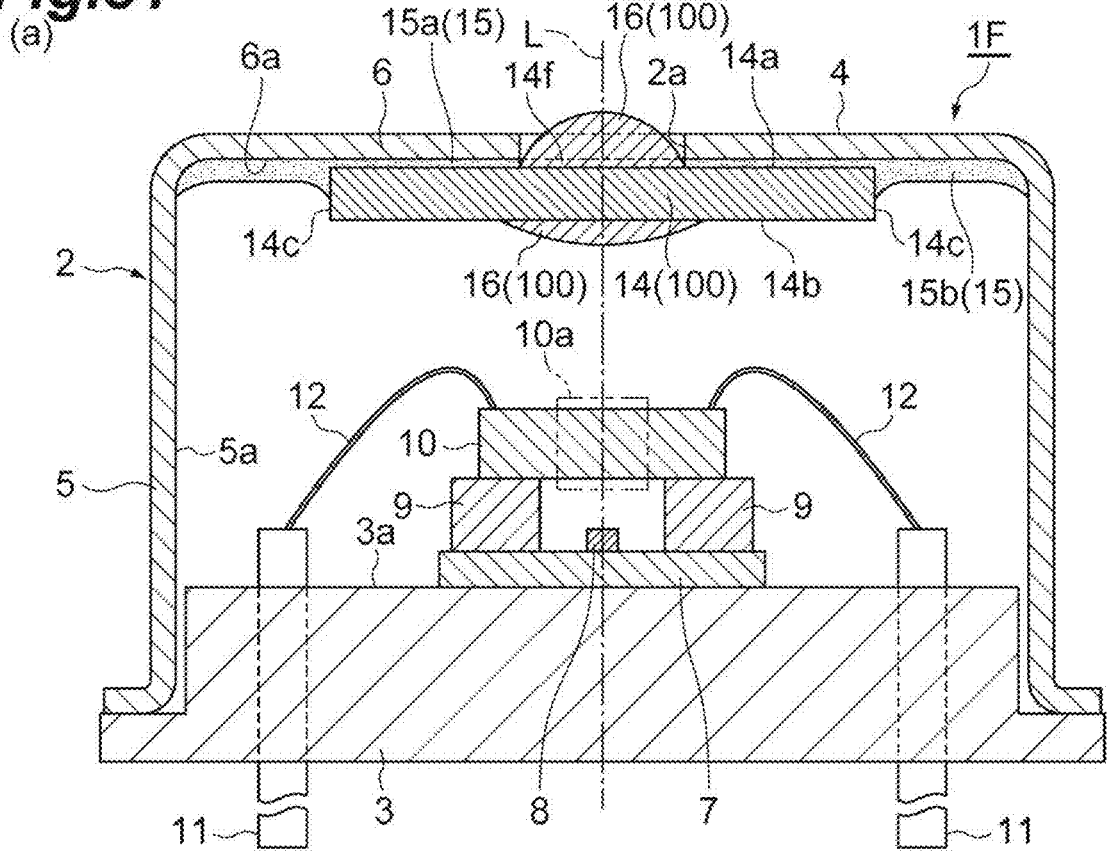
(b)
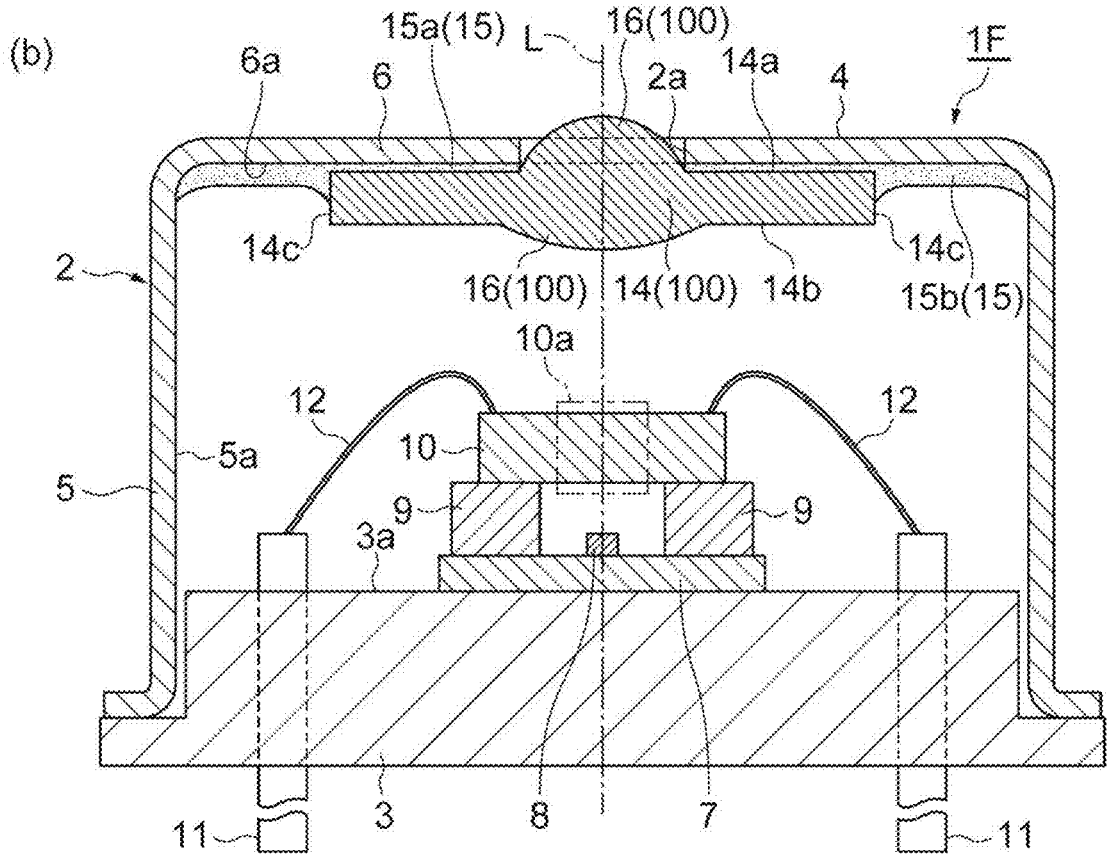

Fig.35
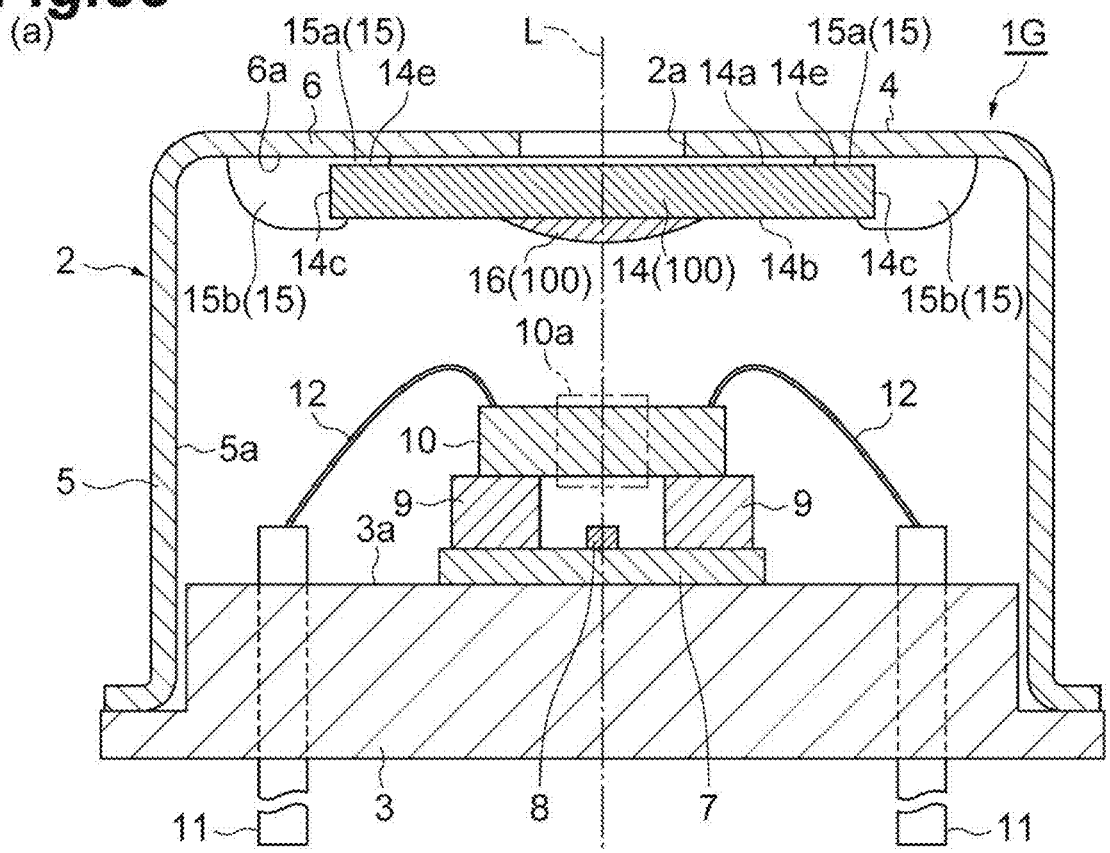
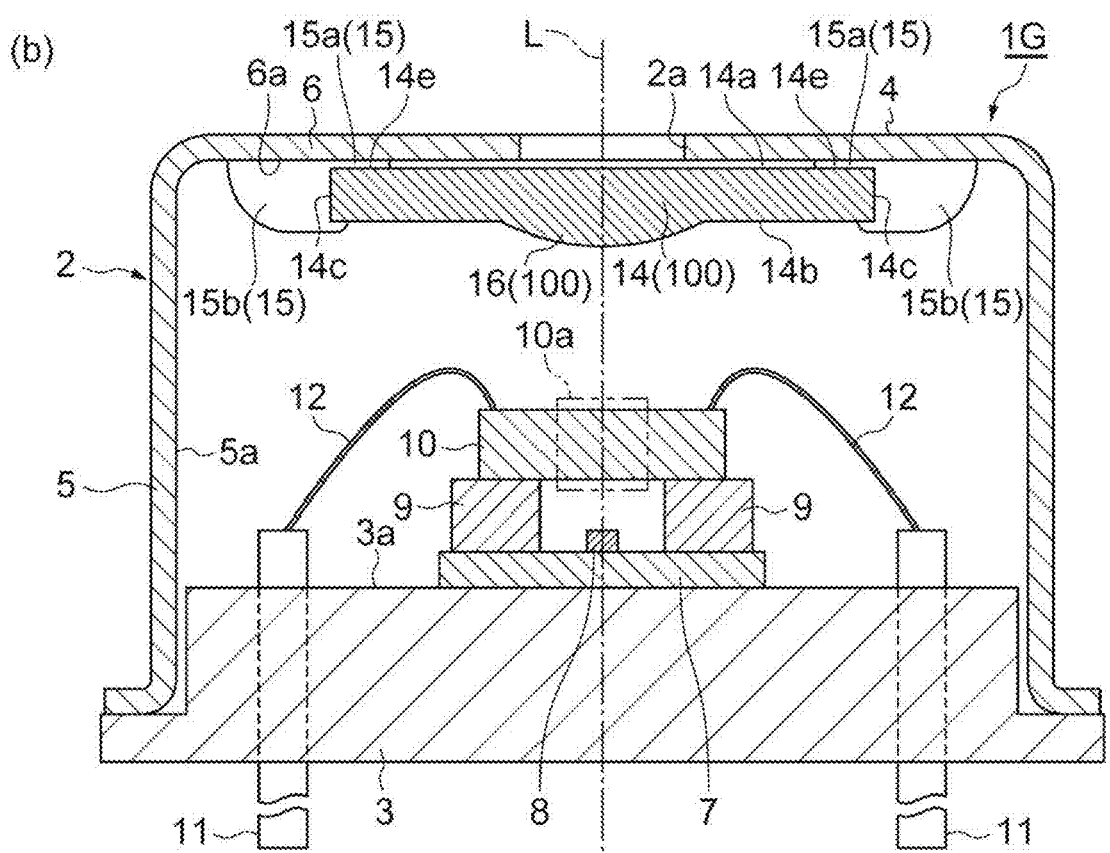

LIGHT DETECTING DEVICE

TECHNICAL FIELD

The present disclosure relates to a light detection device including a Fabry-Perot interference filter.

BACKGROUND ART

Known are light detection devices including a package including an opening to allow light to enter therefrom, a light transmitting unit provided to the package so as to close the opening, a Fabry-Perot interference filter for transmitting the light transmitted by the light transmitting unit, and a light detector for detecting the light transmitted by the Fabry-Perot interference filter in the package (see, for example, Patent Literature 1).

CITATION LIST

Patent Literature

Patent Literature 1: International Publication No. 15/064758

SUMMARY OF INVENTION

Technical Problem

In the light detection device as described above, it is desirable to increase the ratio of light incident on the light transmission region of the Fabry-Perot interference filter in light entering inside the package. In particular, in the case of analysis of reflected light from a subject to be measured using a general-purpose light source, it is important to increase the ratio of light incident on the light transmission region of the Fabry-Perot interference filter since the amount of the reflected light tends to be small. However, in order to increase the amount of light incident on the light transmission region of the Fabry-Perot interference filter, simply increasing the size of the opening of the package may disadvantageously decrease the S/N ratio and the resolution since stray light (light which is not transmitted by the light transmission region of the Fabry-Perot interference filter) enters the light detector.

An object of the present disclosure is to provide a light detection device capable of highly sensitive and highly accurate detection.

Solution to Problem

A light detection device according to one aspect of the present disclosure includes: a package including an opening configured to allow light to enter therefrom; a light transmitting unit arranged on an inner surface of the package so as to close the opening; a Fabry-Perot interference filter arranged in the package and having a first mirror and a second mirror, a distance between the first mirror and the second mirror being variable, the Fabry-Perot interference filter configured to transmit the light transmitted by the light transmitting unit; and a light detector arranged in the package and configured to detect the light transmitted by the Fabry-Perot interference filter, in which the light transmitting unit is integrally configured by including: a band pass filter arranged in the package and configured to transmit the light to be incident on the Fabry-Perot interference filter and; at least on lens unit configured to condense the light to be incident on the Fabry-Perot interference filter.

In the light detection device, the light transmitting unit arranged on the inner surface of the package so as to close the opening is integrally configured including the band pass filter and the lens unit. As a result, light entering the package from the opening is condensed by the lens unit of the light transmitting unit and is allowed to be incident on the Fabry-Perot interference filter. Therefore, it is possible to increase the ratio of light incident on a light transmission region of the Fabry-Perot interference filter in light entering the package. This can also suppress light from being incident on the peripheral region around the light transmission region of the Fabry-Perot interference filter and becoming stray light. In addition, light entering the package from the opening is transmitted by the band pass filter of the light transmitting unit and is allowed to be incident on the light transmission region of the Fabry-Perot interference filter. Therefore, it is possible to suppress light having an unnecessary wavelength from entering the light detector. As described above, the light detection device enables highly sensitive and highly accurate detection.

In the light detection device of one aspect of the present disclosure, when viewed from an incident direction of light, a perimeter of the Fabry-Perot interference filter may be positioned outside a perimeter of the opening, and a perimeter of the light transmitting unit may be positioned outside the perimeter of the Fabry-Perot interference filter. This can suppress light from entering the package via the side surfaces of the light transmitting unit (surfaces of the light transmitting unit excluding the light incident surface and the light emitting surface facing each other in the incident direction of light) due to the incident angle of light at the opening of the package, the diffraction at the opening of the package, etc. and becoming stray light. Furthermore, for example as compared to a case where the perimeter of the light transmitting unit is positioned inside the perimeter of the Fabry-Perot interference filter, the heat capacity of the light transmitting unit and a thermally-connected area between the light transmitting unit and the package increases, and thus as a result the temperature in the package can be uniformized. Uniformizing the temperature in the package is important for suppressing variations in the stress generated in the Fabry-Perot interference filter due to a temperature change and for controlling the distance between the first mirror and the second mirror with high accuracy.

In the light detection device according to one aspect of the present disclosure, the light transmitting unit may include a light transmitting member and be integrally formed with the band pass filter and the lens unit, the band pass filter may be provided on a light emitting surface of the light transmitting member, and the lens unit may be formed on a light incident surface side of the light transmitting member as a part of the light transmitting member. With this arrangement, the thickness of the light transmitting member can be increased such that the distance between the band pass filter and the Fabry-Perot interference filter is reduced. In this case, since the heat capacity of the light transmitting member is increased while the volume of the space in the package is reduced, the temperature in the package can be further uniformized. Moreover, the lens unit can be formed with high positional accuracy with respect to the light transmitting member.

In the light detection device according to one aspect of the present disclosure, the light transmitting unit may include a light transmitting member and be integrally formed with the band pass filter and the lens unit, the band pass filter may be provided on a light emitting surface of the light transmitting member, and the lens unit may be provided on a light emitting surface of the band pass filter. With this arrangement, since the incident angle of light incident on the band pass filter is not affected by the lens unit, the band pass filter is allowed to function more appropriately.

In the light detection device according to one aspect of the present disclosure, the light transmitting unit may include a light transmitting member and be integrally formed with the band pass filter and the lens unit, the band pass filter may be provided on a light emitting surface of the light transmitting member, the at least one lens unit may be a pair of lens units, one of the pair of lens units may be formed on a light incident surface side of the light transmitting member as a part of the light transmitting member, and the other one of the pair of lens units may be provided on a light emitting surface of the band pass filter. With this arrangement, the light incident on the Fabry-Perot interference filter can be condensed more reliably while the heights of the respective lens units are kept low, thereby further increasing the ratio of light incident on the light transmission region of the Fabry-Perot interference filter in the light entering the package.

In the light detection device according to one aspect of the present disclosure, the perimeter of the light transmitting member may be positioned outside the perimeter of the Fabry-Perot interference filter when viewed from the incident direction of light. With this arrangement, for example as compared to a case where the perimeter of the light transmitting member is positioned inside the perimeter of the Fabry-Perot interference filter, the heat capacity of the light transmitting member and a thermally-connected area between the light transmitting member and the package increases, and thus as a result the temperature in the package can be uniformized.

In the light detection device according to one aspect of the present disclosure, the perimeter of the band pass filter may be positioned outside the perimeter of the Fabry-Perot interference filter when viewed from the incident direction of light. With this arrangement, it is ensured that light incident on the light transmission region of the Fabry-Perot interference filter has been transmitted by the band pass filter.

Advantageous Effects of Invention

According to the present disclosure, it is possible to provide a light detection device capable of highly sensitive and highly accurate detection.

BRIEF DESCRIPTION OF DRAWINGS

FIG. 6 is a set of cross-sectional views of modifications of the light detection device illustrated in FIG. 1.
FIG. 7 is a set of cross-sectional views of modifications of the light detection device illustrated in FIG. 1.
FIG. 10 is a set of cross-sectional views of modifications of the light detection device illustrated in FIG. 8.
FIG. 11 is a set of cross-sectional views of modifications of the light detection device illustrated in FIG. 8.
FIG. 14 is a set of cross-sectional views of modifications of the light detection device illustrated in FIG. 12.
FIG. 15 is a set of cross-sectional views of modifications of the light detection device illustrated in FIG. 12.
FIG. 30 is a set of cross-sectional views of modifications of the light detection device illustrated in FIG. 27.
FIG. 31 is a set of cross-sectional views of modifications of the light detection device illustrated in FIG. 27.
FIG. 35 is a set of cross-sectional views of modifications of the light detection device illustrated in FIG. 32.

DESCRIPTION OF EMBODIMENTS

Hereinafter, embodiments of the present disclosure will be described in detail with reference to the drawings. Note that the same or corresponding parts in the respective drawings are denoted with the same symbol, and overlapping descriptions are omitted.

First Embodiment

[Configuration of Light Detection Device]

Figure 1:
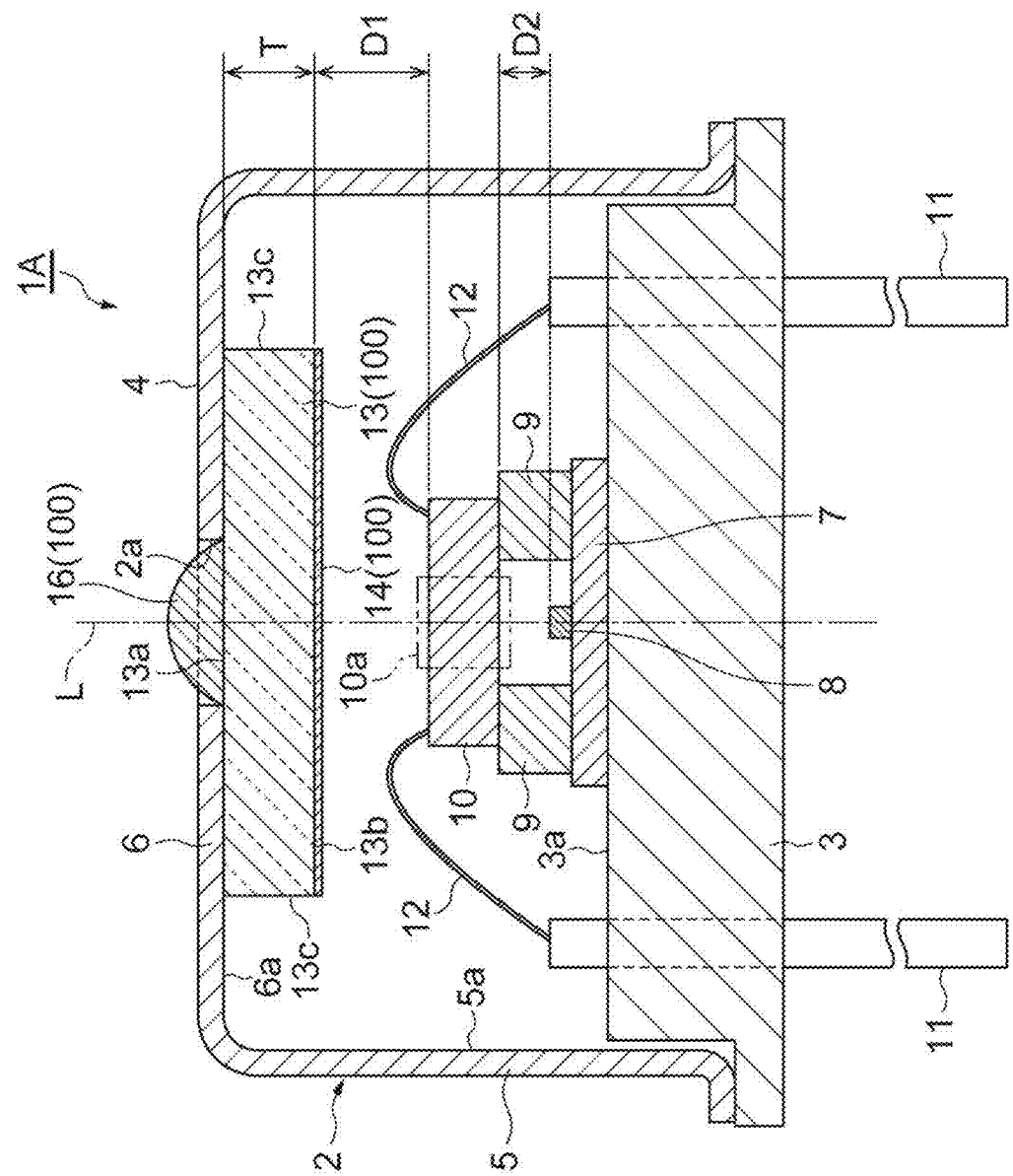
FIG. 1 is a cross-sectional view of a light detection device of a first embodiment.

As illustrated in FIG. 1, a light detection device 1A includes a package 2. The package 2 is a CAN package including a stem 3 and a cap 4. A side wall 5 and a top wall 6 integrally form the cap 4. The top wall 6 faces the stem 3 in a direction parallel to line L. The stem 3 and the cap 4 are made of metal, for example, and are airtightly joined to each other.

A wiring substrate 7 is secured on an inner surface 3a of the stem 3 by, for example, an adhesive agent. As a material of the wiring substrate 7, for example, silicon, ceramic, quartz, glass, plastic, or the like can be used. A light detector 8 and a temperature compensating element (not illustrated) such as a thermistor are mounted on the wiring substrate 7. The light detector 8 is arranged on line L in the package 2. More specifically, the light detector 8 is arranged in the package 2 such that the center line of a light receiving region thereof coincides with line L. The light detector 8 is an infrared detector such as a quantum type sensor using InGaAs or other compounds or a thermal type sensor using a thermopile or a bolometer or the like. In a case where light of different wavelength regions of ultraviolet, visible, and near infrared regions, for example a silicon photodiode or the like can be used as the light detector 8. Note that the light receiving region of the light detector 8 may include only one light receiving unit, or may include a plurality of light receiving units. Examples of the light detector 8 having a light receiving region including a plurality of light receiving units include a photodiode array, a CCD image sensor, a CMOS image sensor, and the like. Furthermore, a plurality of light detectors 8 may be mounted on the wiring substrate 7. In this case, a set of light receiving units of the plurality of light detectors 8 can be regarded as the light receiving region.

A plurality of spacers (supports) 9 is secured on the wiring substrate 7 by, for example, an adhesive agent. The plurality of spacers 9 is arranged in the package 2 so as to sandwich or surround the light detector 8 and the temperature compensating element. As a material of the spacers 9, for example, silicon, ceramic, quartz, glass, plastic, or the like can be used. On the plurality of spacers 9, a Fabry-Perot interference filter 10 is secured by, for example, an adhesive agent. The Fabry-Perot interference filter 10 is arranged on line L in the package 2. More specifically, the Fabry-Perot interference filter 10 is arranged in the package 2 such that the center line of the light transmission region 10a thereof coincides with line L. The spacers 9 support the Fabry-Perot interference filter 10 in a state where the Fabry-Perot interference filter 10 is separated away from the light detector 8 (that is, in a state where a space is formed between the Fabry-Perot interference filter 10 and the light detector 8). That is, the Fabry-Perot interference filter 10 and the light detector 8 are arranged in the package 2 while separated away from each other. Note that the spacers 9 may be integrally formed with the wiring substrate 7. The Fabry-Perot interference filter 10 may be supported not by the plurality of spacers 9 but by a single spacer 9. Alternatively, the spacers 9 may be formed integrally with the Fabry-Perot interference filter 10.

A plurality of lead pins 11 is secured to the stem 3. More specifically, each of the lead pins 11 penetrates through the stem 3 in a state where electrical insulation and airtightness with the stem 3 are maintained. Electrode pads provided on the wiring substrate 7, terminals of the light detector 8, terminals of the temperature compensating element, and terminals of the Fabry-Perot interference filter 10 are electrically connected to the respective lead pins 11 by wires 12. This enables input and output of electric signals to and from each of the light detector 8, the temperature compensating element, and the Fabry-Perot interference filter 10.

An opening 2a is formed in the package 2. More specifically, the opening 2a is formed in the top wall 6 of the cap 4 such that the center line thereof coincides with line L. The opening 2a allows light to enter the package 2. In the light detection device 1A, a direction parallel to line L (i.e., a direction parallel to the center line of the opening 2a) is the direction in which the light enters (i.e., incident direction of light).

On an inner surface 6a of the top wall 6, a light transmitting member 13 is arranged so as to close the opening 2a. The light transmitting member 13 is airtightly joined to the inner surface 6a of the top wall 6. The light transmitting member 13 transmits light at least in a range of measurement wavelengths of the light detection device 1A. The light transmitting member 13 is a plate-like member including a light incident surface 13a and a light emitting surface 13b that face each other in a direction parallel to line L and side surfaces 13c. The light transmitting member 13 is made of, for example, glass, quartz, silicon, germanium, plastic, or the like.

A lens unit 16 is provided on the light incident surface 13a of the light transmitting member 13. The lens unit 16 condenses light to be incident on the light transmission region 10a of the Fabry-Perot interference filter 10. The lens unit 16 is arranged in a region of the light incident surface 13a that is exposed to (faces) the opening 2a such that the center line thereof coincides with line L. The lens unit 16 is a convex lens having a light incident surface that is convex toward the light incident side (the side opposite to the light transmitting member 13). The top of the lens unit 16 protrudes toward the light incident side above the outer surface of the top wall 6 at the opening 2a. The lens unit 16 is made of, for example, glass, quartz, silicon, germanium, plastic, or the like. The diameter and the height of the lens unit 16 are, for example, about several millimeters each. The lens unit 16 is provided on the light incident surface 13a by, for example, bonding or resin potting.

A band pass filter 14 is provided on the light emitting surface 13b of the light transmitting member 13. That is, the band pass filter 14 is arranged inside the package 2. The band pass filter 14 selectively transmits light to be incident on the light transmission region 10a of the Fabry-Perot interference filter 10 (that is, light in the range of a measurement wavelength of the light detection device 1A). The band pass filter 14 is a dielectric multilayer film formed by a combination of a high refractive material such as $TiO_2$ and $Ta_2O_5$ and a low refractive material such as $SiO_2$ and $MgF_2$. The band pass filter 14 is provided on the light emitting surface 13b by, for example, vapor deposition or bonding.

In the light detection device 1A, the light transmitting member 13, the lens unit 16, and the band pass filter 14 integrally form the light transmitting unit 100. The light transmitting unit 100 is arranged on the inner surface of the package 2 (the inner surface 6a of the top wall 6 in the light detection device 1A) so as to close the opening 2a.

A thickness T of the light transmitting member 13 (thickness in a direction parallel to line L, which is a distance between the light incident surface 13a and the light emitting surface 13b) has a value greater than or equal to a value obtained by multiplying a distance D1 between the Fabry-Perot interference filter 10 and the light transmitting member 13 (distance between a surface of the Fabry-Perot interference filter 10 on the light transmitting member 13 side and the light emitting surface 13b of the light transmitting member 13) by 0.1 (more preferably, a value greater than or equal to a value obtained by multiplying 0.3). Moreover, the thickness T of the light transmitting member 13 has a value greater than or equal to a value obtained by multiplying a distance D2 between the Fabry-Perot interference filter 10 and the light detector 8 (distance between a surface of the Fabry-Perot interference filter 10 on the light detector 8 side and a surface of the light detector 8 on the Fabry-Perot interference filter 10 side) by 0.5 (more preferably, a value greater than or equal to a value obtained by multiplying 1.0). The thickness T of the light transmitting member 13 is more than or equal to twice the thickness of the top wall 6 (more preferably, more than or equal to three times the thickness of the top wall 6). In addition, the distance from the surface (outer surface) of the top wall 6 on the light incident side to the light emitting surface of the band pass filter 14 is greater than the distance from the light emitting surface of the band pass filter 14 to the surface of the Fabry-Perot interference filter 10 on the light transmitting member 13 side. Note that the surface of the Fabry-Perot interference filter 10 on the light detector 8 side is the surface of a protective layer 46 formed on the light shielding layer 45 on the light detector 8 side in the example illustrated in FIG. 4, which will be described later.

Figure 2:
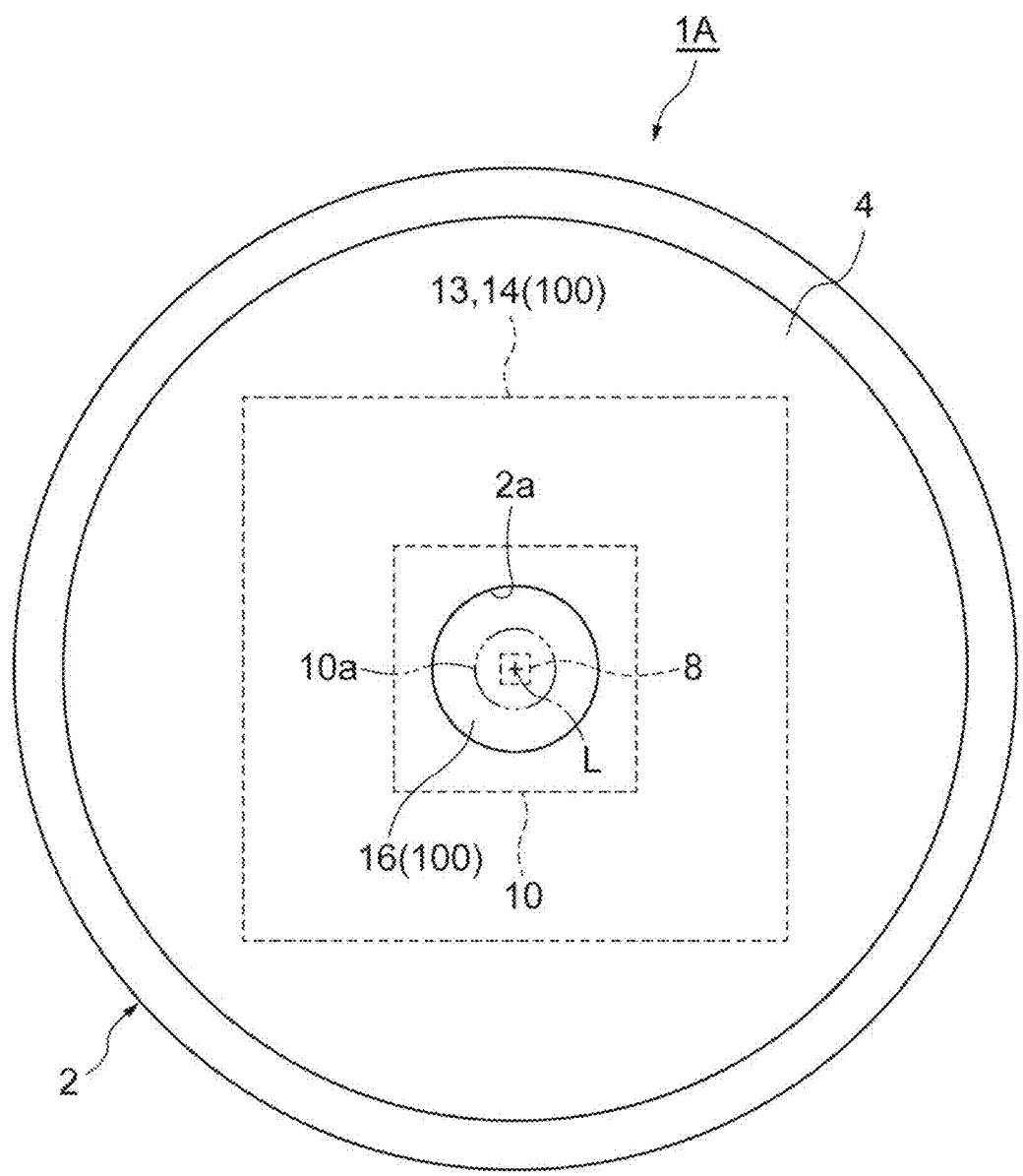
FIG. 2 is a plan view of the light detection device illustrated in FIG. 1.

The positional relationship and the magnitude relationship among the respective components when viewed from a direction parallel to line L are as follows. As illustrated in FIG. 2, the center line of the opening 2a, the center line of the light transmitting member 13, the center line of the lens unit 16, the center line of the band pass filter 14, the center line of the light transmission region 10a of the Fabry-Perot interference filter 10, and the center line of the light receiving region of the light detector 8 coincides with line L. The perimeter of the opening 2a, the perimeter of the lens unit 16, the perimeter of the light transmission region 10a, and the light receiving region of the light detector 8 are, for example, circular. The perimeter of the light transmitting member 13, the perimeter of the band pass filter 14, the perimeter of the Fabry-Perot interference filter 10, and the perimeter of the light detector 8 are, for example, rectangular. Note that the perimeter of the band pass filter 14 is the perimeter of a substrate 21 (corresponds to side surfaces of the substrate 21) when viewed from a direction parallel to line L in the example illustrated in FIG. 4 which will be described later.

The inner perimeter of the opening 2a is positioned inside the perimeter of the light transmitting member 13, the perimeter of the band pass filter 14, and the perimeter of the Fabry-Perot interference filter 10 and is positioned outside the perimeter of the light transmission region 10a and the perimeter of the light receiving region of the light detector 8. The perimeter of the lens unit 16 coincides with the inner perimeter of the opening 2a. The perimeter of the light transmitting member 13 coincides with the perimeter of the band pass filter 14 and is positioned outside the perimeter of the Fabry-Perot interference filter 10. The perimeter of the light transmission region 10a is positioned outside the perimeter of the light receiving region of the light detector 8. Note that "a perimeter is positioned inside another perimeter when viewed from a predetermined direction" means that "the other perimeter surrounds the perimeter when viewed from the predetermined direction" or that "the other perimeter includes the perimeter when viewed from the predetermined direction." In addition, "a perimeter is positioned outside another perimeter when viewed from a predetermined direction" means that "the perimeter surrounds the other perimeter when viewed from the predetermined direction" or that "the perimeter includes the other perimeter when viewed from the predetermined direction."

In the light detection device 1A configured as described above, light enters the package 2 from the outside through the opening 2a and the light transmitting unit 100 (that is, the lens unit 16, the light transmitting member 13, and the band pass filter 14). When the light transmitted by the light transmitting unit 100 is incident on the light transmission region 10a of the Fabry-Perot interference filter 10, light having a predetermined wavelength is selectively transmitted. The light transmitted by the light transmission region 10a of the Fabry-Perot interference filter 10 enters the light receiving region of the light detector 8 and is detected by the light detector 8.

[Configuration of Fabry-Perot Interference Filter]

Figure 3:
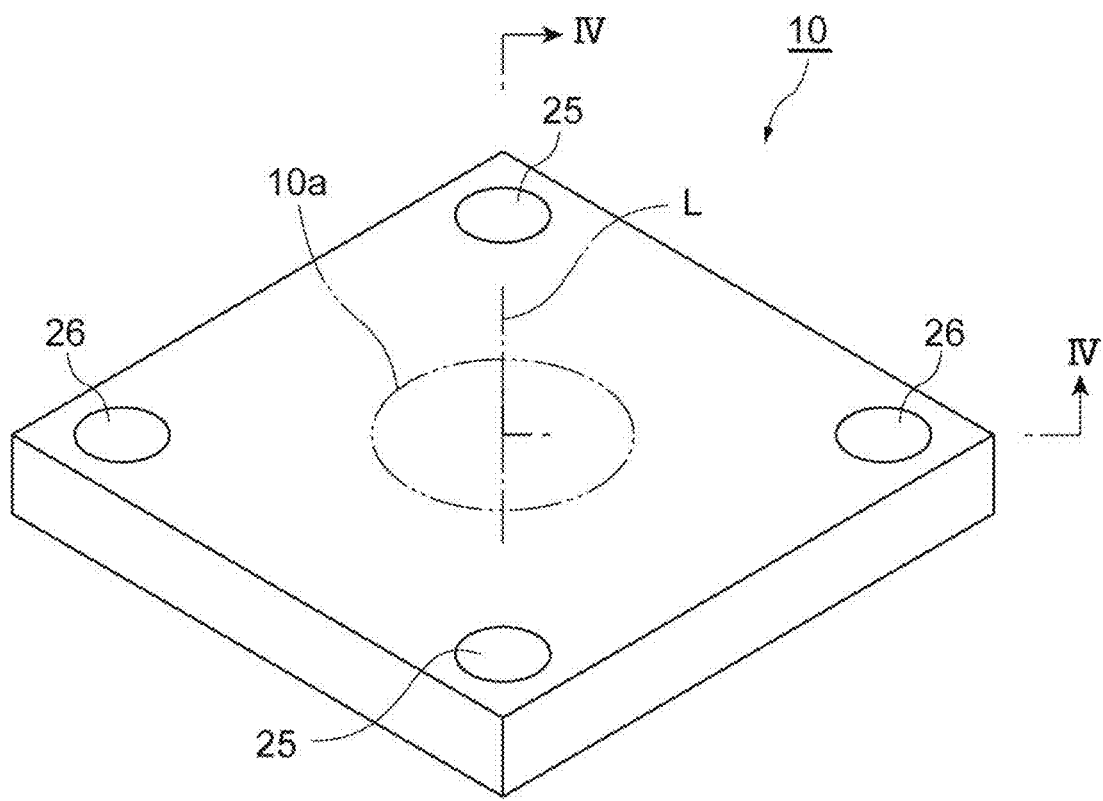
FIG. 3 is a perspective view of a Fabry-Perot interference filter illustrated in FIG. 1.
Figure 4:
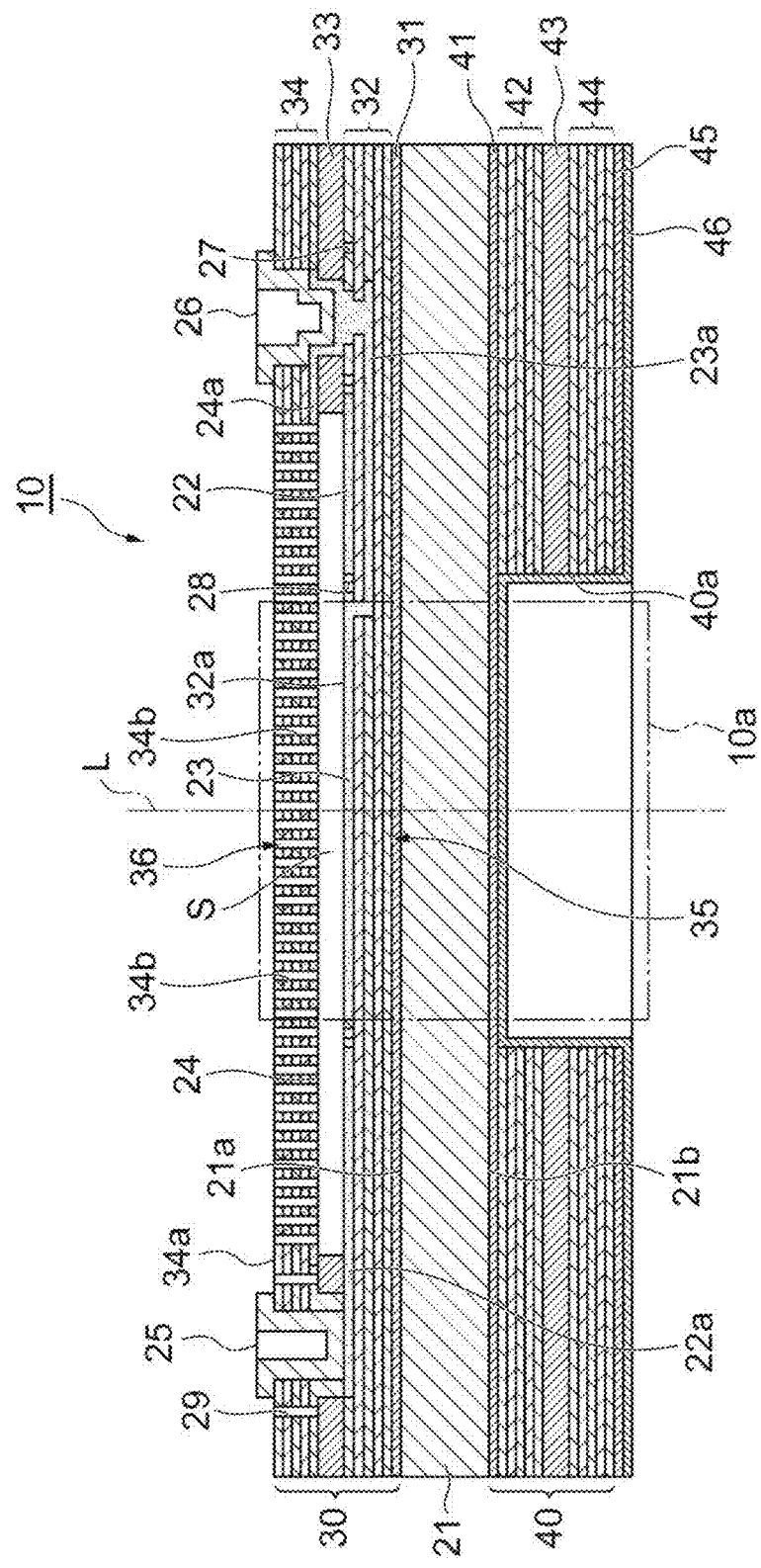
FIG. 4 is a cross-sectional view taken along line IV-IV illustrated in FIG. 3.

As illustrated in FIGS. 3 and 4, in the Fabry-Perot interference filter 10, the light transmission region 10a that transmits light corresponding to the distance between a first mirror and a second mirror is included on line L. The light transmission region 10a is, for example, a cylindrical region. In the light transmission region 10a, the distance between the first mirror and the second mirror is controlled with extremely high accuracy. That is, the light transmission region 10a is a region in the Fabry-Perot interference filter 10 in which the distance between the first mirror and the second mirror can be controlled to a predetermined distance in order to allow selectively transmission of light having a predetermined wavelength and is a region through which light having a predetermined wavelength corresponding to the distance between the first mirror and the second mirror can be transmitted.

The Fabry-Perot interference filter 10 includes a rectangular plate-shaped substrate 21. The substrate 21 has a first surface 21a and a second surface 21b facing each other in a direction parallel to line L. The first surface 21a is the surface on the light transmitting unit 100 side (that is, the light incident side). The second surface 21b is a surface on the light detector 8 side (that is, the light emission side). A first layer structure 30 is arranged on the first surface 21a. A second layer structure 40 is arranged on the second surface 21b.

The first layer structure 30 includes a first antireflection layer 31, a first laminated body 32, the first intermediate layer 33, and a second laminated body 34 laminated on the first surface 21a in the order mentioned. A gap (air gap) S is formed between the first laminated body 32 and the second laminated body 34 by the first intermediate layer 33 of a frame shape. The substrate 21 is made of, for example, silicon, quartz, glass, or the like. In a case where the substrate 21 is made of silicon, the first antireflection layer 31 and the first intermediate layer 33 are made of, for example, silicon oxide. The thickness of the first intermediate layer 33 is, for example, several tens nanometers to several tens micrometers.

A part of the first laminated body 32 corresponding to the light transmission region 10a functions as a first mirror 35. The first laminated body 32 includes a plurality of polysilicon layers and a plurality of silicon nitride layers with each of the plurality of layers laminated alternately. The optical thickness of each of the polysilicon layers and the silicon nitride layers forming the first mirror 35 is preferably an integral multiple of a quarter of the central transmission wavelength. The first mirror 35 may be arranged directly on the first surface 21a without the first antireflection layer 31 interposed therebetween.

A part of the second laminated body 34 corresponding to the light transmission region 10a functions as a second mirror 36. The second mirror 36 faces the first mirror 35 via the gap S in the direction parallel to line L. The second laminated body 34 includes a plurality of polysilicon layers and a plurality of silicon nitride layers with each of the plurality of layers laminated alternately. The optical thickness of each of the polysilicon layers and the silicon nitride layers forming the second mirror 36 is preferably an integral multiple of a quarter of the central transmission wavelength.

In the first laminated body 32 and the second laminated body 34, silicon oxide layers may be arranged instead of the silicon nitride layers. Other than the materials described above, titanium oxide, tantalum oxide, zirconium oxide, magnesium fluoride, aluminum oxide, calcium fluoride, silicon, Germanium, zinc sulfide, and the like may be used as the material of each layer included in the first laminated body 32 and the second laminated body 34.

A plurality of through holes 34b extending from the surface 34a of the second laminated body 34 on the side opposite to the first intermediate layer 33 to the gap S is formed in a portion of the second laminated body 34 corresponding to the gap S. The plurality of through holes 34b is formed such that there is substantially no impact on the function of the second mirror 36. The plurality of through holes 34b has been used to form the gap S by removal of a part of the first intermediate layer 33 by etching.

A first electrode 22 is formed in the first mirror 35 so as to surround the light transmission region 10a. A second electrode 23 is formed in the first mirror 35 so as to include the light transmission region 10a. The first electrode 22 and the second electrode 23 are formed by doping a polysilicon layer closest to the gap S in the first laminated body 32 with an impurity to reduce the resistance. A third electrode 24 is formed in the second mirror 36. The third electrode 24 faces the first electrode 22 and the second electrode 23 via the gap S in a direction parallel to line L. The third electrode 24 is formed by doping a polysilicon layer closest to the gap S in the second laminated body 34 with an impurity to reduce the resistance. Note that although it is preferable that the second electrode 23 is sized to include the entire light transmission region 10a, the second electrode 23 may have substantially the same size as that of the light transmission region 10a.

The first layer structure 30 is provided with a pair of first terminals 25 and a pair of second terminals 26. The paired first terminals 25 face each other across the light transmission region 10a. Each of the first terminals 25 is arranged in a through hole extending from the surface 34a of the second laminated body 34 to the first laminated body 32. Each of the first terminals 25 is electrically connected with the first electrode 22 via wiring 22a. The paired second terminals 26 face to each other across the light transmission region 10a in a direction perpendicular to the direction in which the paired first terminals 25 face each other. Each of the second terminals 26 is arranged in a through hole extending from the surface 34a of the second laminated body 34 to the inside of the first intermediate layer 33. Each of the second terminals 26 is electrically connected with the second electrode 23 via wiring 23a and is also electrically connected with the third electrode 24 via wiring 24a.

Trenches 27 and 28 are formed on the surface 32a of the first laminated body 32 on the first intermediate layer 33 side. The trench 27 extends annularly so as to surround a connecting part of the wiring 23a with the second terminal 26. The trench 27 electrically insulates the first electrode 22 from the wiring 23a. A trench 28 annularly extends along the inner perimeter of the first electrode 22. The trench 28 electrically insulates the first electrode 22 from the region inside the first electrode 22 (that is, the region where the second electrode 23 is). Trenches 29 are formed on the surface 34a of the second laminated body 34. A trench 29 annularly extends so as to surround a first terminal 25. The trench 29 electrically insulates the first terminal 25 from the third electrode 24. Regions inside the trenches 27, 28, and 29 may include an insulating material or a gap.

The second layer structure 40 includes a second antireflection layer 41, a third laminated body 42, a second intermediate layer 43, and a fourth laminated body 44 laminated on the second surface 21b in the order mentioned. The second antireflection layer 41, the third laminated body 42, the second intermediate layer 43, and the fourth laminated body 44 have similar configurations to those of the first antireflection layer 31, the first laminated body 32, the first intermediate layer 33, and the second laminated body 34, respectively. In this manner, the second layer structure 40 has a laminate structure symmetrical to the first layer structure 30 with respect to the substrate 21. That is, the second layer structure 40 is structured to correspond to the first layer structure 30. The second layer structure 40 has a function to suppress warpage or the like of the substrate 21.

An opening 40a is formed in the third laminated body 42, the second intermediate layer 43, and the fourth laminated body 44 so as to include the light transmission region 10a. The center line of the opening 40a coincides with line L. The opening 40a is, for example, a cylindrical space, and has a diameter substantially the same as that of the light transmission region 10a. The opening 40a opens on the light emission side, and the bottom surface of the opening 40a extends to the second antireflection layer 41. The opening 40a passes light transmitted by the first mirror 35 and the second mirror 36.

A light shielding layer 45 is formed on a surface of the fourth laminated body 44 on the light emission side. The light shielding layer 45 is made of, for example, aluminum. A protective layer 46 is formed on the surface of the light shielding layer 45 and the inner surface of the opening 40a. The protective layer 46 is made of, for example, aluminum oxide. Note that, by setting the thickness of the protective layer 46 at 1 to 100 nm (preferably, about 30 nm), optical influence by the protective layer 46 becomes negligible.

In the Fabry-Perot interference filter 10 configured in the above manner, when a voltage is applied between the first electrode 22 and the third electrode 24 via the pair of first terminals 25 and the pair of second terminals 26, electrostatic force corresponding to the voltage is generated between the first electrode 22 and the third electrode 24. The second mirror 36 is pulled toward the first mirror 35 secured to the substrate 21 by the electrostatic force, thereby adjusting the distance between the first mirror 35 and the second mirror 36. As described above, the distance between the first mirror 35 and the second mirror 36 is variable in the Fabry-Perot interference filter 10.

The wavelength of light transmitted by the Fabry-Perot interference filter 10 is dependent on the distance between the first mirror 35 and the second mirror 36 in the light transmission region 10a. Therefore, adjusting the voltage applied between the first electrode 22 and the third electrode 24 allows a wavelength of transmitted light to be selected as appropriate. Here, the second electrode 23 has the same potential as that of the third electrode 24. Therefore, the second electrode 23 functions as a compensation electrode for keeping the first mirror 35 and the second mirror 36 flat in the light transmission region 10a.

In the light detection device 1A, an optical spectrum can be obtained by detection of light transmitted by the light transmission region 10a of the Fabry-Perot interference filter 10 by the light detector 8 while the voltage applied to the Fabry-Perot interference filter 10 is changed (that is, while the distance between the first mirror 35 and the second mirror 36 in the Fabry-Perot interference filter 10 is changed).

Note that, in the Fabry-Perot interference filter 10, the light transmission region 10a (as described above, a region in the Fabry-Perot interference filter 10 in which the distance between the first mirror 35 and the second mirror 36 for selectively transmitting light having a predetermined wavelength can be controlled to a predetermined distance and through which light having a predetermined wavelength corresponding to the distance between the first mirror 35 and the second mirror 36 can be transmitted) can be regarded as a region corresponding to the region inside the first electrode 22 (that is, the region where the second electrode 23 functioning as a compensation electrode is present) when viewed from a direction parallel to line L, or can be regarded as a region corresponding to the opening 40a when viewed from the direction parallel to line L.

[Actions and Effects]

In the light detection device 1A, the light transmitting unit 100 arranged on the inner surface of the package 2 so as to close the opening 2a is integrally configured including the band pass filter 14 and the lens unit 16. As a result, light entering the package 2 from the opening 2a is condensed by the lens unit 16 of the light transmitting unit 100 and is allowed to be incident on the Fabry-Perot interference filter 10. Therefore, it is possible to increase the ratio of light incident on the light transmission region 10a of the Fabry-Perot interference filter 10 in the light entering inside the package 2. This can also suppress light from being incident on the peripheral region around the light transmission region 10a of the Fabry-Perot interference filter 10 and becoming stray light. In addition, light entering the package 2 from the opening 2a is transmitted by the band pass filter 14 of the light transmitting unit 100 and is allowed to be incident on the light transmission region 10a of the Fabry-Perot interference filter 10. Therefore, it is possible to suppress light having an unnecessary wavelength from entering the light detector 8. As described above, the light detection device 1A enables highly sensitive and highly accurate detection.

Moreover, in the light detection device 1A, the perimeter of the Fabry-Perot interference filter 10 is positioned outside the perimeter of the opening 2a, and the perimeter of the light transmitting unit 100 (the perimeter of the light transmitting member 13 in the light detection device 1A and the perimeter of the band pass filter 14) is positioned outside the perimeter of the Fabry-Perot interference filter 10 when viewed from a direction parallel to line L. This can prevent light from entering the package 2 via side surfaces of the light transmitting unit 100 (the side surfaces 13e of the light transmitting member 13 in the light detection device 1A) due to an incident angle of light at the opening 2a, diffraction at the opening 2a, etc. and becoming stray light. Furthermore, for example as compared to a case where the perimeter of the light transmitting unit 100 is positioned inside the perimeter of the Fabry-Perot interference filter 10, the heat capacity of the light transmitting unit 100 and a thermally-connected area between the light transmitting unit 100 and the package 2 increases, and thus as a result the temperature in the package 2 can be uniformized. Uniformizing the temperature in the package 2 is important for suppressing variations in the stress generated in the Fabry-Perot interference filter 10 due to a temperature change and for controlling the distance between the first mirror 35 and the second mirror 36 with high accuracy.

Moreover, in the light detection device 1A, the perimeter of the band pass filter 14 is positioned outside the perimeter of the Fabry-Perot interference filter 10 when viewed from a direction parallel to line L. As a result, it is ensured that light incident on the light transmission region 10a of the Fabry-Perot interference filter 10 has been transmitted by the band pass filter 14.

In the light detection device 1A, the lens unit 16 is provided on the light incident surface 13a of the light transmitting member 13. With this arrangement, the thickness of the light transmitting member 13 can be increased such that the distance between the band pass filter 14 and the Fabry-Perot interference filter 10 is reduced. In this case, since the heat capacity of the light transmitting member 13 is increased while the volume of the space in the package 2 is reduced, the temperature in the package 2 can be further uniformized.

In addition, the positional accuracy of the light transmitting unit 100 is improved in the light detection device 1A since the light transmitting unit 100 can be mounted on the inner surface 6a of the top wall 6 so as to arrange the lens unit 16 in the opening 2a after providing the lens unit 16 on the light incident surface 13a of the light transmitting member 13 and providing the band pass filter 14 on the light emitting surface 13b of the light transmitting member 13. Meanwhile, if the lens unit 16 is mounted on the light incident surface 13a of the light transmitting member 13 such that the lens unit 16 is arranged in the opening 2a after the light transmitting member 13 is mounted on the inner surface 6a of the top wall 6, it is possible to suppress occurrence of a damage on the light incident surface of the lens unit 16 with more reliability in the assembly process.

The suppression of stray light from entering the light detector 8 will be described in more detail. A part of light entering the opening 2a of the package 2 may be emitted from side surfaces of the light transmitting unit 100 into the package 2 due to an incident angle of light at the opening 2a, diffraction at the side surface of the opening 2a and at an emitting side corner (corner where the side surface of the opening 2a meets the inner surface 6a of the top wall 6), etc. When such light is multiple-reflected within the package 2 and enters the light detector 8, this appears as noise due to stray light in an output signal, thereby leading to degradation of light detecting characteristics. In particular, since the side surfaces 13c of the light transmitting member 13 are rougher than the light incident surface 13a and the light emitting surface 13b in many cases, light emitted from the side surfaces 13c of the light transmitting member 13 into the package 2 is likely to be scattered and to enter the light detector 8. In contrast, in the light detection device 1A, the perimeter of the Fabry-Perot interference filter 10 is positioned outside the perimeter of the opening 2a of the package 2, and the perimeter of the light transmitting unit 100 is positioned outside the perimeter of the Fabry-Perot interference filter 10. As a result, for example as compared with the case where the perimeter of the light transmitting unit 100 is positioned inside the perimeter of the Fabry-Perot interference filter 10, the side surfaces of the light transmitting unit 100 are positioned apart from the light transmission region 10a of the Fabry-Perot interference filter 10 and the light detector 8. Therefore, the incidence of stray light on the light detector 8 is suppressed, and the S/N ratio and the resolution are improved.

The uniformizing of the temperature in the package 2 will be described more specifically. When the opening 2a of the package 2 becomes smaller, the volume of the package 2 itself becomes larger. Meanwhile, when the light transmitting unit 100 becomes larger, the heat capacity of the light transmitting unit 100 and a thermally-connected area between the light transmitting unit 100 and the package 2 are increased while the volume of the space in the package 2 is reduced. As a result, the following actions are obtained. First, the volume of the package 2 itself, which is made of metal, has a high thermal conductivity, and is easily maintained at a uniform temperature as a whole (heat easily spreads to the entire package 2), is increased. Furthermore, since the thermally-connected area between the light transmitting unit 100 and the package 2 is large, the heat is easily conducted from the package 2 to the light transmitting unit 100, and the light transmitting unit 100 is maintained at a uniform temperature with the package 2. Furthermore, since the volume of the space in the package 2 is small, the temperature in the space in the package 2 (and the components of the Fabry-Perot interference filter 10 and other components arranged therein) is also maintained at a uniform temperature by the influence of the package 2 and the light transmitting unit 100 the temperature of which is maintained at a uniform temperature. Furthermore, temporal changes in the temperature is suppressed by the light transmitting unit 100 and the package 2 having a large heat capacity. By these actions, the temperature in the package 2 becomes thermally uniform, and the thermal characteristic of the light detection device 1A is stabilized.

Moreover, in the light detection device 1A, the perimeter of the light transmission region 10a of the Fabry-Perot interference filter 10 is positioned outside the perimeter of the light detector 8, the perimeter of the opening 2a is positioned outside the perimeter of the light transmission region 10a, and the perimeter of the band pass filter 14 is positioned outside the perimeter of the opening 2a when viewed from a direction parallel to line L. As a result, it is ensured that light incident on the light detector 8 via the opening 2a and the light transmission region 10a of the Fabry-Perot interference filter 10 has been transmitted by the band pass filter 14.

Moreover, in the light detection device 1A, the perimeter of the Fabry-Perot interference filter 10 is positioned outside the perimeter of the light detector 8 when viewed from a direction parallel to line L. This can suppress light not transmitted by the light transmission region 10a of the Fabry-Perot interference filter 10 from entering the light detector 8 as stray light.

Moreover, in the light detection device 1A, the thickness T of the light transmitting member 13 is a value larger than or equal to a value obtained by multiplying the distance D1 between the Fabry-Perot interference filter 10 and the light transmitting member 13 by 0.1 (more preferably, a value greater than or equal to a value obtained by multiplying 0.3). As a result, since the heat capacity of the light transmitting member 13 is increased while the volume of the space in the package 2 is reduced, the temperature in the package 2 can be further uniformized. Furthermore, since the light transmitting member 13 moves relatively closer to the Fabry-Perot interference filter 10, it is possible to suppress light not transmitted by the light transmission region 10a of the Fabry-Perot interference filter 10 from entering the light detector 8 as stray light.

Moreover, in the light detection device 1A, the thickness T of the light transmitting member 13 has a value larger than or equal to a value obtained by multiplying the distance D2 between the Fabry-Perot interference filter 10 and the light detector 8 by 0.5 (more preferably, a value greater than or equal to a value obtained by multiplying 1.0). As a result, since the heat capacity of the light transmitting member 13 is increased while the volume of the space in the package 2 is reduced, the temperature in the package 2 can be further uniformized. The thickness T of the light transmitting member 13 is more than or equal to twice the thickness of the top wall 6 (more preferably, more than or equal to three times the thickness of the top wall 6). In addition, the distance from the surface (outer surface) of the top wall 6 on the light incident side to the light emitting surface of the band pass filter 14 is greater than the distance from the light emitting surface of the band pass filter 14 to the surface of the Fabry-Perot interference filter 10 on the light transmitting member 13 side. As a result, since the heat capacity of the light transmitting member 13 is increased while the volume of the space in the package 2 is reduced, the temperature in the package 2 can be further uniformized. Furthermore, since the light transmitting member 13 moves relatively closer to the Fabry-Perot interference filter 10, it is possible to suppress light not transmitted by the light transmission region 10a of the Fabry-Perot interference filter 10 from entering the light detector 8 as stray light.

In the light detection device 1A, the band pass filter 14 is provided on the light emitting surface 13b of the light transmitting member 13. As a result, it is possible to prevent occurrence of a damage such as a scratch in the band pass filter 14 due to external physical interference.

In the light detection device 1A, the terminals 25 and 26 of the Fabry-Perot interference filter 10 and the lead pins 11 are electrically connected by the wires 12. As described above, in the light detection device 1A, the perimeter of the Fabry-Perot interference filter 10 is positioned outside the perimeter of the opening 2a of the package 2, and the perimeter of the light transmitting unit 100 is positioned outside the perimeter of the Fabry-Perot interference filter 10 when viewed from a direction parallel to line L. Therefore, even when the wires 12 bend, the wires 12 and the package 2 can be prevented from being in contact.

Prevention of contact between the wires 12 and the package 2 will be described more specifically. When a wire 12 is brought into contact with the package 2 made of metal, an electric signal for controlling the Fabry-Perot interference filter 10 flows also in the package 2, thereby making it difficult to control the Fabry-Perot interference filter 10. Contrary to this, even when a wire 12 is brought into contact with the light transmitting unit 100 made of an insulating material, an electric signal for controlling the Fabry-Perot interference filter 10 does not flow in the light transmitting unit 100, and thus the Fabry-Perot interference filter 10 can be controlled with high accuracy. The above configuration that can prevent contact between the wires 12 and the package 2 is important.

Furthermore, in the light detection device 1A, a silicon substrate is adopted as the substrate 21 of the Fabry-Perot interference filter 10, and an InGaAs substrate formed with a photoelectric conversion region is adopted as the light detector 8, whereby the following actions and effects are achieved. The light detector 8 having the InGaAs substrate formed with the photoelectric conversion region has a high sensitivity to light having a wavelength within a range between 1200 nm and 2100 nm, for example, as compared to light having a wavelength shorter than 1200 nm and light having a wavelength longer than 2100 nm. However, the light detector 8 has a high sensitivity to light having a wavelength shorter than 1200 nm as compared with light having a wavelength longer than 2100 nm. Meanwhile, the silicon substrate has higher absorptivity to light having a wavelength shorter than 1200 nm as compared with light having a wavelength of 1200 nm or more (although this depends on a manufacturing method, the thickness, and an impurity concentration of the silicon substrate, a high absorptivity is exhibited especially for light having a wavelength shorter than 1100 nm). Therefore, with the above configuration, for example in a case where light having a wavelength within the range between 1200 nm and 2100 nm should be detected, the silicon substrate of the Fabry-Perot interference filter 10 can be caused to function as a high-pass filter. As a result, it is possible to securely suppress detection of noise light (light having a wavelength shorter than 1200 nm (in particular, shorter than 1100 nm) and light having a wavelength longer than 2100 Dm) by the light detector 8 by the synergistic effect with the band pass filter 14.

Figure 5:
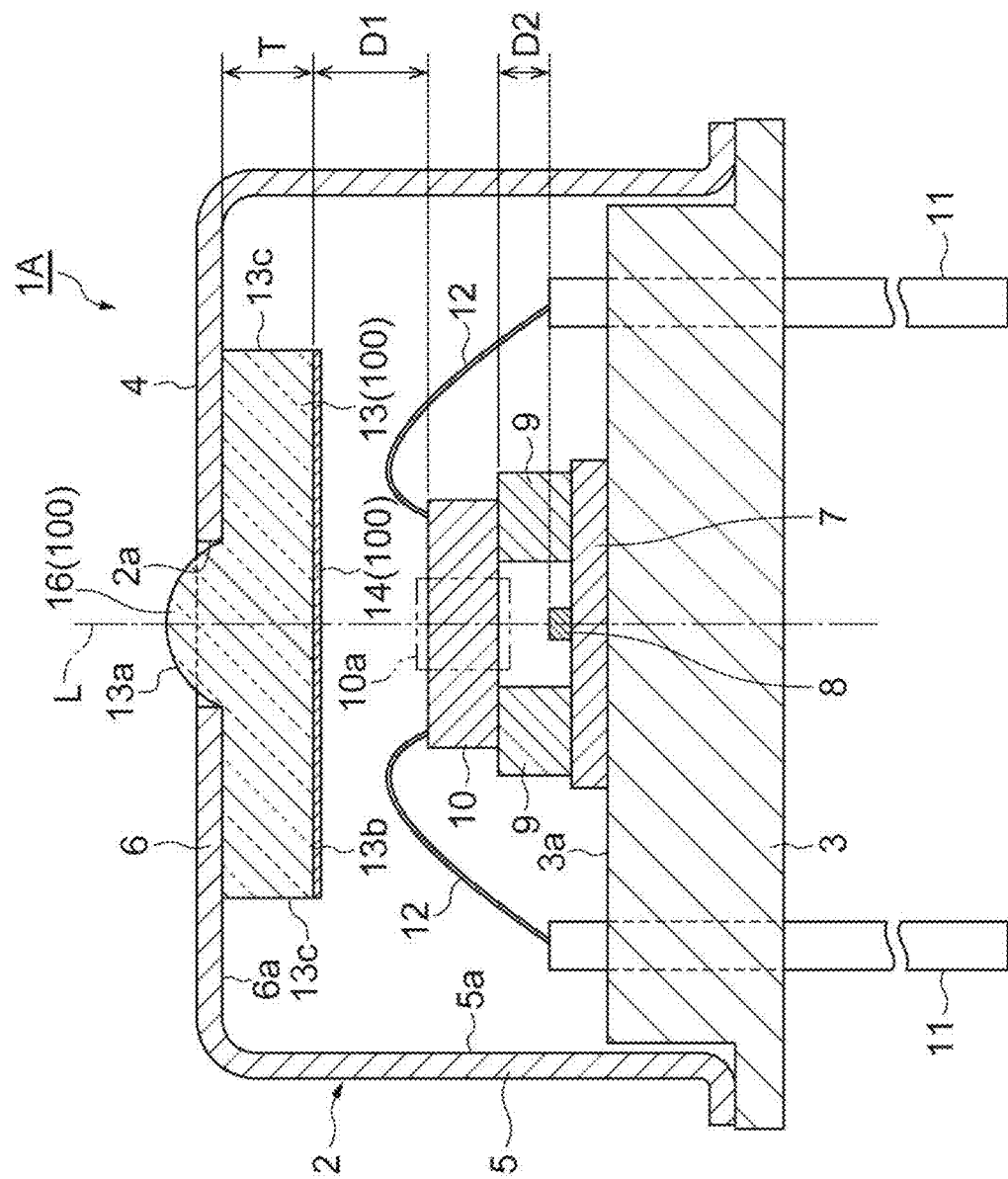
FIG. 5 is a cross-sectional view of a modification of the light detection device illustrated in FIG. 1.

Note that the lens unit 16 may be formed on the light incident surface 13a side of the light transmitting member 13 as a part of the light transmitting member 13 as illustrated in FIG. 5. According to this light detection device 1A, the thickness of the light transmitting member 13 can be increased such that the distance between the band pass filter 14 and the Fabry-Perot interference filter 10 is reduced. In this case, since the heat capacity of the light transmitting member 13 is increased while the volume of the space in the package 2 is reduced, the temperature in the package 2 can be further uniformized. Moreover, the lens unit 16 can be formed with high positional accuracy with respect to the light transmitting member 13.

In addition, as illustrated in (a) of FIG. 6, the lens unit 16 may be provided on a light emitting surface 14b of the band pass filter 14 (surface facing the light incident surface 14a of the band pass filter 14) for example by bonding or resin potting. In this light detection device 1A, the lens unit 16 is a convex lens having a light emitting surface that is convex toward the light emitting side (the side opposite to the light transmitting member 13). According to this light detection device 1A, since the incident angle of light incident on the band pass filter 14 is not affected by the lens unit 16, the band pass filter 14 is allowed to function more appropriately. Furthermore, it is possible to prevent occurrence of a damage such as a scratch in the lens unit 16 due to external physical interference. Note that in this case, the lens unit 16 has no influence when a dielectric multilayer film is formed as the band pass filter 14, and thus it is advantageous for forming the dielectric multilayer film accurately and easily.

Furthermore, as illustrated in (b) of FIG. 6, the lens unit 16 may be formed on the light emitting surface 13b side of the light transmitting member 13 as a part of the light transmitting member 13. In this light detection device 1A, the lens unit 16 is a convex lens having a light emitting surface that is convex toward the light emitting side (the side opposite to the light transmitting member 13), and the band pass filter 14 is formed on the light emitting surface 13b of the light transmitting member 13 so as to cover the light emitting surface of the lens unit 16. In the light detection device 1A, since the band pass filter 14 is formed along the light emitting surface of the lens unit 16, light enters the band pass filter 14 along the thickness direction of the band pass filter 14. Therefore, the band pass filter 14 is allowed to function appropriately according to the light detection device 1A. Moreover, the lens unit 16 can be formed with high positional accuracy with respect to the light transmitting member 13. Furthermore, it is possible to prevent occurrence of a damage such as a scratch in the lens unit 16 due to external physical interference.

Alternatively, a pair of lens units 16 may be provided as illustrated in (a) of FIG. 7. In this light detection device 1A, one of the lens units 16 is provided on the light incident surface 13a of the light transmitting member 13 by, for example, bonding or resin potting. The other lens unit 16 is provided on the light emitting surface 14b of the band pass filter 14 by, for example, bonding or resin potting. According to this light detection device 1A, the light incident on the Fabry-Perot interference filter 10 can be condensed more reliably while the heights of the respective lens units 16 are kept low, thereby further increasing the ratio of light incident on the light transmission region 10a of the Fabry-Perot interference filter 10 in the light entering the package 2.

Further alternatively, a pair of lens units 16 may be provided as illustrated in (b) of FIG. 7. In this light detection device 1A, one of the lens units 16 is formed on the light incident surface 13a side of the light transmitting member 13 as a part of the light transmitting member 13. The other lens unit 16 is formed on the light emitting surface 13b side of the light transmitting member 13 as a part of the light transmitting member 13, and the band pass filter 14 is formed on the light emitting surface 13b of the light transmitting member 13 so as to cover the light emitting surface of the other lens unit 16. According to this light detection device 1A, the light incident on the Fabry-Perot interference filter 10 can be condensed more reliably while the heights of the respective lens units 16 are kept low, thereby further increasing the ratio of light incident on the light transmission region 10a of the Fabry-Perot interference filter 10 in the light entering the package 2.

Note that, in the light detection device 1A illustrated in (a) of FIG. 7, the one lens unit 16 may be formed on the light incident surface 13a side of the light transmitting member 13 as a part of the light transmitting member 13. Moreover, in the light detection device 1A illustrated in (a) of FIG. 7, the other lens unit 16 may be formed on the light emitting surface 13b side of the light transmitting member 13 as a part of the light transmitting member 13, and the band pass filter 14 may be formed on the light emitting surface 13b of the light transmitting member 13 so as to cover the light emitting surface of the other lens unit 16.

Second Embodiment

Figure 8:
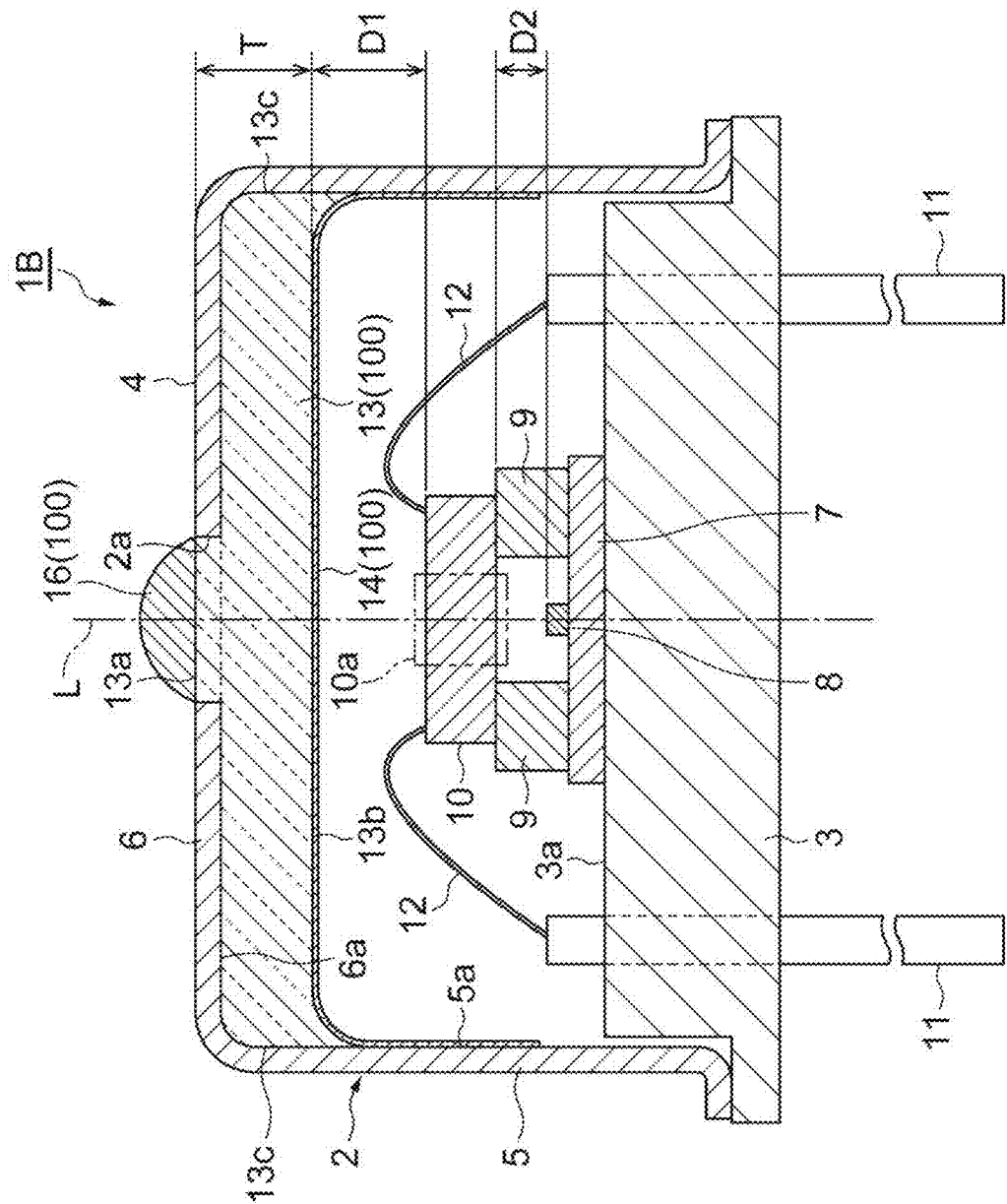
FIG. 8 is a cross-sectional view of a light detection device of a second embodiment.

As illustrated in FIG. 8, a light detection device 1B is different from the light detection device 1A described above in the configuration of a light transmitting unit 100. In the light detection device 1B, a light transmitting member 13 arranged on an inner surface of a package 2 extends to the inside the opening 2a and an inner surface 5a of a side wall 5. A light incident surface 13a of the light transmitting member 13 is substantially flush with an outer surface of the top wall 6 at the opening 2a. Such a light transmitting member 13 is formed by arranging a glass pellet inside a cap 4 with the opening 2a facing down and melting the glass pellet. That is, the light transmitting member 13 is made of fused glass. A lens unit 16 is provided on the light incident surface 13a of the light transmitting member 13 by, for example, bonding or resin potting. A band pass filter 14 extends to a part of the inner surface 5a of the side wall 5 of the cap 4 from a light emitting surface 13b of the light transmitting member 13.

In the light detection device 1B, the thickness T of the light transmitting member 13 has a value larger than or equal to a value obtained by multiplying the distance D1 between a Fabry-Perot interference filter 10 and the light transmitting member 13 by 0.25 (more preferably, a value greater than or equal to a value obtained by multiplying 0.5). Moreover, the thickness T of the light transmitting member 13 has a value larger than or equal to a value obtained by multiplying the distance D2 between the Fabry-Perot interference filter 10 and the light detector 8 by 1.0 (more preferably, a value greater than or equal to a value obtained by multiplying 3.0). The thickness T of the light transmitting member 13 is more than or equal to twice the thickness of the top wall 6 (more preferably, more than or equal to three times the thickness of the top wall 6). In addition, the distance from the surface (outer surface) of the top wall 6 on the light incident side to the light emitting surface of the band pass filter 14 is greater than the distance from the light emitting surface of the band pass filter 14 to the surface of the Fabry-Perot interference filter 10 on the light transmitting member 13 side. As a result, since the heat capacity of the light transmitting member 13 is increased while the volume of the space in the package 2 is reduced, the temperature in the package 2 can be further uniformized. Furthermore, since the light transmitting member 13 moves relatively closer to the Fabry-Perot interference filter 10, it is possible to suppress light not transmitted by the light transmission region 10a of the Fabry-Perot interference filter 10 from entering the light detector 8 as stray light. The perimeter of the Fabry-Perot interference filter 10 is positioned outside the perimeter of the opening 2a when viewed from a direction parallel to line L. The perimeter of the light transmitting unit 100 (the perimeter of the light transmitting member 13 and the perimeter of the band pass filter 14 in the light detection device 1B) is positioned outside the perimeter of the Fabry-Perot interference filter 10 when viewed from a direction parallel to line L.

Also in the light detection device 1B configured as described above, the light transmitting unit 100 provided in the package 2 so as to close the opening 2a is integrally configured including the band pass filter 14 and the lens unit 16, and thus highly sensitive and highly accuracy detection can be performed like in the light detection device 1A described above.

In the light detection device 1B, a side surface 13c of the light transmitting member 13 meets the inner surface 5a of the side wall 5. This can more reliably suppress light from entering the package 2 via the side surface 13c of the light transmitting member 13 due to an incident angle of light at the opening 2a, diffraction at the opening 2a, etc. and becoming stray light. Furthermore, since the heat capacity of the light transmitting member 13 and a thermally connected area between the light transmitting member 13 and the package 2 are increased, the temperature inside the package 2 can be further uniformized as a result.

Moreover, in the light detection device 1B, since the volume (particularly the thickness T) of the light transmitting member 13 is large, flatness of the light incident surface 13a and the light emitting surface 13b of the light transmitting member 13 made of fused glass can be improved. Furthermore, even if air bubbles generated at the time of formation remain in the light transmitting member 13 made of fused glass, since the volume (particularly the thickness T) of the light transmitting member 13 is large, it is possible to reduce the influence of the air bubbles.

Further, in the light detection device 1B, the film-like band pass filter 14 is formed on the light emitting surface 13b side of the light transmitting member 13 from the light emitting surface 13b to the inner surface 5c of the side wall 5 extending along the side surface 13c of the light transmitting member 13. Therefore, occurrence of stray light can be suppressed more reliably. Here, a peripheral part around the light emitting surface 13b of the light transmitting member 13 (boundary part with the inner surface 5c of the side wall 5) is continuously connected with the inner surface 5c of the side wall 5 with a round inner chamfered shape, and thus the band pass filter 14 can be formed stably (without a break) also at the peripheral part.

Figure 9:
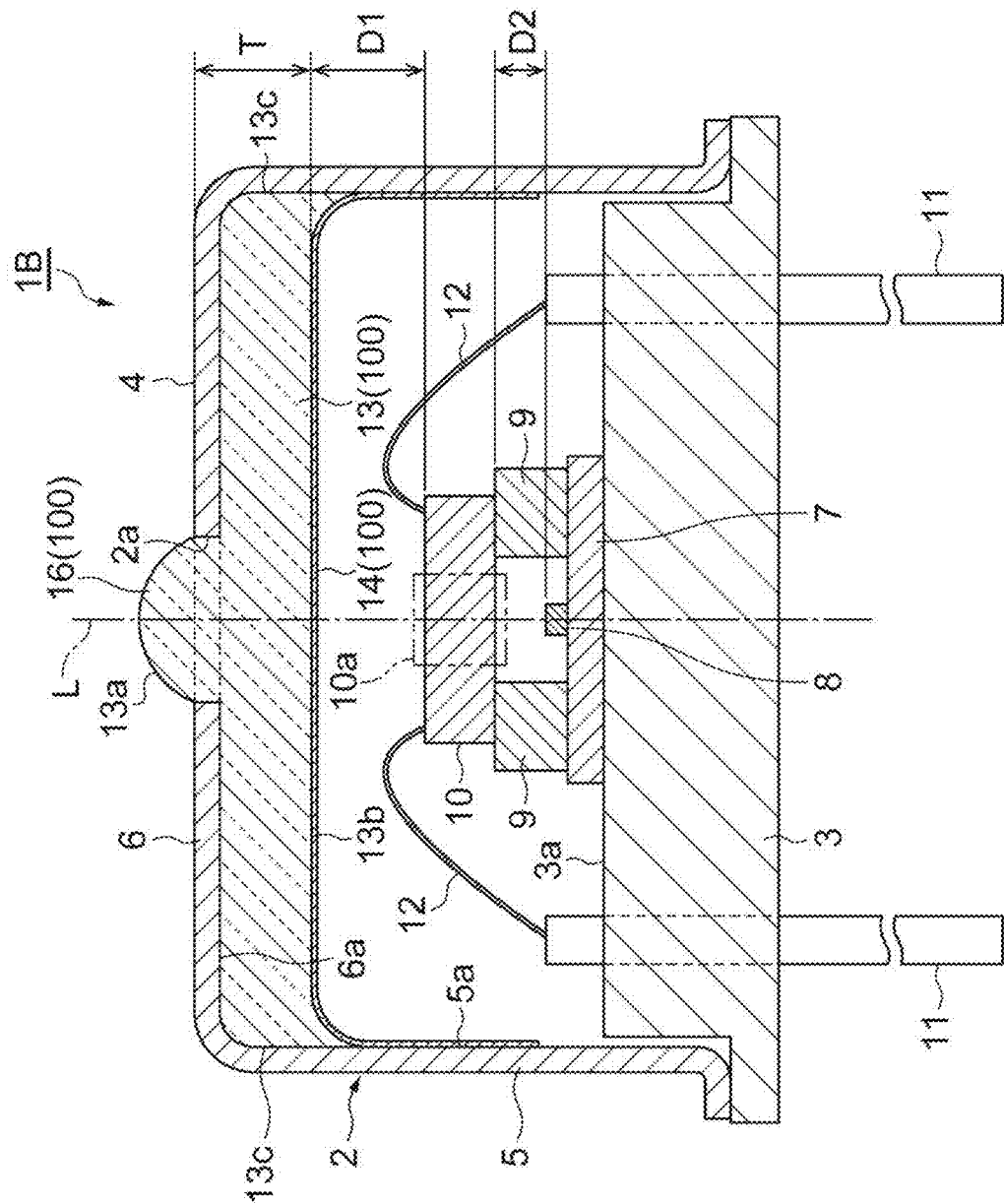
FIG. 9 is a cross-sectional view of a modification of the light detection device illustrated in FIG. 8.

Note that the lens unit 16 may be formed on the light incident surface 13a side of the light transmitting member 13 as a part of the light transmitting member 13 as illustrated in FIG. 9. The light transmitting member 13 and the lens unit 16 as described above are formed by arranging the cap 4 with the opening 2a facing down, arranging glass pellets inside the cap 4 while a mold for forming the lens unit 16 is arranged below the opening 2a, and causing the glass pellets to melt. According to this light detection device 1B, the thickness of the light transmitting member 13 can be increased such that the distance between the band pass filter 14 and the Fabry-Perot interference filter 10 is reduced. In this case, since the heat capacity of the light transmitting member 13 is increased while the volume of the space in the package 2 is reduced, the temperature in the package 2 can be further uniformized. In addition, the number of parts can be reduced. Moreover, the lens unit 16 can be formed with high positional accuracy with respect to the light transmitting member 13.

In addition, as illustrated in (a) of FIG. 10, the lens unit 16 may be provided on a light emitting surface 14b of the band pass filter 14 (surface facing the light incident surface 14a of the band pass filter 14) for example by bonding or resin potting. In this light detection device 1B, the lens unit 16 is a convex lens having a light emitting surface that is convex toward the light emitting side (the side opposite to the light transmitting member 13). According to this light detection device 1B, since the incident angle of light incident on the band pass filter 14 is not affected by the lens unit 16, the band pass filter 14 is allowed to function more appropriately. Furthermore, it is possible to prevent occurrence of a damage such as a scratch in the lens unit 16 due to external physical interference. Note that in this case, the lens unit 16 has no influence when a dielectric multilayer film is formed as the band pass filter 14, and thus it is advantageous for forming the dielectric multilayer film accurately and easily.

Furthermore, as illustrated in (b) of FIG. 10, the lens unit 16 may be formed on the light emitting surface 13b side of the light transmitting member 13 as a part of the light transmitting member 13. In this light detection device 1B, the lens unit 16 is a convex lens having a light emitting surface that is convex toward the light emitting side (the side opposite to the light transmitting member 13), and the band pass filter 14 is formed on the light emitting surface 13b of the light transmitting member 13 so as to cover the light emitting surface of the lens unit 16. In the light detection device 1B, since the band pass filter 14 is formed along the light emitting surface of the lens unit 16, light enters the band pass filter 14 along the thickness direction of the band pass filter 14. Therefore, the band pass filter 14 is allowed to function appropriately according to the light detection device 1B. In addition, the number of parts can be reduced. Moreover, the lens unit 16 can be formed with high positional accuracy with respect to the light transmitting member 13. Furthermore, it is possible to prevent occurrence of a damage such as a scratch in the lens unit 16 due to external physical interference.

Alternatively, a pair of lens units 16 may be provided as illustrated in (a) of FIG. 11. In this light detection device 1B, one of the lens units 16 is provided on the light incident surface 13a of the light transmitting member 13 by, for example, bonding or resin potting. The other lens unit 16 is provided on the light emitting surface 14b of the band pass filter 14 by, for example, bonding or resin potting. According to this light detection device 1B, the light incident on the Fabry-Perot interference filter 10 can be condensed more reliably while the heights of the respective lens units 16 are kept low, thereby further increasing the ratio of light incident on the light transmission region 10a of the Fabry-Perot interference filter 10 in the light entering the package 2.

Further alternatively, a pair of lens units 16 may be provided as illustrated in (b) of FIG. 11. In this light detection device 1B, one of the lens units 16 is formed on the light incident surface 13a side of the light transmitting member 13 as a part of the light transmitting member 13. The other lens unit 16 is formed on the light emitting surface 13b side of the light transmitting member 13 as a part of the light transmitting member 13, and the band pass filter 14 is formed on the light emitting surface 13b of the light transmitting member 13 so as to cover the light emitting surface of the other lens unit 16. According to this light detection device 1B, the light incident on the Fabry-Perot interference filter 10 can be condensed more reliably while the heights of the respective lens units 16 are kept low, thereby further increasing the ratio of light incident on the light transmission region 10a of the Fabry-Perot interference filter 10 in the light entering the package 2.

Note that, in the light detection device 1B illustrated in (a) of FIG. 11, the one lens unit 16 may be formed on the light incident surface 13a side of the light transmitting member 13 as a part of the light transmitting member 13. Moreover, in the light detection device 1B illustrated in (a) of FIG. 11, the other lens unit 16 may be formed on the light emitting surface 13b side of the light transmitting member 13 as a part of the light transmitting member 13, and the band pass filter 14 may be formed on the light emitting surface 13b of the light transmitting member 13 so as to cover the light emitting surface of the other lens unit 16.

Third Embodiment

Figure 12:
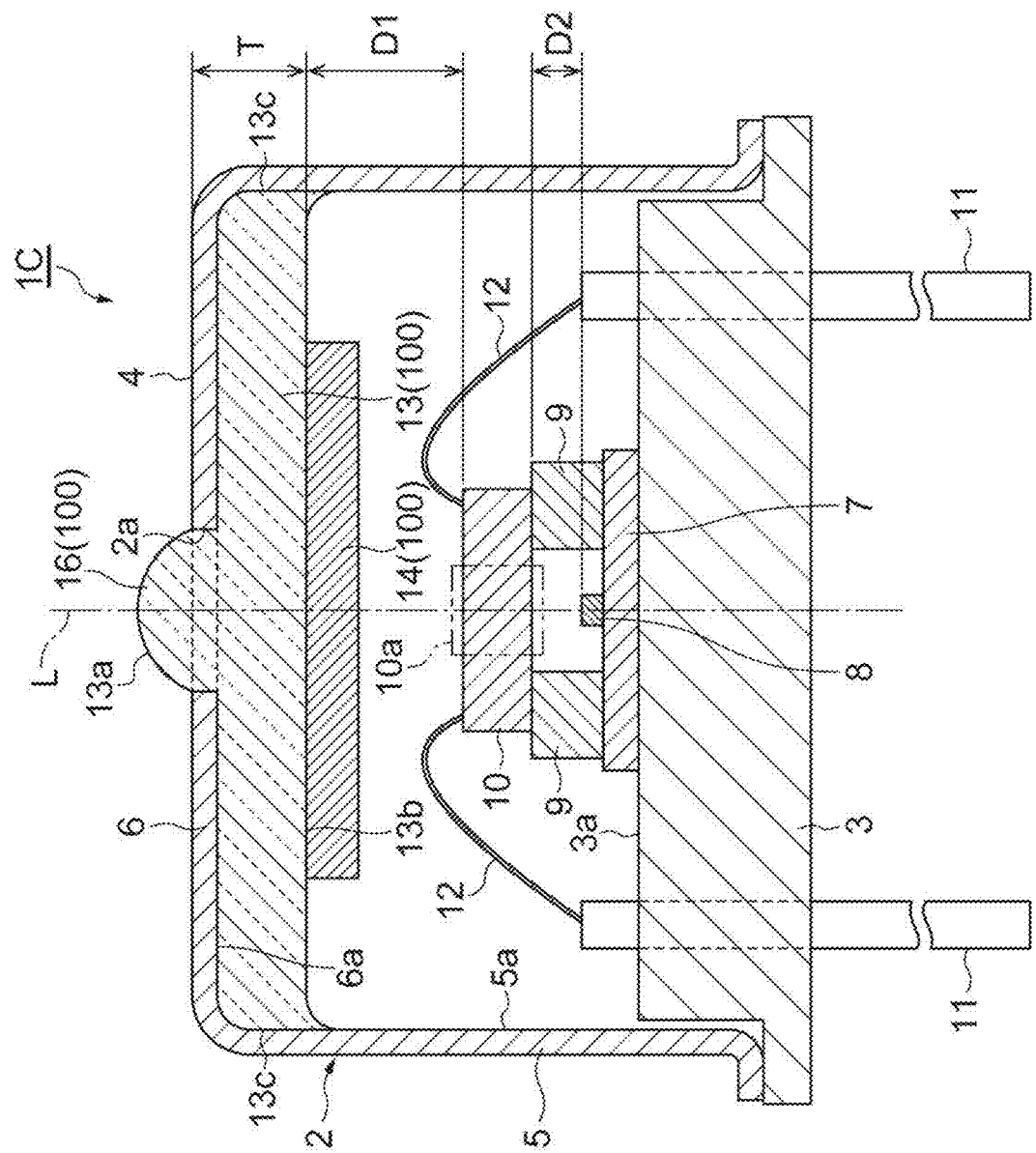
FIG. 12 is a cross-sectional view of a light detection device of a third embodiment.

As illustrated in FIG. 12, a light detection device 1C is different from the light detection device 1A described above in the configuration of a light transmitting unit 100. In the light detection device 1C, a light transmitting member 13 arranged on an inner surface of a package 2 extends to the inside the opening 2a and an inner surface 5a of a side wall 5. A lens unit 16 is formed on a light incident surface 13a side of the light transmitting member 13 as a part of the light transmitting member 13. The light transmitting member 13 and the lens unit 16 as described above are formed by arranging the cap 4 with the opening 2a facing down, arranging glass pellets inside the cap 4 while a mold for forming the lens unit 16 is arranged below the opening 2a, and causing the glass pellets to melt. That is, the light transmitting member 13 and the lens unit 16 are made of fused glass. A band pass filter 14 is formed into a plate shape, and is bonded to a light emitting surface 13b of the light transmitting member 13 by an adhesive agent or the like. The band pass filter 14 of a plate shape is a dielectric multilayer film formed on a surface of the light transmitting member made of, for example, silicon, glass, or the like. The flatness of the light emitting surface 13b is improved in the light transmitting member 13 made of fused glass since the thickness T is large, and thus the band pass filter 14 can be suitably arranged on the light emitting surface 13b.

In the light detection device 1C, the thickness T of the light transmitting member 13 has a value larger than or equal to a value obtained by multiplying the distance D1 between a Fabry-Perot interference filter 10 and the light transmitting member 13 by 0.3 (more preferably, a value greater than or equal to a value obtained by multiplying 1.0). Moreover, the thickness T of the light transmitting member 13 has a value larger than or equal to a value obtained by multiplying the distance D2 between the Fabry-Perot interference filter 10 and a light detector 8 by 1.0 (more preferably, a value greater than or equal to a value obtained by multiplying 1.5). The thickness T of the light transmitting member 13 is more than or equal to twice the thickness of the top wall 6 (more preferably, more than or equal to three times the thickness of the top wall 6). In addition, the distance from the surface (outer surface) of the top wall 6 on the light incident side to the light emitting surface of the band pass filter 14 is greater than the distance from the light emitting surface of the band pass filter 14 to the surface of the Fabry-Perot interference filter 10 on the light transmitting member 13 side. As a result, since the heat capacity of the light transmitting member 13 is increased while the volume of the space in the package 2 is reduced, the temperature in the package 2 can be further uniformized. Furthermore, since the light transmitting member 13 moves relatively closer to the Fabry-Perot interference filter 10, it is possible to suppress light not transmitted by the light transmission region 10a of the Fabry-Perot interference filter 10 from entering the light detector 8 as stray light. The perimeter of the Fabry-Perot interference filter 10 is positioned outside the perimeter of the opening 2a when viewed from a direction parallel to line L. The perimeter of the light transmitting unit 100 (the perimeter of the light transmitting member 13 and the perimeter of the band pass filter 14 in the light detection device 1C) is positioned outside the perimeter of the Fabry-Perot interference filter 10 when viewed from a direction parallel to line L.

Also in the light detection device 1C configured as described above, the light transmitting unit 100 provided in the package 2 so as to close the opening 2a is integrally configured including the band pass filter 14 and the lens unit 16, and thus highly sensitive and highly accuracy detection can be performed like in the light detection device 1A described above.

Moreover, in the light detection device 1C, the lens unit 16 is formed on the light incident surface 13a side of the light transmitting member 13 as a part of the light transmitting member 13. As a result, the lens unit 16 can be formed with high positional accuracy with respect to the light transmitting member 13.

Furthermore, in the light detection device 1C, the band pass filter 14 obtained by forming the dielectric multilayer film on the surface of the light transmitting member is prepared, and then the band pass filter 14 can be attached to the light emitting surface 13b of the light transmitting member 13. Therefore, the dielectric multilayer film can be accurately and easily formed in the band pass filter 14. Particularly in a case where the light transmitting member of the band pass filter 14 (substrate included in the band pass filter 14) is made of silicon, the light transmitting member itself functions as a high-pass filter for transmitting light having a wavelength higher than or equal to 1200 nm, for example. Therefore, the dielectric multilayer film can be thinned down in the band pass filter 14.

Meanwhile, the heat capacity is increased by the plate-like band pass filter 14, and the volume of the space in the package 2 is further reduced in the light detection device 1C.

Therefore, the temperature in the package 2 can be further uniformized. Furthermore, since the distance between the band pass filter 14 and the Fabry-Perot interference filter 10 is reduced by the thickness of the light transmitting member forming the band pass filter 14 of a plate shape, it is further reliably ensured that light incident on the light transmission region 10a of the Fabry-Perot interference filter 10 has been transmitted by the band pass filter 14.

Figure 13:
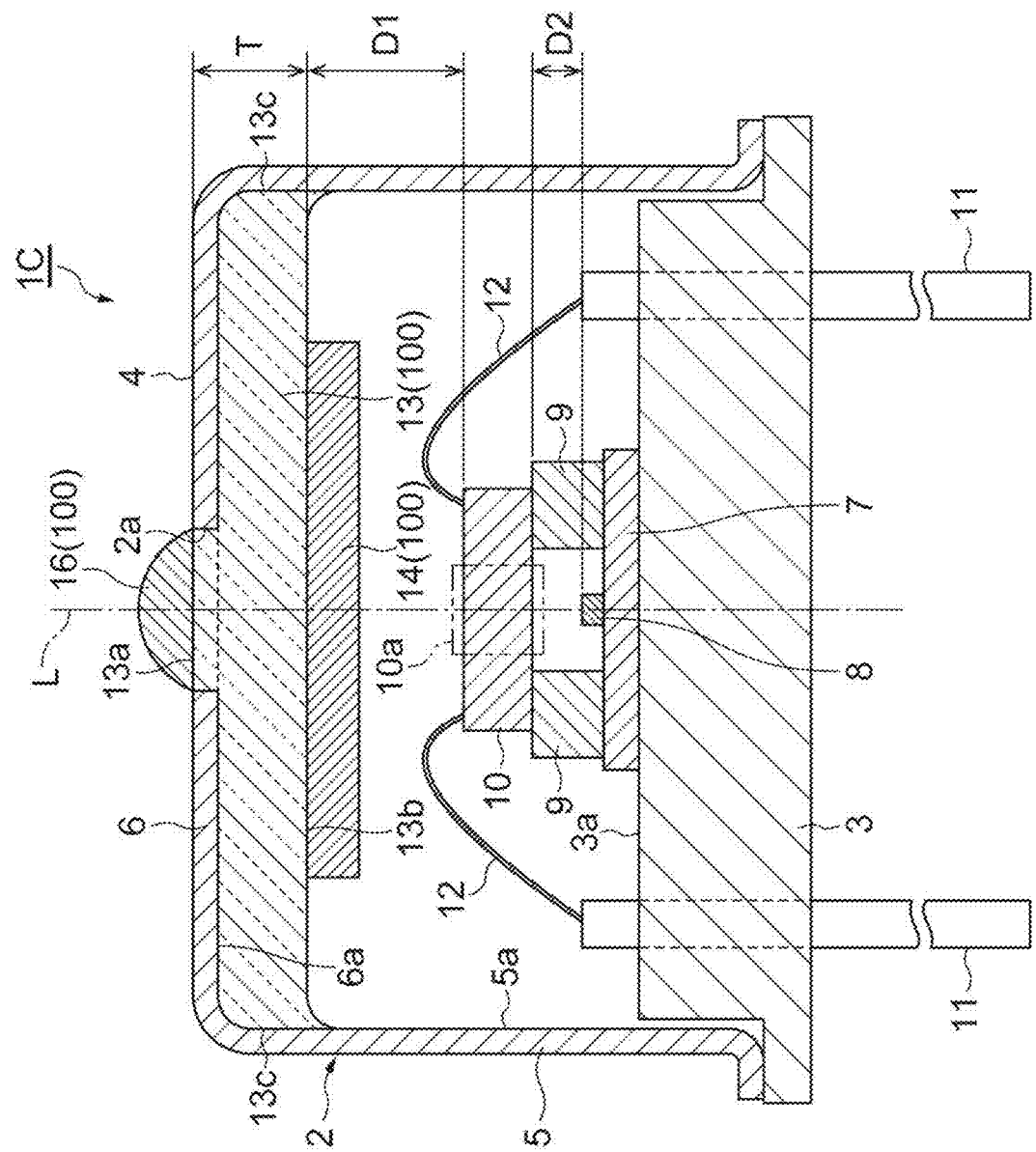
FIG. 13 is a cross-sectional view of a modification of the light detection device illustrated in FIG. 12.

Note that the lens unit 16 may be provided on the light incident surface 13a of the light transmitting member 13 by, for example, bonding or resin potting as illustrated in FIG. 13. According to this light detection device 1C, the thickness of the light transmitting member 13 can be increased such that the distance between the band pass filter 14 and the Fabry-Perot interference filter 10 is reduced. In this case, since the heat capacity of the light transmitting member 13 is increased while the volume of the space in the package 2 is reduced, the temperature in the package 2 can be further uniformized.

Furthermore, as illustrated in (a) of FIG. 14, the lens unit 16 may be formed on the light emitting surface 14b side of the band pass filter 14 as a part of the band pass filter 14. In this light detection device 1C, the lens unit 16 is a convex lens having a light emitting surface that is convex toward the light emitting side (the side opposite to the light transmitting member 13). In a case where the dielectric multilayer film of the band pass filter 14 is formed on the light incident surface 14a side of the band pass filter 14, the incident angle of light incident on the dielectric multilayer film is not affected by the lens unit 16. Therefore, the band pass filter 14 is allowed to function more properly. In a case where the dielectric multilayer film of the band pass filter 14 is formed on the light emitting surface 14b side of the band pass filter 14 so as to cover the light emitting surface of the lens unit 16, light is incident on the dielectric multilayer film along the thickness direction of the dielectric multilayer film, the band pass filter 14 is allowed to function properly. In addition, the band pass filter 14 provided with the lens unit 16 can be manufactured accurately and easily by a wafer process. Furthermore, it is possible to prevent occurrence of a damage such as a scratch in the lens unit 16 due to external physical interference.

In addition, as illustrated in (b) of FIG. 14, the lens unit 16 may be provided on a light emitting surface 14b of the band pass filter 14 (surface facing the light incident surface 14a of the band pass filter 14) for example by bonding or resin potting. In this light detection device 1C, the lens unit 16 is a convex lens having a light emitting surface that is convex toward the light emitting side (the side opposite to the light transmitting member 13). According to this light detection device 1C, since the incident angle of light incident on the band pass filter 14 is not affected by the lens unit 16, the band pass filter 14 is allowed to function more appropriately. Furthermore, it is possible to prevent occurrence of a damage such as a scratch in the lens unit 16 due to external physical interference. Note that in this case the lens unit 16 has no influence when the dielectric multilayer film is formed in the band pass filter 14, and thus it is advantageous for forming the dielectric multilayer film accurately and easily.

Alternatively, a pair of lens units 16 may be provided as illustrated in (a) of FIG. 15. In this light detection device 1C, one of the lens units 16 is formed on the light incident surface 13a side of the light transmitting member 13 as a part of the light transmitting member 13. The other lens unit 16 is provided on the light emitting surface 14b of the band pass filter 14 by, for example, bonding or resin potting. According to this light detection device 1C, the light incident on the Fabry-Perot interference filter 10 can be condensed more reliably while the heights of the respective lens units 16 are kept low, thereby further increasing the ratio of light incident on the light transmission region 10a of the Fabry-Perot interference filter 10 in the light entering the package 2.

Further alternatively, a pair of lens units 16 may be provided as illustrated in (b) of FIG. 15. In this light detection device 1C, one of the lens units 16 is provided on the light incident surface 13a of the light transmitting member 13 by, for example, bonding or resin potting. The other lens unit 16 is provided on the light emitting surface 14b of the band pass filter 14 by, for example, bonding or resin potting. According to this light detection device 1C, the light incident on the Fabry-Perot interference filter 10 can be condensed more reliably while the heights of the respective lens units 16 are kept low, thereby further increasing the ratio of light incident on the light transmission region 10a of the Fabry-Perot interference filter 10 in the light entering the package 2.

Note that, in the light detection device 1C illustrated in (b) of FIG. 15, the one lens unit 16 may be formed on the light incident surface 13a side of the light transmitting member 13 as a part of the light transmitting member 13. Alternatively, in the light detection device 1C illustrated in (b) of FIG. 15, the other lens unit 16 may be formed on the light emitting surface 14b side of the band pass filter 14 as a part of the band pass filter 14.

Fourth Embodiment

Figure 16:
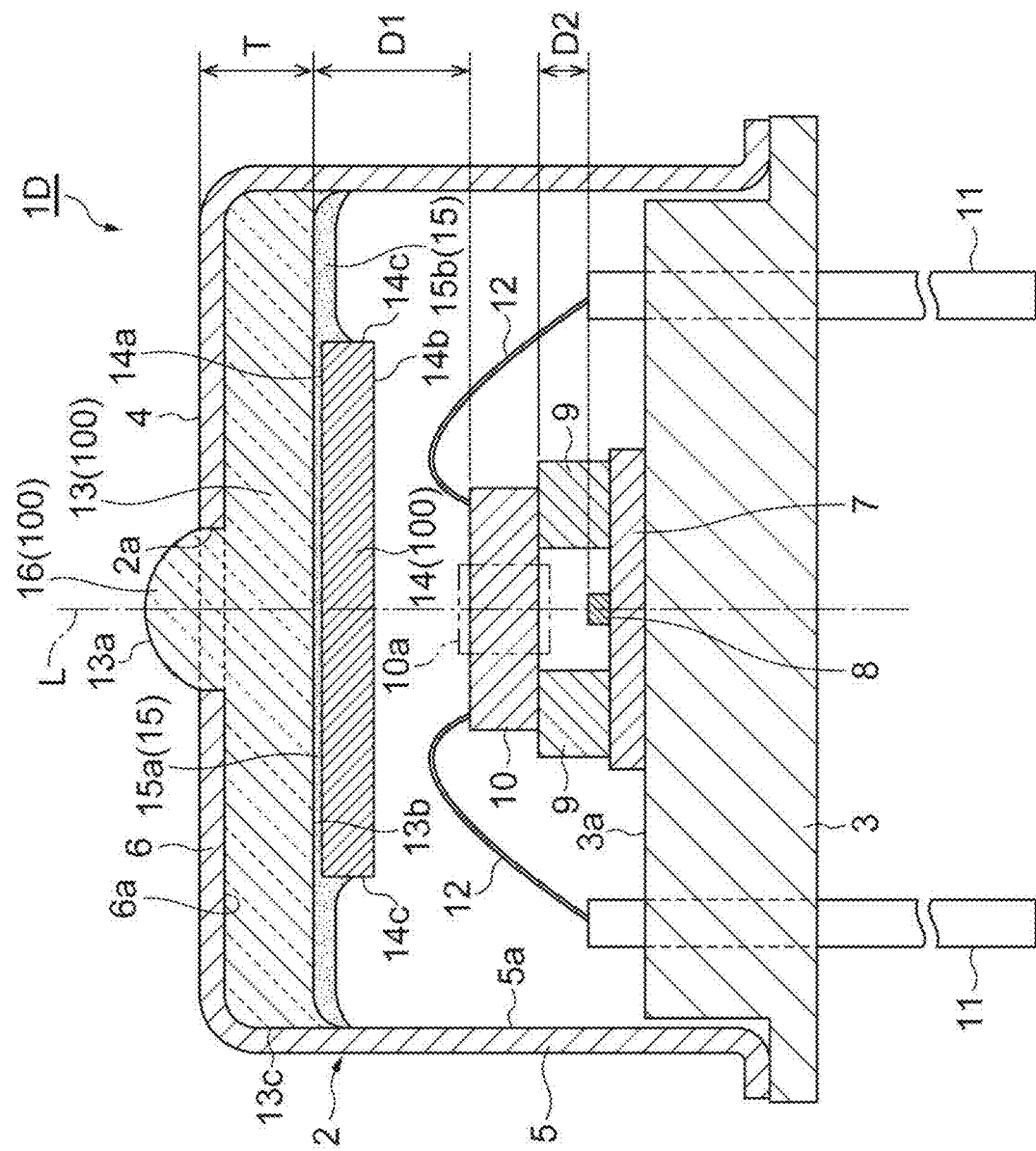
FIG. 16 is a cross-sectional view of a light detection device of a fourth embodiment.

As illustrated in FIG. 16, a light detection device 1D is different from the light detection device 1C described above in the configuration of a bonding member 15 for securing a band pass filter 14 to a light emitting surface 13b of a light transmitting member 13. In the light detection device 1D, the band pass filter 14 is secured to the light emitting surface 13b of the light transmitting member 13 by the bonding member 15. That is, the bonding member 15 secures the band pass filter 14 on an inner surface 6a of a top wall 6 via the light transmitting member 13 joined to the inner surface 6a of the top wall 6.

The band pass filter 14 has a rectangular plate shape. More specifically, the band pass filter 14 has a light incident surface 14a and a light emitting surface 14b facing each other in a direction parallel to line L and four side surfaces 14c. The band pass filter 14 of a rectangular plate shape is a dielectric multilayer film formed on the surface of a light transmitting member made of, for example, silicon, glass, or the like.

The bonding member 15 is made of, for example, a light transmitting material (such as light transmitting resin). The bonding member 15 includes a first portion 15a and a second portion 15b. The first portion 15a is arranged over the entire region of the light incident surface 14a of the band pass filter 14. That is, the first portion 15a in the bonding member 15 is arranged between the light emitting surface 13b of the light transmitting member 13 and the light incident surface 14a of the band pass filter 14 facing each other. A second portion 15b protrudes outward from the perimeter of the band pass filter 14 when viewed from a direction parallel to line L. The second portion 15b is in contact with the inner surface 5a of the side wall 5 and the side surfaces 14c of the band pass filter 14.

Figure 17:
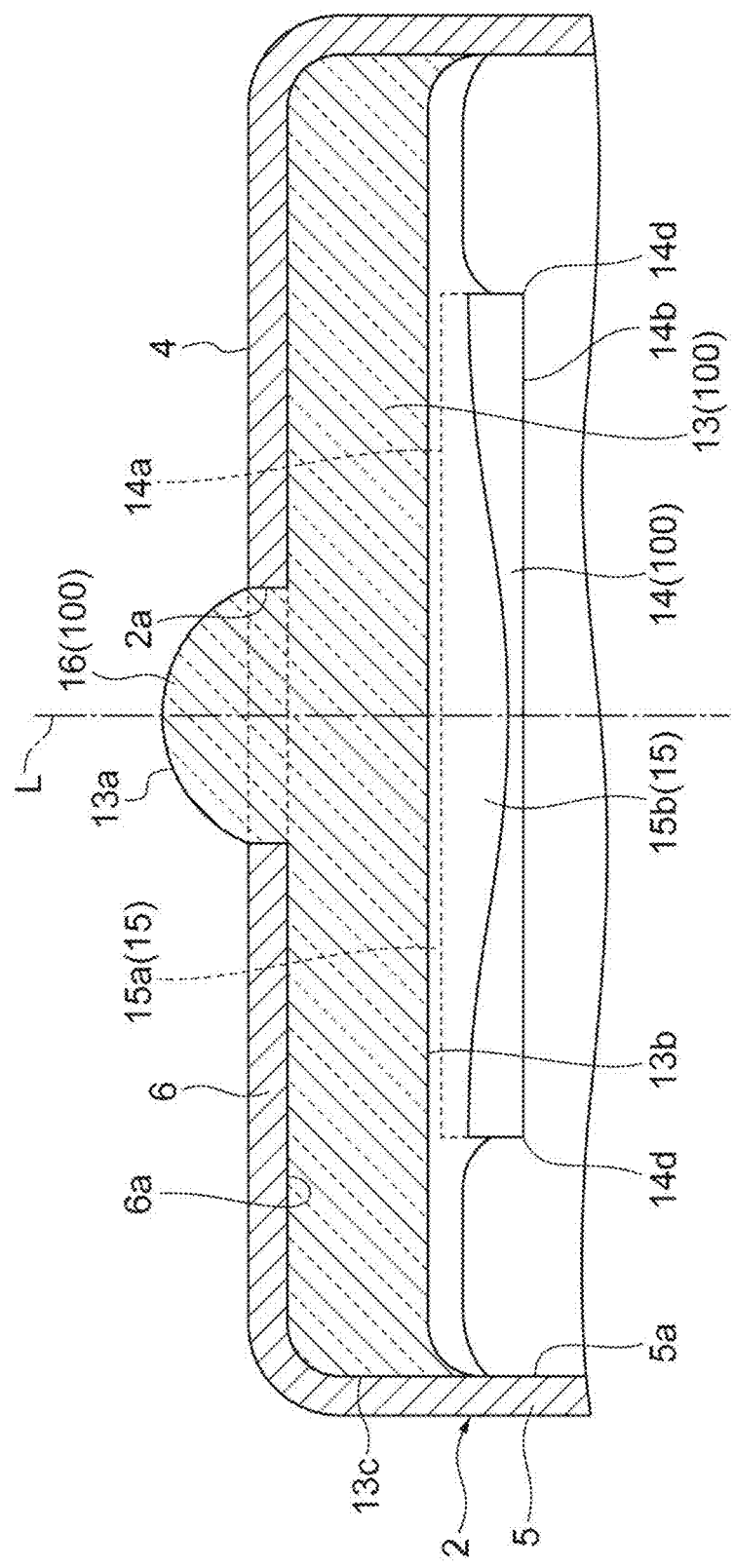
FIG. 17 is a cross-sectional view of a part of the light detection device illustrated in FIG. 16.

As illustrated in FIG. 17, the thickness of the second portion 15b in a direction parallel to line L is the maximum at a part in contact with the central part of each of the side surfaces 14c and is the minimum at a part in contact with each of the corners 14d of the band pass filter 14 (corners formed by adjacent side surfaces 14c). Note that, in FIG. 17, for convenience of explanation, only the package 2 and the light transmitting member 13 are illustrated in cross section.

Figure 18:
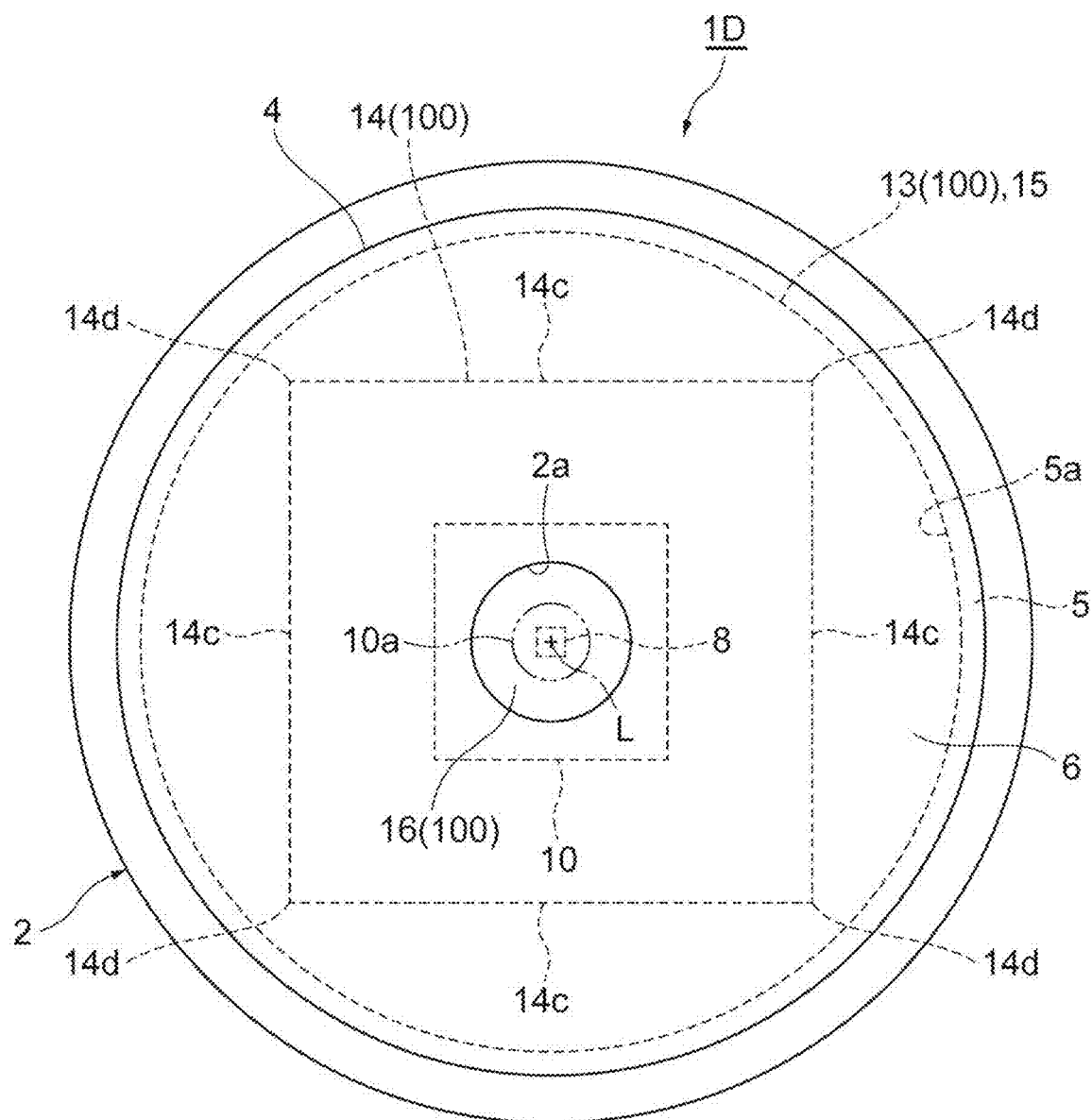
FIG. 18 is a plan view of the light detection device illustrated in FIG. 16.

In the light detection device 1D, the thickness T of the light transmitting member 13 has a value larger than or equal to a value obtained by multiplying the distance D1 between a Fabry-Perot interference filter 10 and the light transmitting member 13 by 0.3 (more preferably, a value greater than or equal to a value obtained by multiplying 1.0). Moreover, the thickness T of the light transmitting member 13 has a value larger than or equal to a value obtained by multiplying the distance D2 between the Fabry-Perot interference filter 10 and a light detector 8 by 1.0 (more preferably, a value greater than or equal to a value obtained by multiplying 1.5). The thickness T of the light transmitting member 13 is more than or equal to twice the thickness of the top wall 6 (more preferably, more than or equal to three times the thickness of the top wall 6). In addition, the distance from the surface (outer surface) of the top wall 6 on the light incident side to the light emitting surface 14b of the band pass filter 14 is greater than the distance from the light emitting surface 14b of the band pass filter 14 to the surface of the Fabry-Perot interference filter 10 on the light transmitting member 13 side. The perimeter of the Fabry-Perot interference filter 10 is positioned outside the perimeter of the opening 2a when viewed from a direction parallel to line L as illustrated in FIG. 18. The perimeter of the light transmitting unit 100 (the perimeter of the light transmitting member 13 and the perimeter of the band pass filter 14 in the light detection device 1D) is positioned outside the perimeter of the Fabry-Perot interference filter 10 when viewed from a direction parallel to line L.

Also in the light detection device 1D configured as described above, the light transmitting unit 100 provided in the package 2 so as to close the opening 2a is integrally configured including the band pass filter 14 and the lens unit 16, and thus highly sensitive and highly accuracy detection can be performed like in the light detection device 1A described above.

Moreover, in the light detection device 1D, the lens unit 16 is formed on the light incident surface 13a side of the light transmitting member 13 as a part of the light transmitting member 13. As a result, the lens unit 16 can be formed with high positional accuracy with respect to the light transmitting member 13.

Furthermore, in the light detection device 1D, the band pass filter 14 obtained by forming the dielectric multilayer film on the surface of the light transmitting member is prepared, and then the band pass filter 14 can be attached to the light emitting surface 13b of the light transmitting member 13. Therefore, the dielectric multilayer film can be accurately and easily formed in the band pass filter 14. Particularly in a case where the light transmitting member of the band pass filter 14 is made of silicon, the light transmitting member itself functions as a high-pass filter for transmitting light having a wavelength higher than or equal to 1200 nm, for example. Therefore, the dielectric multilayer film can be thinned down in the band pass filter 14.

In the light detection device 1D, the side wall 5 of the package 2 has a cylindrical shape, whereas the band pass filter 14 has a rectangular plate shape. As a result, the distance between each of the corners 14d of the band pass filter 14 and the inner surface 5a of the side wall 5 becomes smaller than the distance between each of the side surfaces 14c of the band pass filter 14 and the inner surface 5a of the side wall 5. Therefore, the band pass filter 14 fixed on the inner surface 6a of the top wall 6 of the package 2 is positioned by each of the corners 14d thereof with a high accuracy. Moreover, the area of the light incident surface 14a of the band pass filter 14 thermally connected to the inner surface 6a of the top wall 6 of the package 2 becomes smaller, for example as compared to the case where the band pass filter 14 has a circular plate shape, and thus the band pass filter 14 becomes less likely to be thermally affected by the package 2. Furthermore, even if air bubbles are generated in the bonding member 15 at the time of manufacturing, the air bubbles easily escape from between the side surfaces 14c of the band pass filter 14 and the inner surface 5a of the side wall 5, and thus as a result, scattering, diffraction, and the like of light at the bonding member 15 are suppressed. As described above, according to the light detection device 1D, the band pass filter 14 is allowed to function properly.

For example in a case where the band pass filter 14 has a circular plate shape, if the diameter of the band pass filter 14 is increased such that the distance between a side surface 14c of the band pass filter 14 and the inner surface 5a of a side wall 5 becomes smaller in order to implement high-precision positioning of the band pass filter 14, the following problem occurs. That is, since the area of the light incident surface 14a of the band pass filter 14 thermally connected to the inner surface 6a of the top wall 6 of the package 2 is increased, the band pass filter 14 is becomes more likely to be thermally affected (deformation or other disadvantages due to heat) by the package 2. Furthermore, the air bubbles cannot easily escape when air bubbles are generated in the bonding member 15 at the time of manufacturing, which may result in scattering, diffraction, and the like of light at the bonding member 15.

Note that when a region of the light emitting surface 13b of the light transmitting member 13 facing the opening 2a is curved in a concave manner toward the opening 2a, a region of the light incident surface 14a of the band pass filter 14 on which light is incident is avoided from being physically in contact with the light emitting surface 13b of the light transmitting member 13, thereby suppressing occurrence of a damaged in the region.

Here, the importance of allowing the band pass filter 14 to appropriately function in the light detection device 1D including the Fabry-Perot interference filter 10 will be described. In the Fabry-Perot interference filter 10, in general, a wavelength $\lambda$ that satisfies $\lambda=2nd/a$ (n: refractive index, d: distance between the first mirror 35 and the second mirror 36, a: integer) is the peak wavelength of light transmitted by the light transmission region 10a. Even with the same distance d, when a value of the integer a is increased (brought to a higher order side), a peak wavelength corresponding thereto appears on a shorter wavelength side. Therefore, in the light detection device 1D, the band pass filter 14 that cuts off light (especially light on the short wavelength side) outside a predetermined wavelength range is required in addition to the Fabry-Perot interference filter 10.

For example, in a light detection device for obtaining an optical spectrum of second-order light (a=2), it is necessary to cut off multi-order light of an order higher than or equal to three appearing particularly on the shorter wavelength side. Furthermore, a case is assumed where an InGaAs PIN photodiode (single element photodiode) is used in the light detector 8 and reasonable white light (such as a halogen lamp) is used as the light source. Therefore, it is necessary to arrange the band pass filter at a position on the optical axis of the light source or the light detector 8. The light detection device including the band pass filter and a light detection device not including the band pass filter has been compared, and it was confirmed that in the light detection device including the band pass filter, high order light on the shorter wavelength side has been cut off.

As described above, since the light detection device 1D includes the band pass filter 14, it is possible to provide the light detection device 1D as a general product with perfection which does not require customization of the Fabry-Perot interference filter 10. Furthermore, since a single element photodiode can be used as the light detector 8, the manufacturing cost of the light detection device 1D can be reduced.

Next, advantages of the cylindrical shape of the side wall 5 of the package 2 will be described. First, since the side wall 5 of the package 2 has a cylindrical shape in the light detection device 1D, durability of the light detection device 1D is improved. More specifically, since the side wall 5 of the package 2 has a cylindrical shape, stability of the shape of the package 2 is higher than, for example, a case where the side wall 5 of the package 2 has a polygonal cylindrical shape.

Moreover, since the side wall 5 of the package 2 has a cylindrical shape in the light detection device 1D, stress is unlikely to be concentrated as compared with, for example, a case where the package 2 has a polygonal cylindrical shape. This is because the stress due to an impact is not concentrated on one point but is dispersed in the case where the side wall 5 of the package 2 has a cylindrical shape contrary to the case where the package 2 has a polygonal cylindrical shape and the stress due to an impact applied to the package 2 is likely to be concentrated at the corners. In particular, the Fabry-Perot interference filter 10 accommodated in the package 2 is vulnerable to a physical impact. Therefore, with the shape of the side wall 5 of the package 2 being cylindrical, the Fabry-Perot interference filter 10 is suitably protected from an external physical impact.

There are cases where a thermal stress is generated in the package 2 depending on the thermal history at the time of manufacturing the light detection device 1D (such as thermal curing of the bonding member 15, connecting wires 12, and sealing by a stem 3), a temperature change after manufacturing of the light detection device 1D, or other reasons. The thermal stress is generated by a difference in coefficient of linear thermal expansion among the members included in the light detection device 1D. It is desirable to avoid this thermal stress from being concentrated and accumulated in a specific location or in a specific direction in the light detection device 1D. This is because if the thermal stress is concentrated in a specific location or in a specific direction, this leads to characteristic abnormality or breakage of the light detection device 1D. In the light detection device 1D, since the side wall 5 of the package 2 has a cylindrical shape, the generated thermal stress is dispersed without being concentrated at one point. As a result, occurrence of characteristic abnormality in the light detection device 1D or breakage of the light detection device 1D can be suppressed.

In the light detection device 1D, the band pass filter 14 is secured to the light emitting surface 13b of the light transmitting member 13 by the bonding member 15, and the bonding member 15 is arranged over the entire region of the light incident surface 14a of the band pass filter 14 facing the light emitting surface 13b of the light transmitting member 13. As a result, the band pass filter 14 is firmly secured to the inner surface 6a of the top wall 6. Moreover, even if air bubbles are generated in the bonding member 15 at the time of manufacturing, the air bubbles easily escape from between the side surfaces 14c of the band pass filter 14 and the inner surface 5a of the side wall 5, scattering, diffraction, and the like of light at the bonding member 15 are suppressed. In addition, since the light transmitting member 13 arranged on the inner surface 6a of the top wall 6 is provided so as to close the opening 2a, the airtightness of the package 2 is improved. Since the band pass filter 14 is secured to the light emitting surface 13b of the light transmitting member 13, the band pass filter 14 becomes less likely to be thermally affected by the package 2. This also suppresses occurrence of a damage such as a scratch in the band pass filter 14 due to physical interference from the opening 2a.

Furthermore, the corners 14d of the band pass filter 14 and the inner surface 5a of the side wall 5 are not in contact with each other but are separated from each other in the light detection device 1D. This can suppress breakage of the band pass filter 14 (in particular, the corners 14d) due to a contact between the corners 14d and the inner surface 5a of the side wall 5. In addition, the band pass filter 14 becomes less likely to be thermally affected by the package 2. Furthermore, the corners 14d of the band pass filter 14 are separated from an R portion of the package 2 (R portion formed by the light emitting surface 13b of the light transmitting member 13 and the inner surface 5a of the side wall 5), and the band pass filter 14 is firmly secured to the flat light emitting surface 13b of the light transmitting member 13.

Moreover, in the light detection device 1D, the bonding member 15 protrudes outward from the perimeter of the band pass filter 14 when viewed from a direction parallel to line L, and a part of the bonding member 15 protruding outward from the perimeter of the band pass filter 14 is in contact with side surfaces 14c of the band pass filter 14. As a result, the band pass filter 14 is more firmly secured.

In the light detection device 1D, the thickness of the second portion 15b of the bonding member 15 in the direction parallel to line L is the maximum at a part in contact with the central part of each of the side surfaces 14c and is the minimum at a part in contact with each of the corners 14d of the band pass filter 14. As a result, for example at the time of curing the bonding member 15, it is possible to suppress occurrence of a crack in the bonding member 15 at parts corresponding to the corners 14d of the band pass filter 14.

However, in a case where the thickness of the second portion 15b in the direction parallel to line L is gradually reduced at each of the corners 14d than at the central part of each of the side surfaces 14c for example due to a convex curved surface of the second portion 15b, the thickness of the second portion 15b may not be the minimum at a part in contact with each of the corners 14d. Occurrence of a crack in a portion of the bonding member 15 corresponding to the corners 14d of the band pass filter 14 is suppressed unless the thickness of the second portion 15b is maximized at the portions thereof being in contact with the corners 14d.

Furthermore, in the light detection device 1D, the opening 2a has a circular shape when viewed from a direction parallel to line L. As a result, the intensity profile of light incident on the package 2 is uniformized.

Moreover, in the light detection device 1D, the band pass filter 14 has a rectangular plate shape. This allows the band pass filter 14 to be manufactured by a wafer process, the manufacturing cost of the band pass filter 14 is reduced.

In the light detection device 1D, the package 2 is formed by a metal material. This improves the airtightness of the package 2 as compared with the package 2 formed of, for example, plastic. As a result, processing for countermeasures against humidity of each component accommodated inside the package 2 becomes unnecessary, and the manufacturing cost of the light detection device 1D is reduced. This also improves the strength of the package 2 as compared with a package 2 formed of, for example, plastic. As a result, the components housed inside the package 2 are protected from an external physical impact. Furthermore, electrical shielding by the package 2 is easily implemented. Note that in the case where the package 2 is formed of a metal material, the thermal conductivity of the package 2 is increased. However as described above, since the side wall 5 of the package 2 has a cylindrical shape while the band pass filter 14 has a rectangular plate shape, the band pass filter 14 is unlikely to be thermally affected by the package 2.

Moreover, in the light detection device 1D, the thickness T of the light transmitting member 13 is a value larger than or equal to a value obtained by multiplying the distance D1 between the Fabry-Perot interference filter 10 and the light transmitting member 13 by 0.3 (more preferably, a value greater than or equal to a value obtained by multiplying 1.0). As a result, since the heat capacity of the light transmitting member 13 is increased while the volume of the space in the package 2 is reduced, the temperature in the package 2 can be further uniformized. Furthermore, since the light transmitting member 13 moves relatively closer to the Fabry-Perot interference filter 10, it is possible to suppress light not transmitted by the light transmission region 10a of the Fabry-Perot interference filter 10 from entering the light detector 8 as stray light.

Moreover, in the light detection device 1D, the thickness T of the light transmitting member 13 has a value larger than or equal to a value obtained by multiplying the distance D2 between the Fabry-Perot interference filter 10 and the light detector 8 by 1.0 (more preferably, a value greater than or equal to a value obtained by multiplying 1.5). As a result, since the heat capacity of the light transmitting member 13 is increased while the volume of the space in the package 2 is reduced, the temperature in the package 2 can be further uniformized. The thickness T of the light transmitting member 13 is more than or equal to twice the thickness of the top wall 6 (more preferably, more than or equal to three times the thickness of the top wall 6). In addition, the distance from the surface (outer surface) of the top wall 6 on the light incident side to the light emitting surface 14b of the band pass filter 14 is greater than the distance from the light emitting surface 14b of the band pass filter 14 to the surface of the Fabry-Perot interference filter 10 on the light transmitting member 13 side. As a result, since the heat capacity of the light transmitting member 13 is increased while the volume of the space in the package 2 is reduced, the temperature in the package 2 can be further uniformized. Furthermore, since the light transmitting member 13 moves relatively closer to the Fabry-Perot interference filter 10, it is possible to suppress light not transmitted by the light transmission region 10a of the Fabry-Perot interference filter 10 from entering the light detector 8 as stray light.

Figure 19:
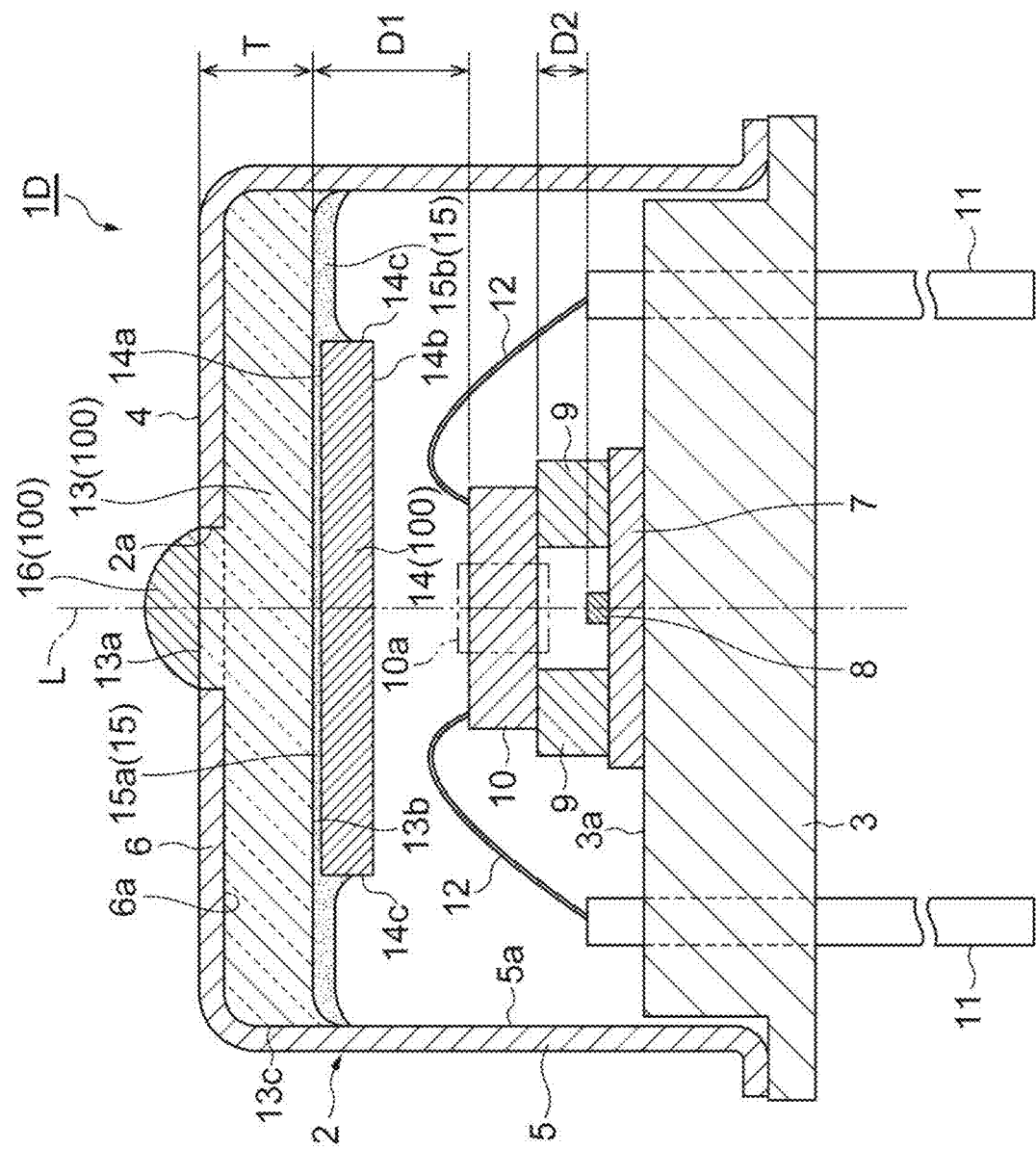
FIG. 19 is a cross-sectional view of a modification of the light detection device illustrated in FIG. 16.

Note that the lens unit 16 may be provided on the light incident surface 13a of the light transmitting member 13 by, for example, bonding or resin potting as illustrated in FIG. 19. According to this light detection device 1D, the thickness of the light transmitting member 13 can be increased such that the distance between the band pass filter 14 and the Fabry-Perot interference filter 10 is reduced. In this case, since the heat capacity of the light transmitting member 13 is increased while the volume of the space in the package 2 is reduced, the temperature in the package 2 can be further uniformized.

Figure 20:
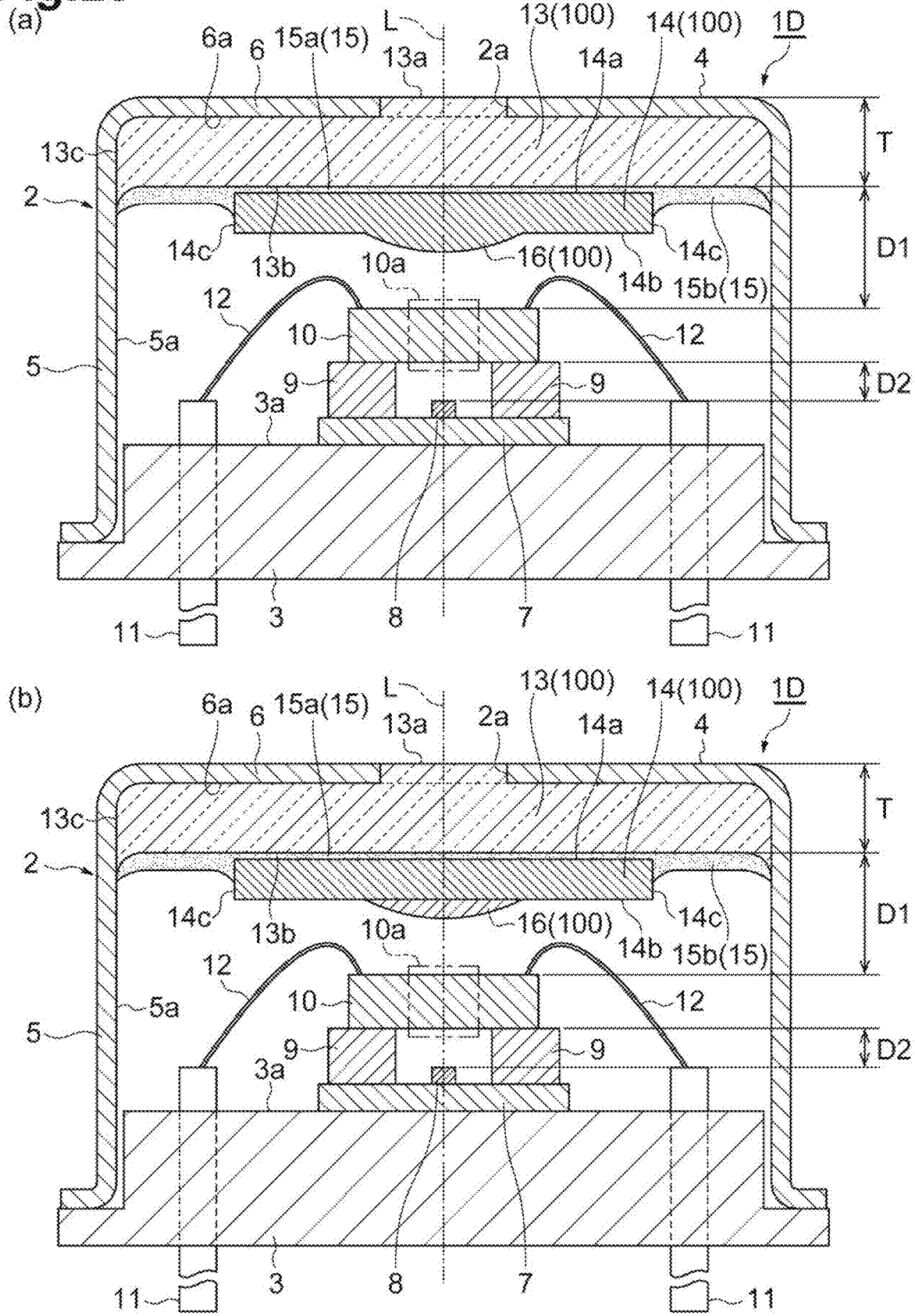
FIG. 20 is a set of cross-sectional views of modifications of the light detection device illustrated in FIG. 16.

Furthermore, as illustrated in (a) of FIG. 20, the lens unit 16 may be formed on the light emitting surface 14b side of the band pass filter 14 as a part of the band pass filter 14. In this light detection device 1D, the lens unit 16 is a convex lens having a light emitting surface that is convex toward the light emitting side (the side opposite to the light transmitting member 13). In a case where the dielectric multilayer film of the band pass filter 14 is formed on the light incident surface 14a side of the band pass filter 14, the incident angle of light incident on the dielectric multilayer film is not affected by the lens unit 16. Therefore, the band pass filter 14 is allowed to function more properly. In a case where the dielectric multilayer film of the band pass filter 14 is formed on the light emitting surface 14b side of the band pass filter 14 so as to cover the light emitting surface of the lens unit 16, light is incident on the dielectric multilayer film along the thickness direction of the dielectric multilayer film, the band pass filter 14 is allowed to function properly. In addition, the band pass filter 14 provided with the lens unit 16 can be manufactured accurately and easily by a wafer process. Furthermore, it is possible to prevent occurrence of a damage such as a scratch in the lens unit 16 due to external physical interference.

In addition, as illustrated in (b) of FIG. 20, the lens unit 16 may be provided on a light emitting surface 14b of the band pass filter 14 (surface facing the light incident surface 14a of the band pass filter 14) for example by bonding or resin potting. In this light detection device 1D, the lens unit 16 is a convex lens having a light emitting surface that is convex toward the light emitting side (the side opposite to the light transmitting member 13). According to this light detection device 1D, since the incident angle of light incident on the band pass filter 14 is not affected by the lens unit 16, the band pass filter 14 is allowed to function more appropriately. Furthermore, it is possible to prevent occurrence of a damage such as a scratch in the lens unit 16 due to external physical interference. Note that in this case the lens unit 16 has no influence when the dielectric multilayer film is formed in the band pass filter 14, and thus it is advantageous for forming the dielectric multilayer film accurately and easily.

Figure 21:
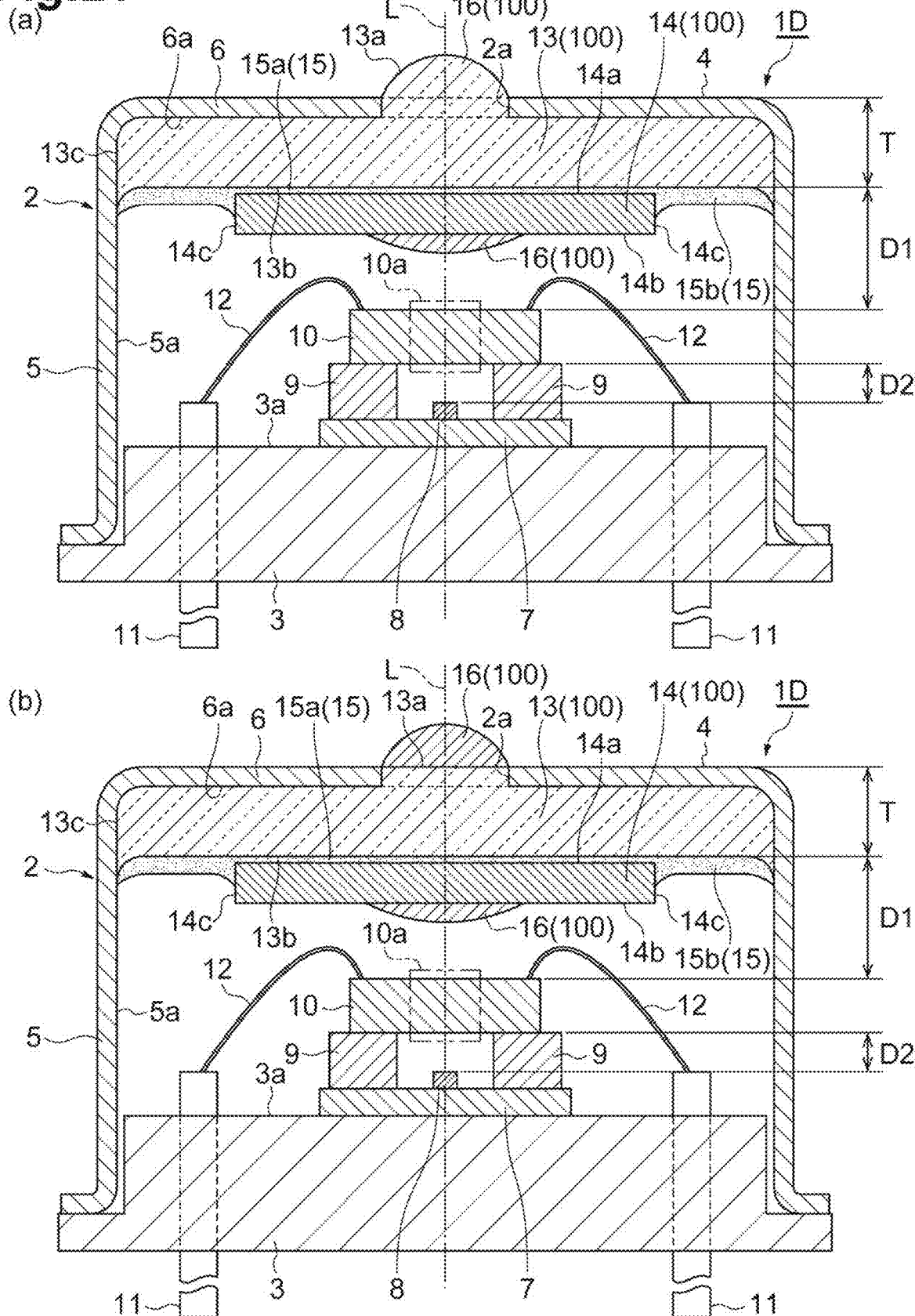
FIG. 21 is a set of cross-sectional views of modifications of the light detection device illustrated in FIG. 16.

Alternatively, a pair of lens units 16 may be provided as illustrated in (a) of FIG. 21. In this light detection device 1D, one of the lens units 16 is formed on the light incident surface 13a side of the light transmitting member 13 as a part of the light transmitting member 13. The other lens unit 16 is provided on the light emitting surface 14b of the band pass filter 14 by, for example, bonding or resin potting. According to this light detection device 1D, the light incident on the Fabry-Perot interference filter 10 can be condensed more reliably while the heights of the respective lens units 16 are kept low, thereby further increasing the ratio of light incident on the light transmission region 10a of the Fabry-Perot interference filter 10 in the light entering the package 2.

Further alternatively, a pair of lens units 16 may be provided as illustrated in (b) of FIG. 21. In this light detection device 1D, one of the lens units 16 is provided on the light incident surface 13a of the light transmitting member 13 by, for example, bonding or resin potting. The other lens unit 16 is provided on the light emitting surface 14b of the band pass filter 14 by, for example, bonding or resin potting. According to this light detection device 1D, the light incident on the Fabry-Perot interference filter 10 can be condensed more reliably while the heights of the respective lens units 16 are kept low, thereby further increasing the ratio of light incident on the light transmission region 10a of the Fabry-Perot interference filter 10 in the light entering the package 2.

Note that, in the light detection device 1D illustrated in (b) of FIG. 21, the one lens unit 16 may be formed on the light incident surface 13a side of the light transmitting member 13 as a part of the light transmitting member 13. Alternatively, in the light detection device 1D illustrated in (b) of FIG. 21, the other lens unit 16 may be formed on the light emitting surface 14b side of the band pass filter 14 as a part of the band pass filter 14.

Fifth Embodiment

Figure 22:
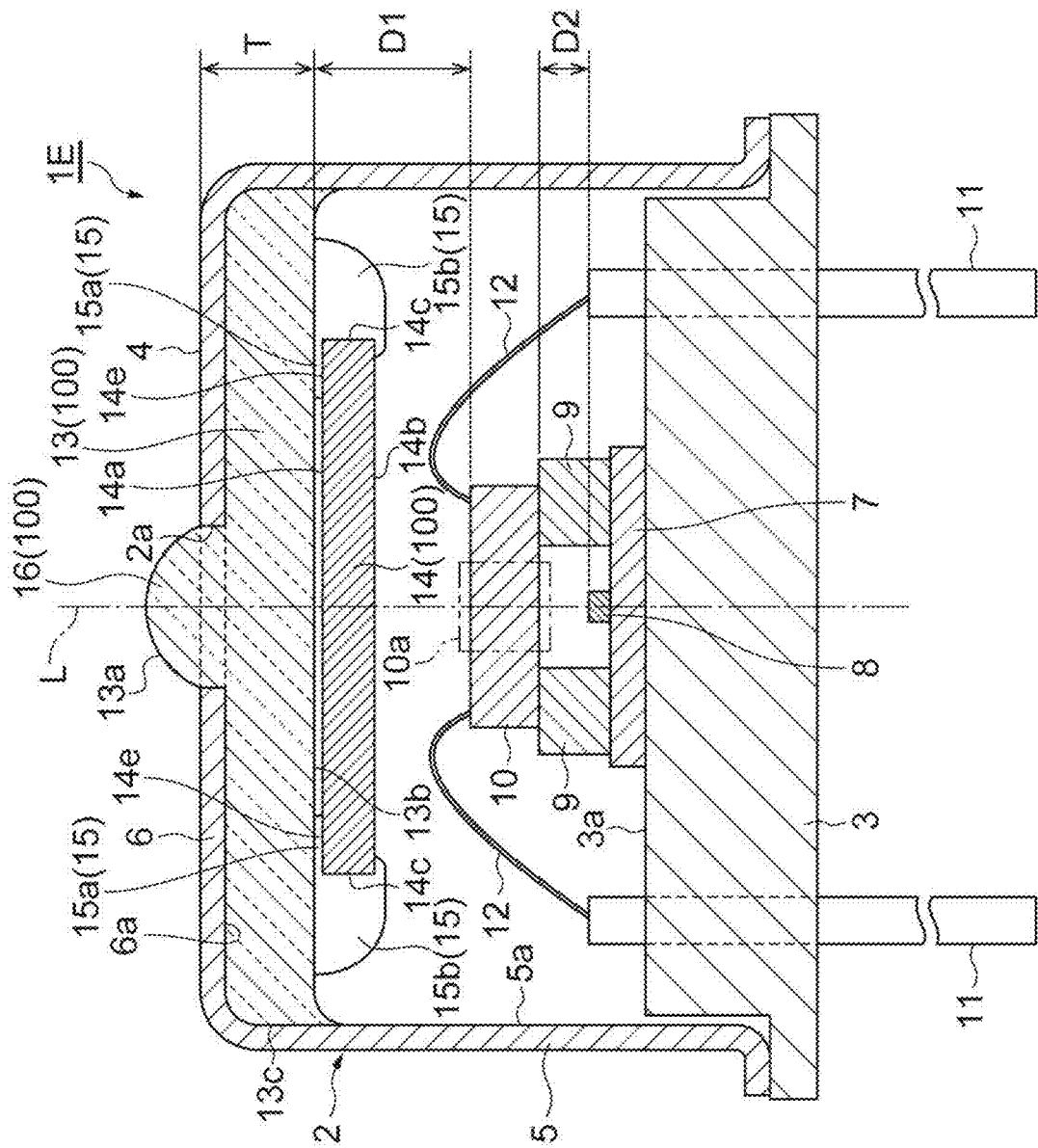
FIG. 22 is a cross-sectional view of a light detection device of a fifth embodiment.
Figure 23:
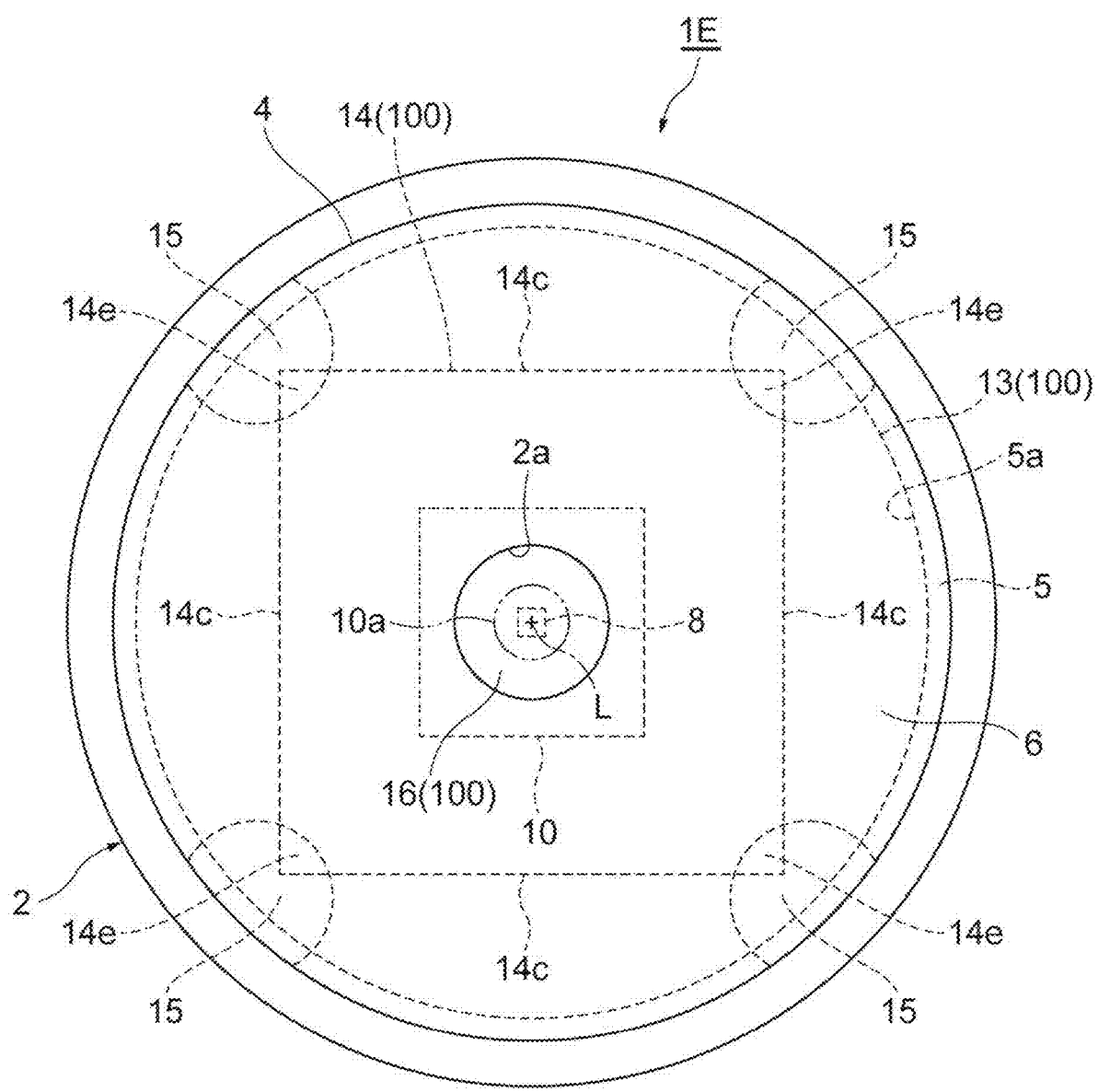
FIG. 23 is a plan view of the light detection device illustrated in FIG. 22.

As illustrated in FIGS. 22 and 23, a light detection device 1E is different from the light detection device 1D described above in the point that bonding members 15 are arranged so as to correspond to the corners (corners formed by adjacent side surfaces 14c) of a band pass filter 14. In the light detection device 1E, a bonding member 15 is provided at each of the corners of the band pass filter 14. The multiple bonding members 15 are separated from each other. Note that also in the light detection device 1E, the bonding members 15 secure the band pass filter 14 on an inner surface 6a of a top wall 6 via a light transmitting member 13 joined to the inner surface 6a of the top wall 6 like in the light detection device 1D described above.

A first portion 15a of each of the bonding members 15 is arranged at a corner region 14e of a light incident surface 14a of the band pass filter 14 (a region of the light incident surface 14a including a corner portion formed by adjacent side surfaces 14c). That is, each of the first portions 15a is arranged between the light emitting surface 13b of the light transmitting member 13 and a corner region 14e of the band pass filter 14 facing each other.

Each of the second portions 15b of the bonding members 15 protrudes outward from the perimeter of the band pass filter 14 at each of the corners of the band pass filter 14. Each of the second portions 15b is in contact with an inner surface 5a of a side wall 5 and side surfaces 14c of the band pass filter 14. Each of the second portions 15b also covers a region of the light emitting surface 14b of the band pass filter 14 that faces a corner region 14e. As a result, the band pass filter 14 is more firmly secured. Since the position of the corner regions 14e is the farthest from the opening 2a in the band pass filter 14, the second portions 15b covering the region facing the corner regions 14e are suppressed from covering the region of the light emitting surface 14b facing the light transmission region 10a.

As described above, in the light detection device 1E, the bonding members 15 are not arranged at the region of the light incident surface 14a of the band pass filter 14 excluding the corner regions 14e but are arranged at the corner regions 14e. Note that the light emitting surface 13b of the light transmitting member 13 tends to be curved such that the area surrounding the area facing the opening 2a is raised more than the area facing the opening 2a. Therefore, the bonding members 15 arranged so as to correspond to the corners of the band pass filter 14 are suppressed from entering the region facing the opening 2a. Moreover, a region of the light incident surface 14a of the band pass filter 14 on which light is incident is avoided from being physically in contact with the light emitting surface 13b of the light transmitting member 13, thereby suppressing occurrence of a damaged in the region.

Also in the light detection device 1E configured as described above, the light transmitting unit 100 provided in the package 2 so as to close the opening 2a is integrally configured including the band pass filter 14 and the lens unit 16, and thus highly sensitive and highly accuracy detection can be performed like in the light detection device 1A described above.

Moreover, in the light detection device 1E, the lens unit 16 is formed on the light incident surface 13a side of the light transmitting member 13 as a part of the light transmitting member 13. As a result, the lens unit 16 can be formed with high positional accuracy with respect to the light transmitting member 13.

Furthermore, in the light detection device 1E, the band pass filter 14 obtained by forming the dielectric multilayer film on the surface of the light transmitting member is prepared, and then the band pass filter 14 can be attached to the light emitting surface 13b of the light transmitting member 13. Therefore, the dielectric multilayer film can be accurately and easily formed in the band pass filter 14. Particularly in a case where the light transmitting member of the band pass filter 14 is made of silicon, the light transmitting member itself functions as a high-pass filter for transmitting light having a wavelength higher than or equal to 1200 nm, for example. Therefore, the dielectric multilayer film can be thinned down in the band pass filter 14.

According to the light detection device 1E, the band pass filter 14 can be caused to function properly like the light detection device 1D described above. Moreover, light detecting characteristics are improved in the light detection device 1E like in the light detection device 1D described above.

In the light detection device 1E, the bonding members 15 are not arranged in the region of the light incident surface 14a of the band pass filter 14 facing the light emitting surface 13b of the light transmitting member 13 excluding the corner regions 14e but are arranged in the corner regions 14e. As a result, scattering and diffraction of light at the bonding member 15 are more reliably suppressed. The amount of the bonding member 15 used is reduced, and the amount of outgas generated in the package 2 is reduced. As a result, changes in characteristics or deterioration becomes less likely to occur in the Fabry-Perot interference filter 10 and the light detector 8.

Figure 24:
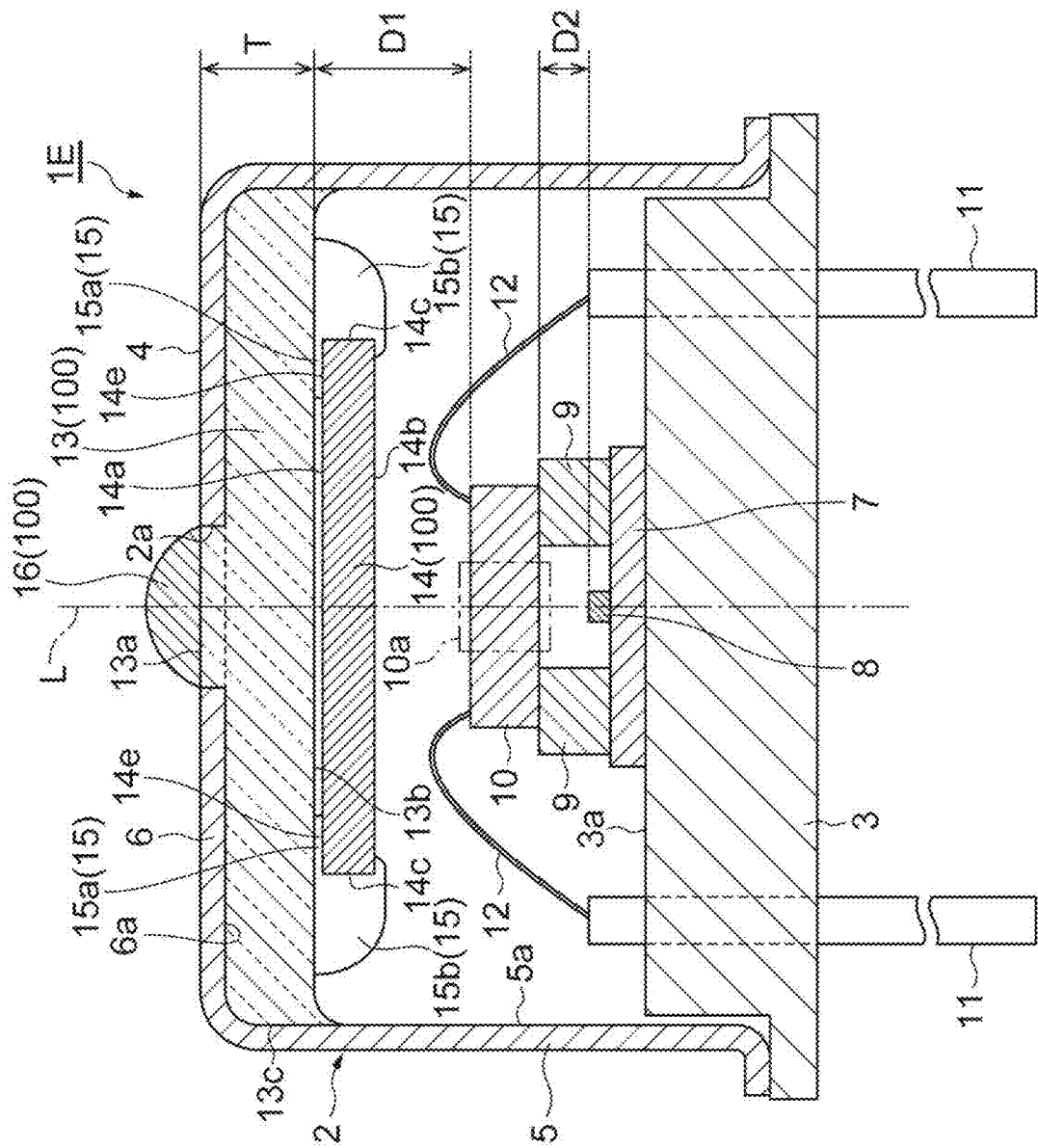
FIG. 24 is a cross-sectional view of a modification of the light detection device illustrated in FIG. 22.

Note that the lens unit 16 may be provided on the light incident surface 13a of the light transmitting member 13 by, for example, bonding or resin potting as illustrated in FIG. 24. According to this light detection device 1E, the thickness of the light transmitting member 13 can be increased such that the distance between the band pass filter 14 and the Fabry-Perot interference filter 10 is reduced. In this case, since the heat capacity of the light transmitting member 13 is increased while the volume of the space in the package 2 is reduced, the temperature in the package 2 can be further uniformized.

Figure 25:
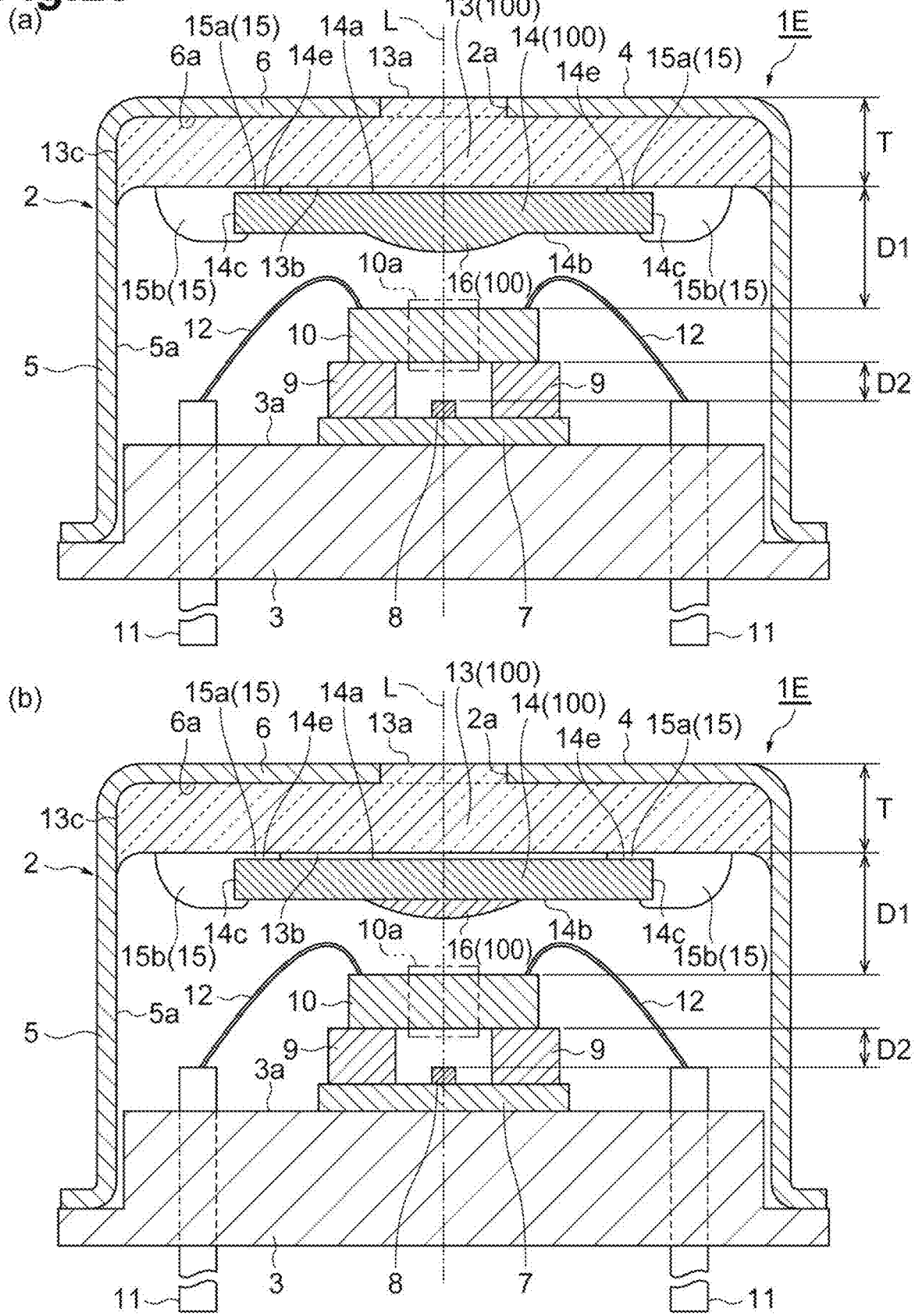
FIG. 25 is a set of cross-sectional views of modifications of the light detection device illustrated in FIG. 22.

Furthermore, as illustrated in (a) of FIG. 25, the lens unit 16 may be formed on the light emitting surface 14b side of the band pass filter 14 as a part of the band pass filter 14. In this light detection device 1E, the lens unit 16 is a convex lens having a light emitting surface that is convex toward the light emitting side (the side opposite to the light transmitting member 13). In a case where the dielectric multilayer film of the band pass filter 14 is formed on the light incident surface 14a side of the band pass filter 14, the incident angle of light incident on the dielectric multilayer film is not affected by the lens unit 16. Therefore, the band pass filter 14 is allowed to function more properly. In a case where the dielectric multilayer film of the band pass filter 14 is formed on the light emitting surface 14b side of the band pass filter 14 so as to cover the light emitting surface of the lens unit 16, light is incident on the dielectric multilayer film along the thickness direction of the dielectric multilayer film, the band pass filter 14 is allowed to function properly. In addition, the band pass filter 14 provided with the lens unit 16 can be manufactured accurately and easily by a wafer process. Furthermore, it is possible to prevent occurrence of a damage such as a scratch in the lens unit 16 due to external physical interference.

In addition, as illustrated in (b) of FIG. 25, the lens unit 16 may be provided on a light emitting surface 14b of the band pass filter 14 (surface facing the light incident surface 14a of the band pass filter 14) for example by bonding or resin potting. In this light detection device 1E, the lens unit 16 is a convex lens having a light emitting surface that is convex toward the light emitting side (the side opposite to the light transmitting member 13). According to this light detection device 1E, since the incident angle of light incident on the band pass filter 14 is not affected by the lens unit 16, the band pass filter 14 is allowed to function more appropriately. Furthermore, it is possible to prevent occurrence of a damage such as a scratch in the lens unit 16 due to external physical interference. Note that in this case the lens unit 16 has no influence when the dielectric multilayer film is formed in the band pass filter 14, and thus it is advantageous for forming the dielectric multilayer film accurately and easily.

Figure 26:
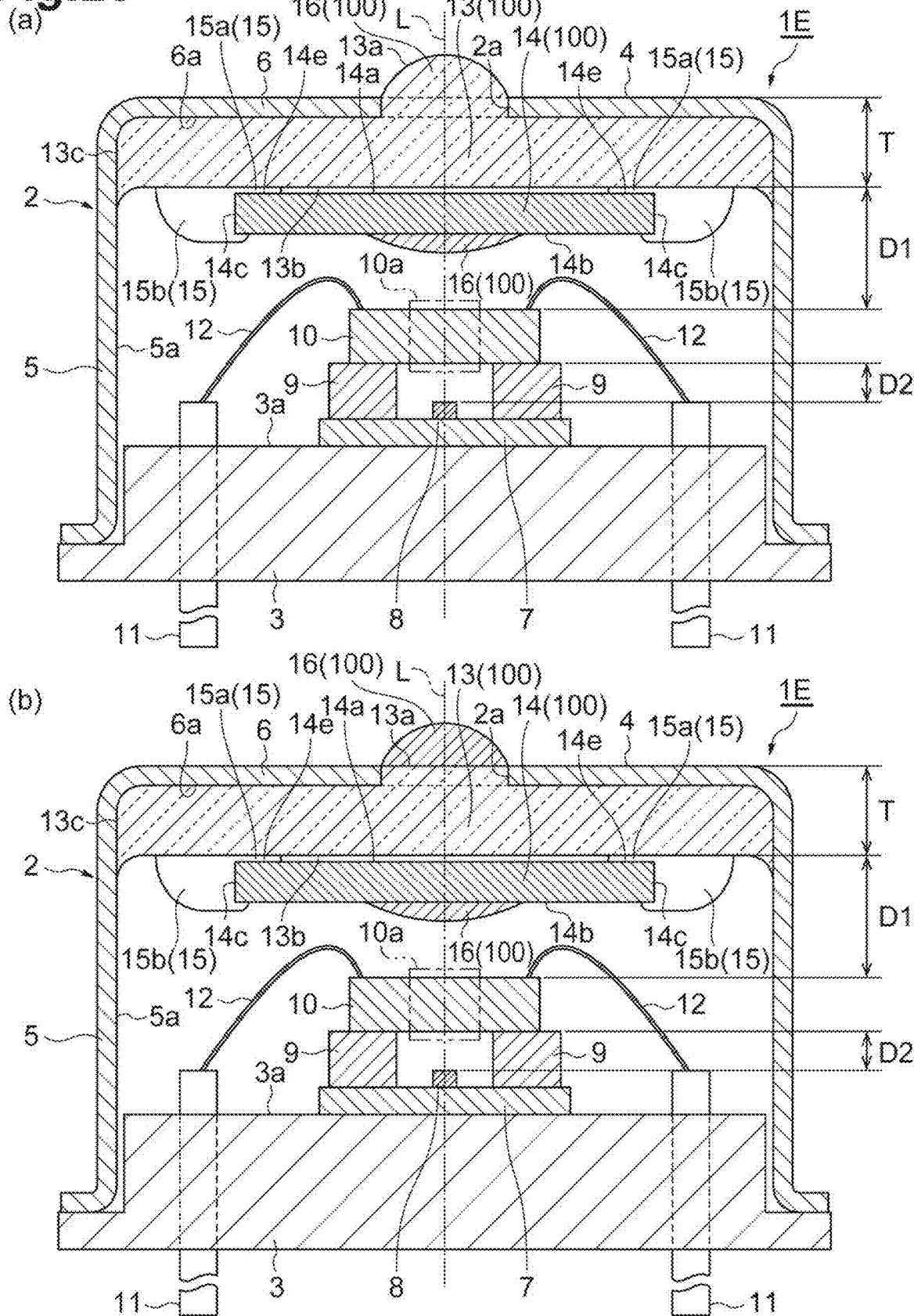
FIG. 26 is a set of cross-sectional views of modifications of the light detection device illustrated in FIG. 22.

Alternatively, a pair of lens units 16 may be provided as illustrated in (a) of FIG. 26. In this light detection device 1E, one of the lens units 16 is formed on the light incident surface 13a side of the light transmitting member 13 as a part of the light transmitting member 13. The other lens unit 16 is provided on the light emitting surface 14b of the band pass filter 14 by, for example, bonding or resin potting. According to this light detection device 1E, the light incident on the Fabry-Perot interference filter 10 can be condensed more reliably while the heights of the respective lens units 16 are kept low, thereby further increasing the ratio of light incident on the light transmission region 10a of the Fabry-Perot interference filter 10 in the light entering the package 2.

Further alternatively, a pair of lens units 16 may be provided as illustrated in (b) of FIG. 26. In this light detection device 1E, one of the lens units 16 is provided on the light incident surface 13a of the light transmitting member 13 by, for example, bonding or resin potting. The other lens unit 16 is provided on the light emitting surface 14b of the band pass filter 14 by, for example, bonding or resin potting. According to this light detection device 1E, the light incident on the Fabry-Perot interference filter 10 can be condensed more reliably while the heights of the respective lens units 16 are kept low, thereby further increasing the ratio of light incident on the light transmission region 10a of the Fabry-Perot interference filter 10 in the light entering the package 2.

Note that, in the light detection device 1E illustrated in (b) of FIG. 26, the one lens unit 16 may be formed on the light incident surface 13a side of the light transmitting member 13 as a part of the light transmitting member 13. Alternatively, in the light detection device 1E illustrated in (b) of FIG. 26, the other lens unit 16 may be formed on the light emitting surface 14b side of the band pass filter 14 as a part of the band pass filter 14.

Sixth Embodiment

Figure 27:
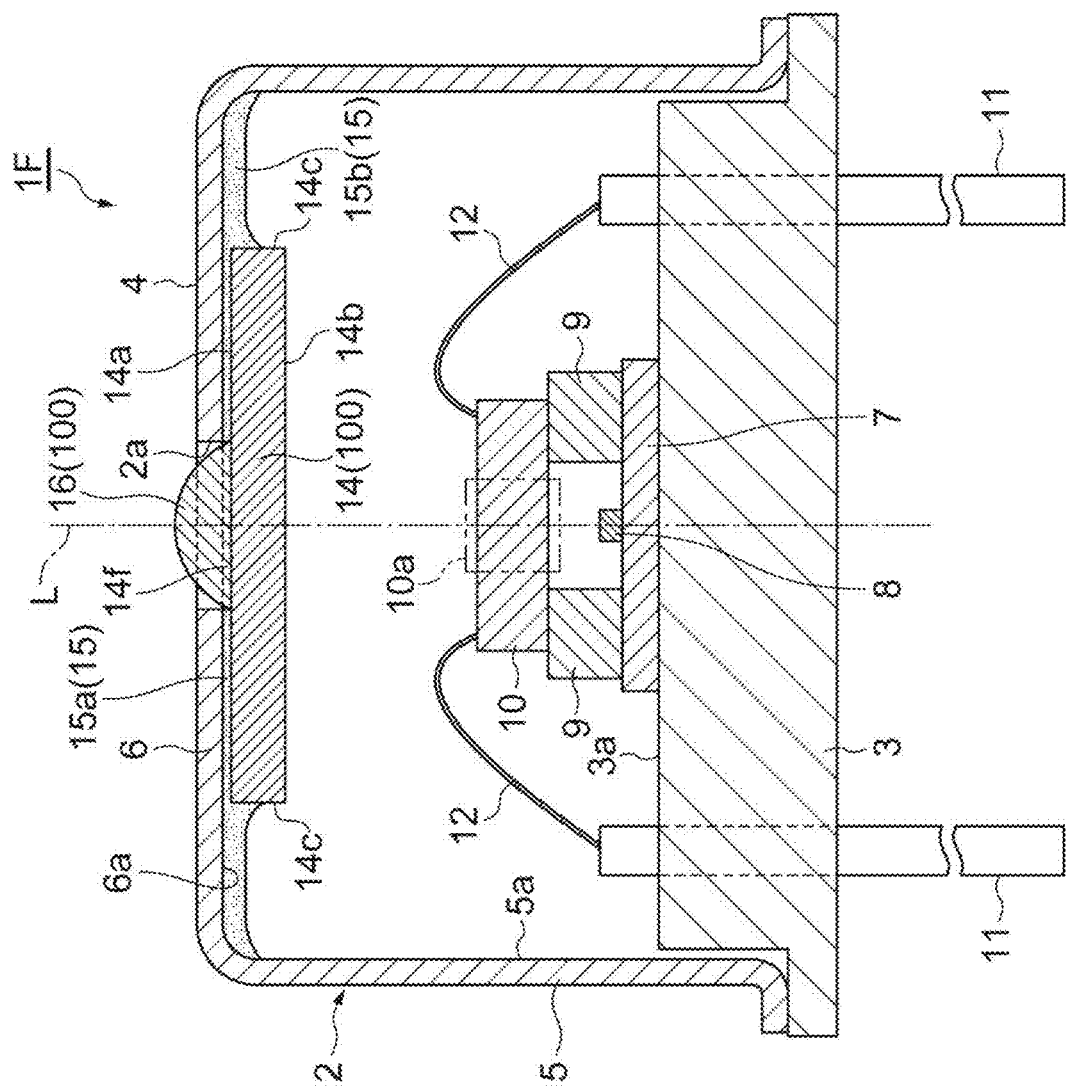
FIG. 27 is a cross-sectional view of a light detection device of a sixth embodiment.
Figure 28:
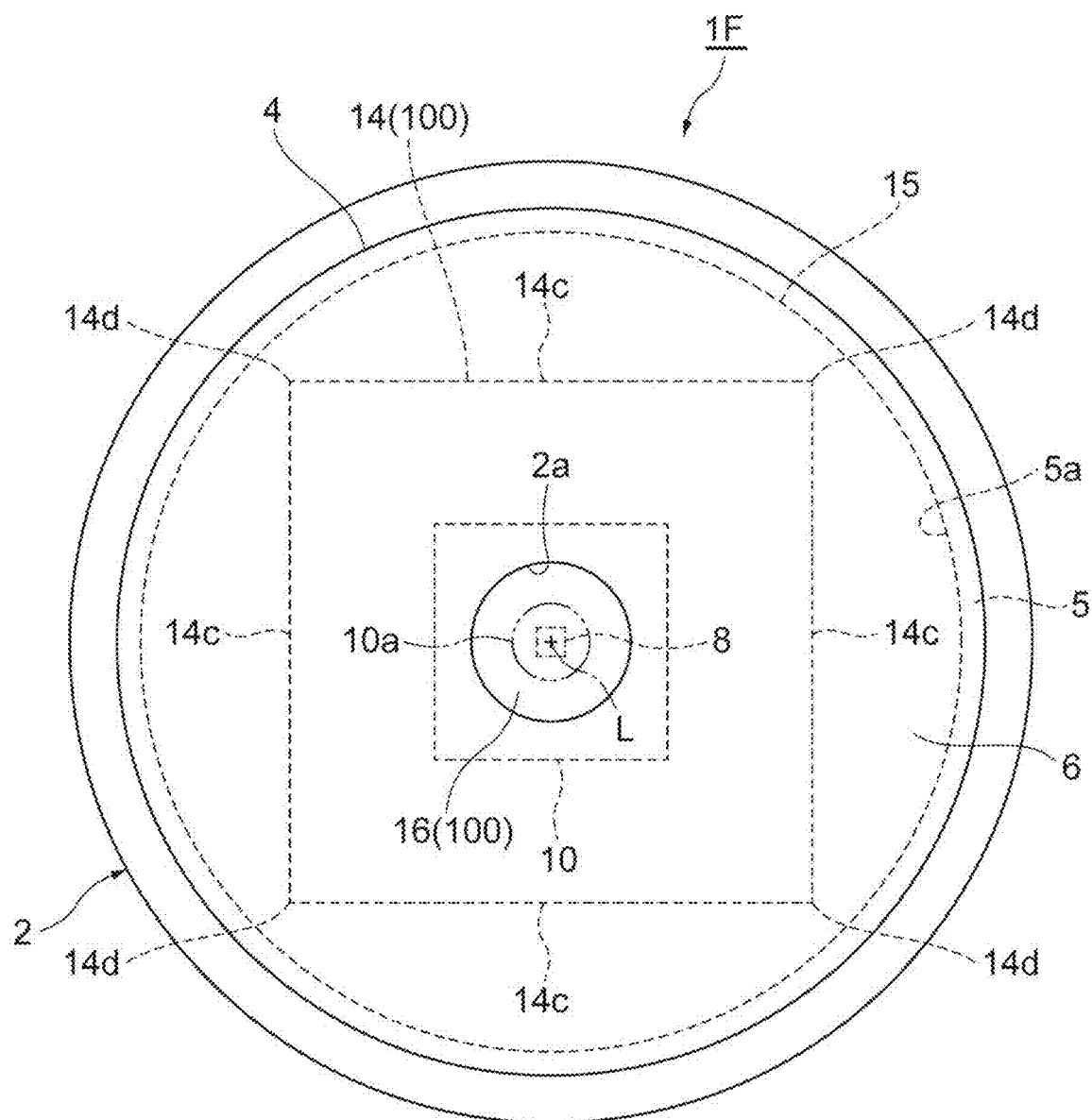
FIG. 28 is a plan view of the light detection device illustrated in FIG. 27.

As illustrated in FIGS. 27 and 28, a light detection device 1F is different from the light detection device 1D described above in that a light transmitting unit 100 does not include a light transmitting member 13. In the light detection device 1F, a band pass filter 14 is directly secured to an inner surface 6a of a top wall 6 by a bonding member 15. That is, in the light detection device 1F, the bonding member 15 secures the band pass filter 14 on the inner surface 6a of the top wall 6 without interposing another member (such as the light transmitting member 13 joined to the inner surface 6a of the top wall 6).

The first portion 15a of the bonding member 15 is arranged at a region of the light incident surface 14a of the band pass filter 14 facing the inner surface 6a of the top wall 6 excluding a region 14f facing the opening 2a. That is, the first portion 15a is arranged between the inner surface 6a of the top wall 6 and the region (that is, the region of the light incident surface 14a of the band pass filter 14 excluding the region 14f) facing each other.

A second portion 15b of the bonding member 15 protrudes outward from the perimeter of the band pass filter 14 when viewed from a direction parallel to line L. The second portion 15b is in contact with the inner surface 5a of the side wall 5 and the side surfaces 14c of the band pass filter 14.

The lens unit 16 is provided on the light incident surface 14a of the band pass filter 14. The lens unit 16 is arranged in the region 14f of the light incident surface 14a that is exposed to the opening 2a such that the center line thereof coincides with line L. The lens unit 16 is provided on the light incident surface 14a by, for example, bonding or resin potting.

Also in the light detection device 1F configured as described above, the light transmitting unit 100 provided in the package 2 so as to close the opening 2a is integrally configured including the band pass filter 14 and the lens unit 16, and thus highly sensitive and highly accuracy detection can be performed like in the light detection device 1A described above.

Furthermore, in the light detection device 1F, the lens unit 16 is provided to the light incident surface 14a of the band pass filter 14 by, for example, bonding or resin potting. In this case, the lens unit 16 has no influence when the dielectric multilayer film is formed in the band pass filter 14, and thus it is advantageous for forming the dielectric multilayer film accurately and easily.

In addition, the positional accuracy of the light transmitting unit 100 is improved in the light detection device 1F since the light transmitting unit 100 can be mounted on the inner surface 6a of the top wall 6 so as to arrange the lens unit 16 in the opening 2a after providing the lens unit 16 on the light incident surface 14a of the band pass filter 14.

According to the light detection device 1F, the band pass filter 14 can be caused to function properly like the light detection device 1D described above. Moreover, light detecting characteristics are improved in the light detection device 1F like in the light detection device 1D described above.

In the light detection device 1F, the bonding members 15 are arranged at a region of the light incident surface 14a of the band pass filter 14 facing the inner surface 6a of the top wall 6 excluding a region 14f facing the opening 2a. As a result, the band pass filter 14 is firmly secured to the inner surface 6a of the top wall 6. Furthermore, even if air bubbles are generated in the bonding member 15 at the time of manufacturing, the air bubbles easily escape not only from between the side surfaces 14c of the band pass filter 14 and the inner surface 5a of the side wall 5 but also from the opening 2a, scattering and diffraction of light and the like at the bonding member 15 are suppressed.

Figure 29:
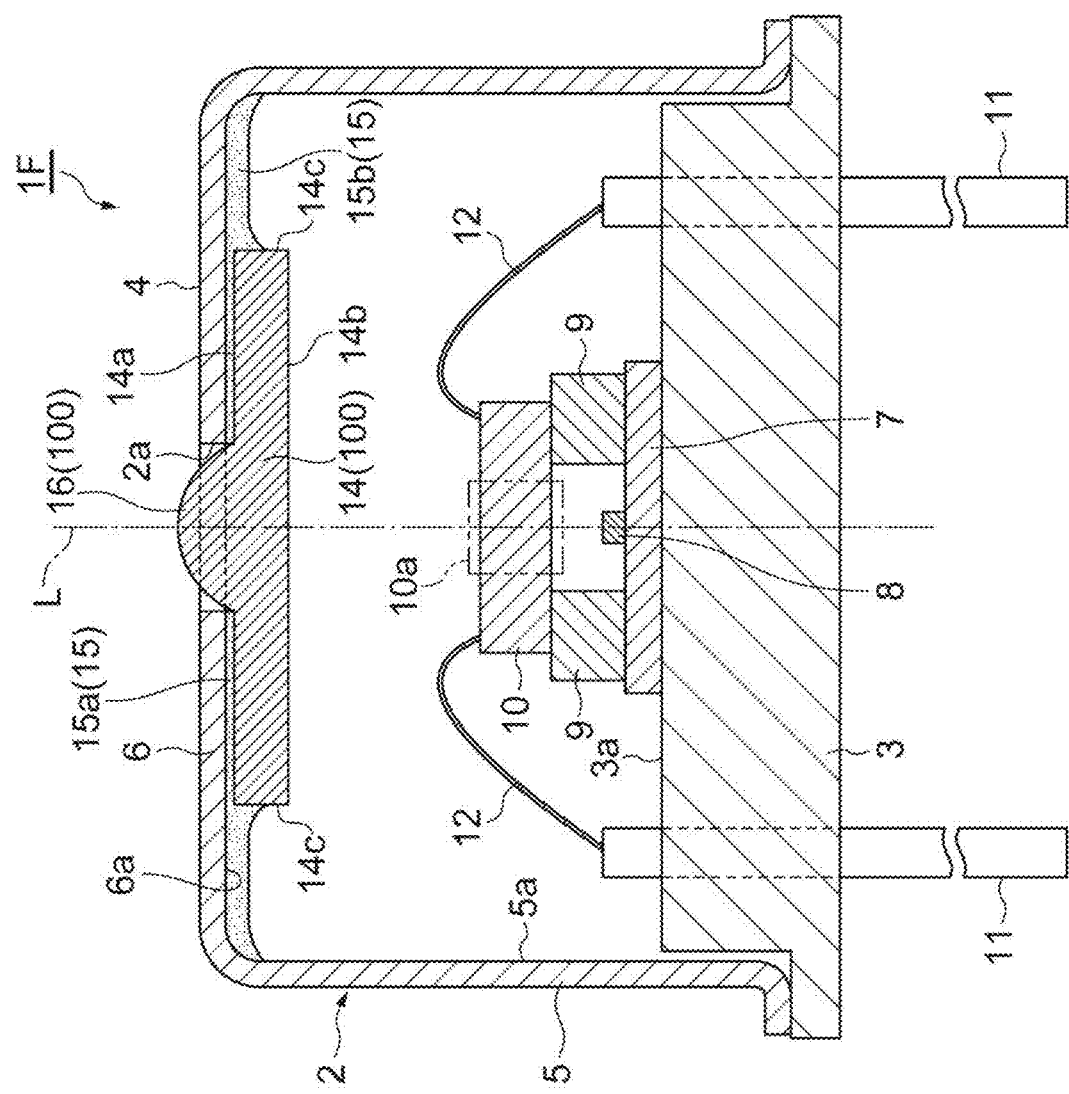
FIG. 29 is a cross-sectional view of a modification of the light detection device illustrated in FIG. 27.

Note that, as illustrated in FIG. 29, the lens unit 16 may be formed on the light incident surface 14a side of the band pass filter 14 as a part of the band pass filter 14. According to the light detection device 1F, the thickness of the band pass filter 14 can be increased such that the distance between the band pass filter 14 and a Fabry-Perot interference filter 10 is reduced. In this case, since the heat capacity of the band pass filter 14 is increased while the volume of the space in the package 2 is reduced, the temperature in the package 2 can be further uniformized. In addition, the lens unit 16 can be formed with high positional accuracy with respect to the band pass filter 14.

In addition, as illustrated in (a) of FIG. 30, the lens unit 16 may be provided on a light emitting surface 14b of the band pass filter 14 (surface facing the light incident surface 14a of the band pass filter 14) for example by bonding or resin potting. In this light detection device 1F, the lens unit 16 is a convex lens having a light emitting surface that is convex toward the light emitting side (the side opposite to the band pass filter 14). According to this light detection device 1F, since the incident angle of light incident on the band pass filter 14 is not affected by the lens unit 16, the band pass filter 14 is allowed to function more appropriately. Furthermore, it is possible to prevent occurrence of a damage such as a scratch in the lens unit 16 due to external physical interference. Note that in this case the lens unit 16 has no influence when the dielectric multilayer film is formed in the band pass filter 14, and thus it is advantageous for fixating the dielectric multilayer film accurately and easily.

Furthermore, as illustrated in (b) of FIG. 30, the lens unit 16 may be formed on the light emitting surface 14b side of the band pass filter 14 as a part of the band pass filter 14. In this light detection device 1F, the lens unit 16 is a convex lens having a light emitting surface that is convex toward the light emitting side (the side opposite to the band pass filter 14). In a case where the dielectric multilayer film of the band pass filter 14 is formed on the light incident surface 14a side of the band pass filter 14, the incident angle of light incident on the dielectric multilayer film is not affected by the lens unit 16. Therefore, the band pass filter 14 is allowed to function more properly. In a case where the dielectric multilayer film of the band pass filter 14 is forming on the light emitting surface 14b side of the band pass filter 14 so as to cover the light emitting surface of the lens unit 16, light is incident on the dielectric multilayer film along the thickness direction of the dielectric multilayer film, the band pass filter 14 is allowed to function properly. In addition, the lens unit 16 can be formed with high positional accuracy with respect to the band pass filter 14. Furthermore, it is possible to prevent occurrence of a damage such as a scratch in the lens unit 16 due to external physical interference.

Alternatively, a pair of lens units 16 may be provided as illustrated in (a) of FIG. 31. In the light detection device 1F, one of the lens units 16 is provided to the light incident surface 14a of the band pass filter 14 by, for example, bonding or resin potting. The other lens unit 16 is provided on the light emitting surface 14b of the band pass filter 14 by, for example, bonding or resin potting. According to this light detection device 1F, the light incident on the Fabry-Perot interference filter 10 can be condensed more reliably while the heights of the respective lens units 16 are kept low, thereby further increasing the ratio of light incident on the light transmission region 10a of the Fabry-Perot interference filter 10 in the light entering the package 2.

Further alternatively, a pair of lens units 16 may be provided as illustrated in (b) of FIG. 31. In this light detection device 1F, one of the lens units 16 is formed on the light incident surface 14a side of the band pass filter 14 as a part of the band pass filter 14. The other lens unit 16 is formed on the light emitting surface 14b side of the band pass filter 14 as a part of the band pass filter 14. According to this light detection device 1F, the light incident on the Fabry-Perot interference filter 10 can be condensed more reliably while the heights of the respective lens units 16 are kept low, thereby further increasing the ratio of light incident on the light transmission region 10a of the Fabry-Perot interference filter 10 in the light entering the package 2.

Note that, in the light detection device 1F illustrated in (a) of FIG. 31, the one lens unit 16 may be formed on the light incident surface 14a side of the band pass filter 14 as a part of the band pass filter 14. Alternatively, in the light detection device 1F illustrated in (a) of FIG. 31, the other lens unit 16 may be formed on the light emitting surface 14b side of the band pass filter 14 as a part of the band pass filter 14.

Seventh Embodiment

Figure 32:
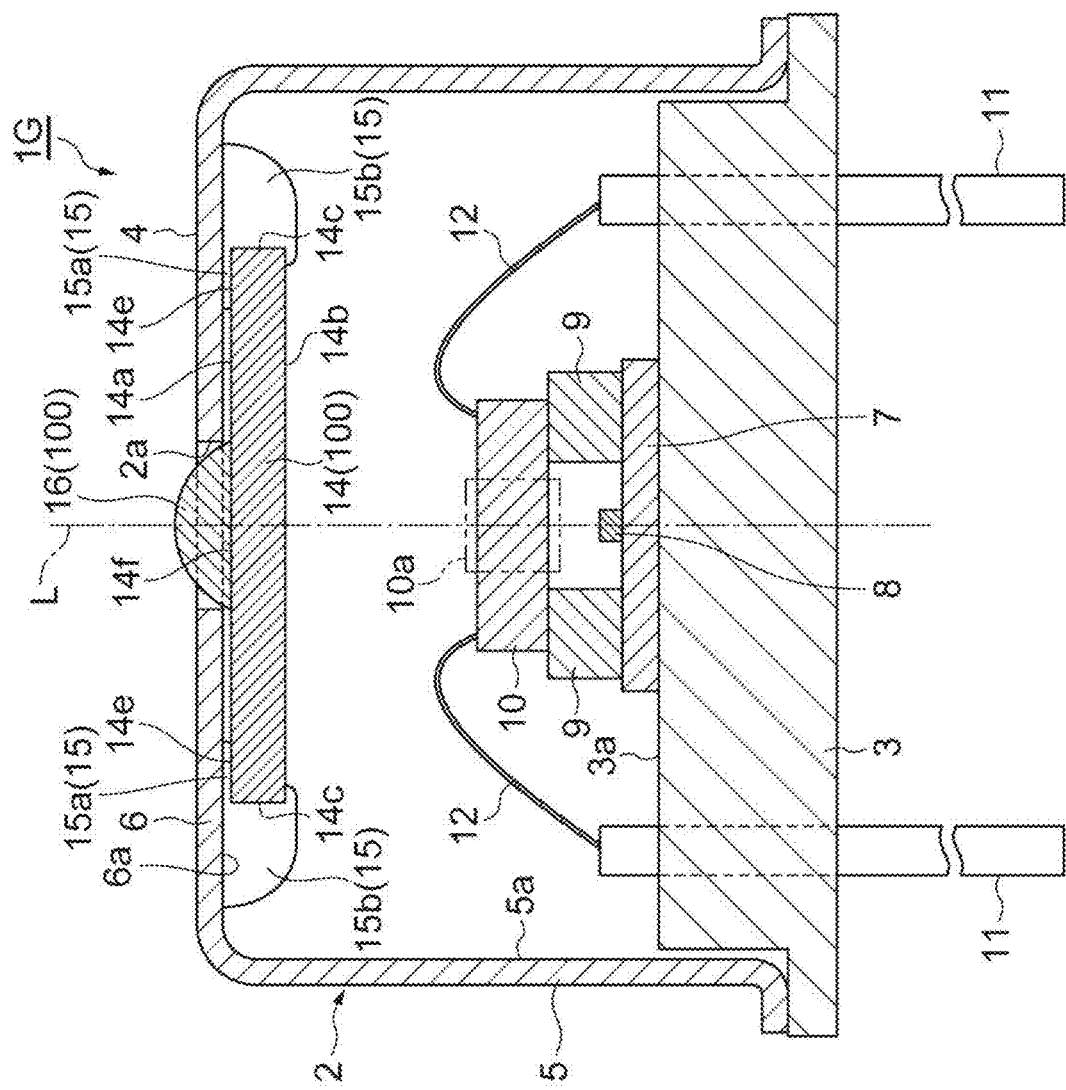
FIG. 32 is a cross-sectional view of a light detection device of a seventh embodiment.
Figure 33:
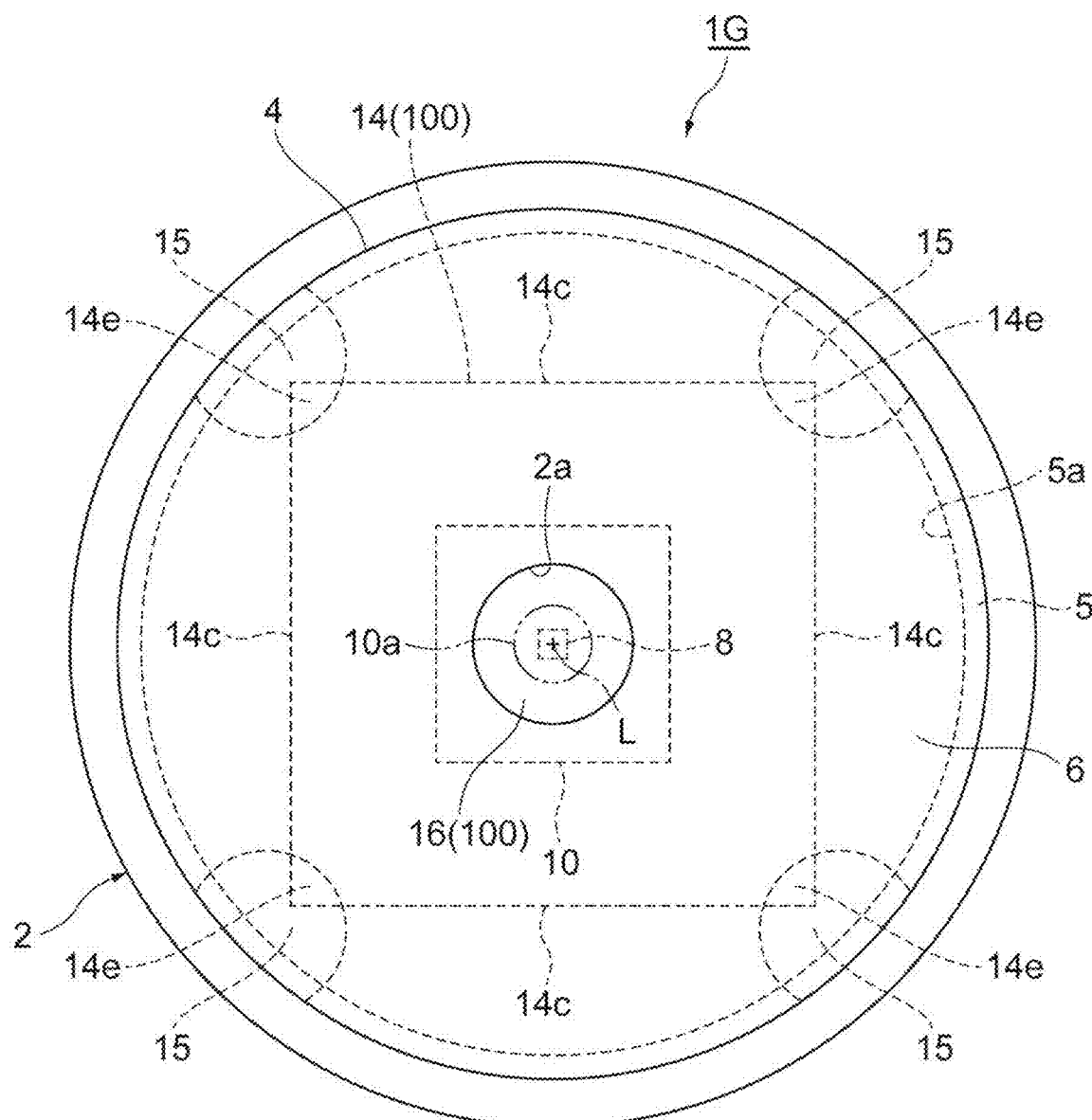
FIG. 33 is a plan view of the light detection device illustrated in FIG. 32.

As illustrated in FIGS. 32 and 33, a light detection device 1G is different from the light detection device 1E described above in that a light transmitting unit 100 does not include a light transmitting member 13. In the light detection device 1G, a band pass filter 14 is directly secured to an inner surface 6a of a top wall 6 by bonding members 15. That is, in the light detection device 1G, the bonding members 15 secure the band pass filter 14 on the inner surface 6a of the top wall 6 without interposing another member (such as the light transmitting member 13 joined to the inner surface 6a of the top wall 6).

First portions 15a of the bonding members 15 are arranged at corner regions 14e of a light incident surface 14a of the band pass filter 14. That is, the first portion 15a is arranged between the inner surface 6a of the top wall 6 and the corner regions 14e of the band pass filter 14 facing each other.

Each of the second portions 15b of the bonding members 15 protrudes outward from the perimeter of the band pass filter 14 at each of the corners of the band pass filter 14. Each of the second portions 15b is in contact with an inner surface 5a of a side wall 5 and side surfaces 14c of the band pass filter 14. Each of the second portions 15b also covers a region of the light emitting surface 14b of the band pass filter 14 that faces a corner region 14e.

The lens unit 16 is provided on the light incident surface 14a of the band pass filter 14. The lens unit 16 is arranged in the region 14f of the light incident surface 14a that is exposed to the opening 2a such that the center line thereof coincides with line L. The lens unit 16 is provided on the light incident surface 14a by, for example, bonding or resin potting.

Also in the light detection device 1G configured as described above, the light transmitting unit 100 provided in the package 2 so as to close the opening 2a is integrally configured including the band pass filter 14 and the lens unit 16, and thus highly sensitive and highly accuracy detection can be performed like in the light detection device 1A described above.

Furthermore, in the light detection device 1G, the lens unit 16 is provided to the light incident surface 14a of the band pass filter 14 by, for example, bonding or resin potting. In this case, the lens unit 16 has no influence when the dielectric multilayer film is formed in the band pass filter 14, and thus it is advantageous for fainting the dielectric multilayer film accurately and easily.

In addition, the positional accuracy of the light transmitting unit 100 is improved in the light detection device 1G since the light transmitting unit 100 can be mounted on the inner surface 6a of the top wall 6 so as to arrange the lens unit 16 in the opening 2a after providing the lens unit 16 on the light incident surface 14a of the band pass filter 14.

According to the light detection device 1G the band pass filter 14 can be caused to function properly like the light detection device 1D described above. Moreover, light detecting characteristics are improved in the light detection device 1G like in the light detection device 1D described above.

In the light detection device 1G, the bonding members 15 are not arranged in the region of the light incident surface 14a of the band pass filter 14 facing the inner surface 6a of the top wall 6 excluding the corner regions 14e but are arranged in the corner regions 14e. As a result, scattering and diffraction of light at the bonding member 15 are more reliably suppressed.

Figure 34:
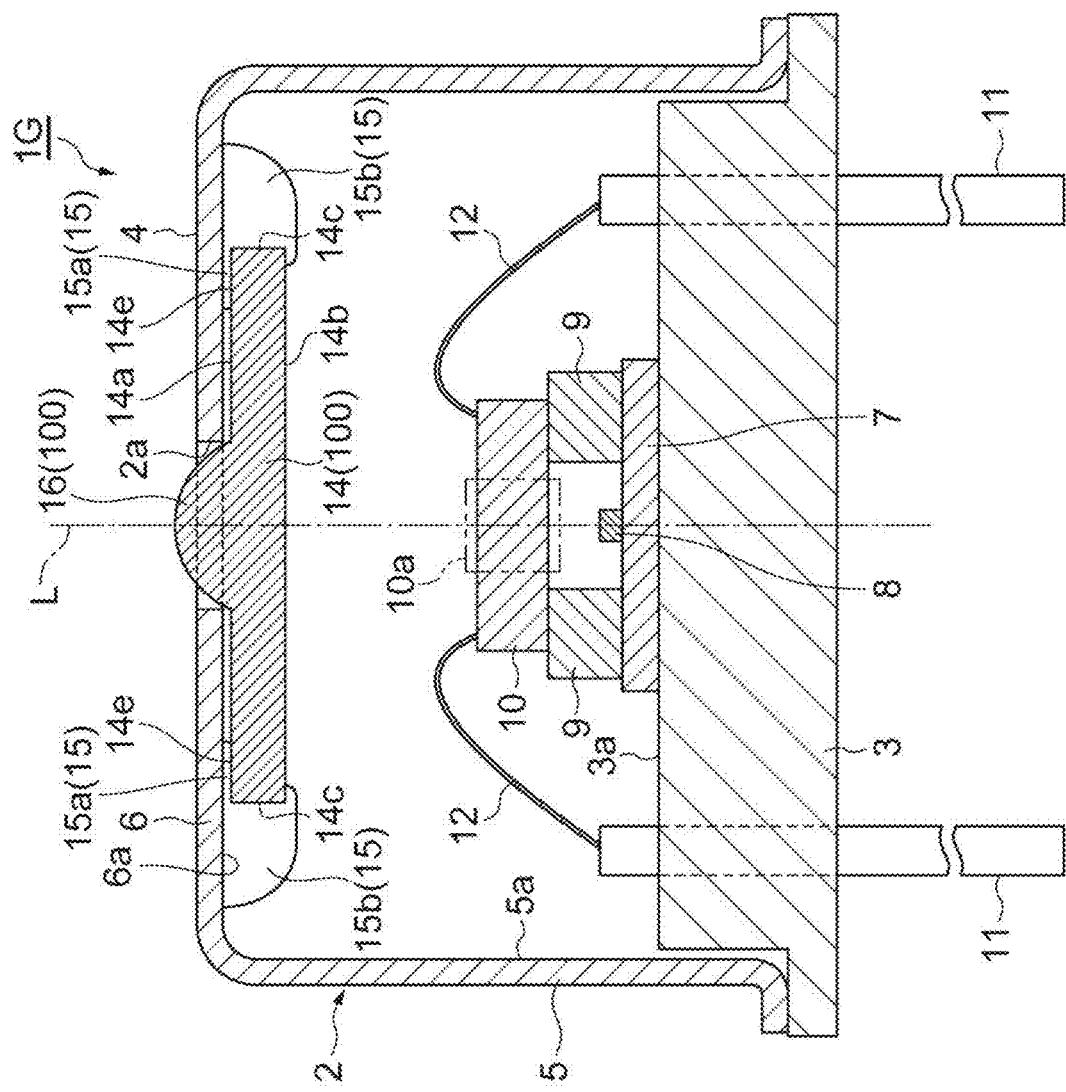
FIG. 34 is a cross-sectional view of a modification of the light detection device illustrated in FIG. 32.

Note that, as illustrated in FIG. 34, the lens unit 16 may be formed on the light incident surface 14a side of the band pass filter 14 as a part of the band pass filter 14. According to the light detection device 1G, the thickness of the band pass filter 14 can be increased such that the distance between the band pass filter 14 and a Fabry-Perot interference filter 10 is reduced. In this case, since the heat capacity of the band pass filter 14 is increased while the volume of the space in the package 2 is reduced, the temperature in the package 2 can be further uniformized. In addition, the lens unit 16 can be formed with high positional accuracy with respect to the band pass filter 14.

In addition, as illustrated in (a) of FIG. 35, the lens unit 16 may be provided on a light emitting surface 14b of the band pass filter 14 (surface facing the light incident surface 14a of the band pass filter 14) for example by bonding or resin potting. In this light detection device 1G, the lens unit 16 is a convex lens having a light emitting surface that is convex toward the light emitting side (the side opposite to the band pass filter 14). According to this light detection device 1G, since the incident angle of light incident on the band pass filter 14 is not affected by the lens unit 16, the band pass filter 14 is allowed to function more appropriately. Furthermore, it is possible to prevent occurrence of a damage such as a scratch in the lens unit 16 due to external physical interference. Note that in this case the lens unit 16 has no influence when the dielectric multilayer film is formed in the band pass filter 14, and thus it is advantageous for forming the dielectric multilayer film accurately and easily.

Furthermore, as illustrated in (b) of FIG. 35, the lens unit 16 may be formed on the light emitting surface 14b side of the band pass filter 14 as a part of the band pass filter 14. In this light detection device 1G, the lens unit 16 is a convex lens having a light emitting surface that is convex toward the light emitting side (the side opposite to the band pass filter 14). In a case where the dielectric multilayer film of the band pass filter 14 is formed on the light incident surface 14a side of the band pass filter 14, the incident angle of light incident on the dielectric multilayer film is not affected by the lens unit 16. Therefore, the band pass filter 14 is allowed to function more properly. In a case where the dielectric multilayer film of the band pass filter 14 is formed on the light emitting surface 14b side of the band pass filter 14 so as to cover the light emitting surface of the lens unit 16, light is incident on the dielectric multilayer film along the thickness direction of the dielectric multilayer film, the band pass filter 14 is allowed to function properly. In addition, the lens unit 16 can be formed with high positional accuracy with respect to the band pass filter 14. Furthermore, it is possible to prevent occurrence of a damage such as a scratch in the lens unit 16 due to external physical interference.

Figure 36:
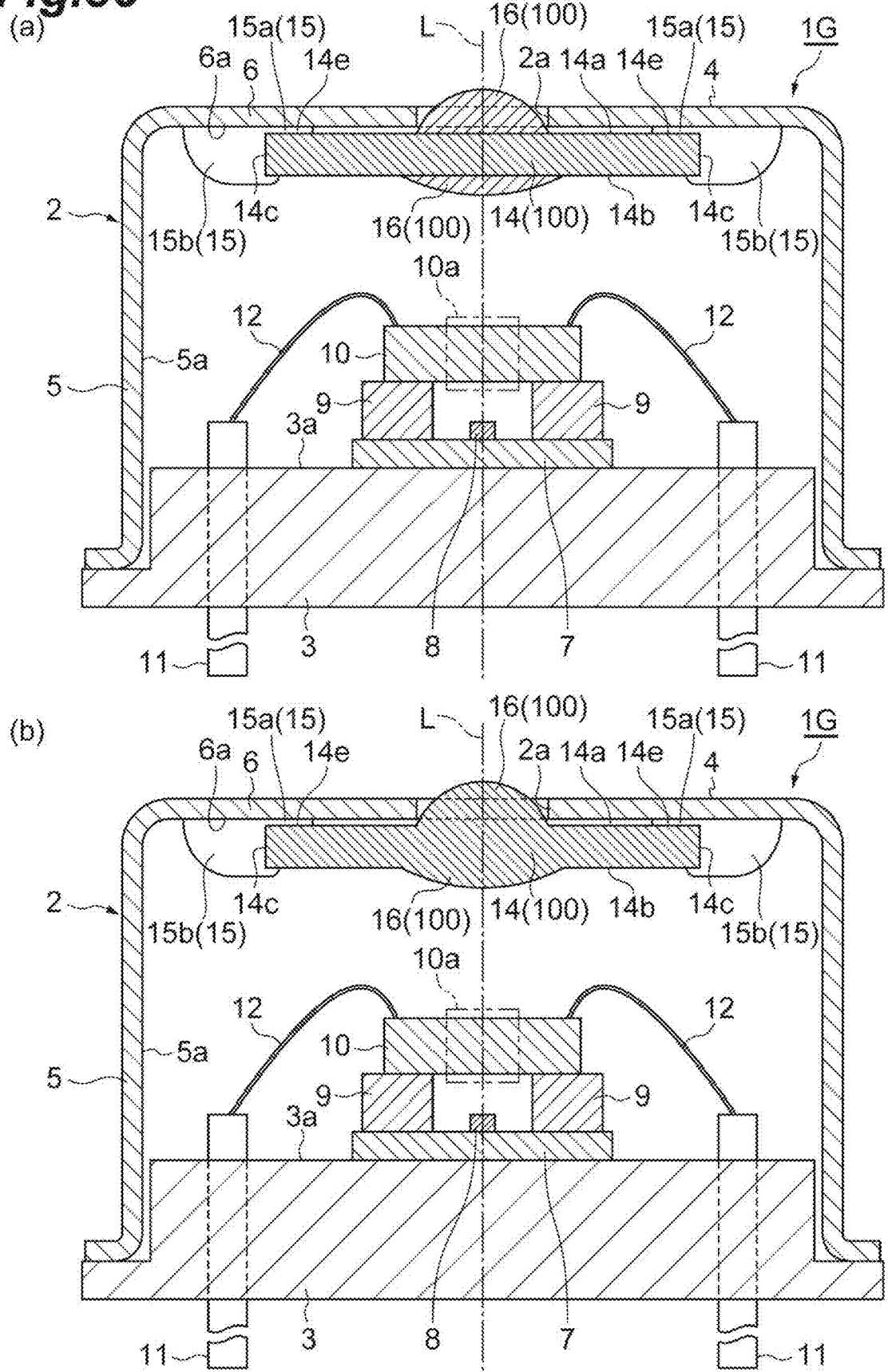
FIG. 36 is a set of cross-sectional views of modifications of the light detection device illustrated in FIG. 32.

Alternatively, a pair of lens units 16 may be provided as illustrated in (a) of FIG. 36. In the light detection device 1G, one of the lens units 16 is provided to the light incident surface 14a of the band pass filter 14 by, for example, bonding or resin potting. The other lens unit 16 is provided on the light emitting surface 14b of the band pass filter 14 by, for example, bonding or resin potting. According to this light detection device 1G, the light incident on the Fabry-Perot interference filter 10 can be condensed more reliably while the heights of the respective lens units 16 are kept low, thereby further increasing the ratio of light incident on the light transmission region 10a of the Fabry-Perot interference filter 10 in the light entering the package 2.

Further alternatively, a pair of lens units 16 may be provided as illustrated in (b) of FIG. 36. In this light detection device 1G, one of the lens units 16 is forming on the light incident surface 14a side of the band pass filter 14 as a part of the band pass filter 14. The other lens unit 16 is formed on the light emitting surface 14b side of the band pass filter 14 as a part of the band pass filter 14. According to this light detection device 1G, the light incident on the Fabry-Perot interference filter 10 can be condensed more reliably while the heights of the respective lens units 16 are kept low, thereby further increasing the ratio of light incident on the light transmission region 10a of the Fabry-Perot interference filter 10 in the light entering the package 2.

Note that, in the light detection device 1G illustrated in (a) of FIG. 36, the one lens unit 16 may be formed on the light incident surface 14a side of the band pass filter 14 as a part of the band pass filter 14. Alternatively, in the light detection device 1G illustrated in (a) of FIG. 36, the other lens unit 16 may be formed on the light emitting surface 14b side of the band pass filter 14 as a part of the band pass filter 14.

[Modifications]

Although the first to seventh embodiments of the present disclosure have been described above, the present disclosure is not limited to the embodiments described above. The material and the shape of the respective components are not limited to the aforementioned materials and the shapes but may employ various materials and shapes. For example, in all the examples described above, a lens unit 16 may be a Fresnel lens. In particular, in a case where a lens unit 16 is provided on the light emitting side (on the Fabry-Perot interference filter 10 side) of a light transmitting unit 100, the distance between the light transmitting unit 100 and the Fabry-Perot interference filter 10 can be reduced with the configuration that the lens unit 16 is a Fresnel lens. As a result, since the volume of the space in the package 2 is reduced, the temperature in the package 2 can be further uniformized.

Moreover, a band pass filter 14 may be provided on a light incident surface 13a of a light transmitting member 13 or may be provided on both the light incident surface 13a and a light emitting surface 13b of the light transmitting member 13. In a case where a band pass filter 14 is configured by forming a dielectric multilayer film on a surface of a substrate (another light transmitting member separate from the light transmitting member 13) (for example, in the cases of the light detection devices 1C, 1E, and 1D), the dielectric multilayer film may be formed on either the light incident surface or the light emitting surface of the substrate or may be formed on both the light incident surface and the light emitting surface of the substrate. In a band pass filter 14 configured by forming dielectric multilayer films on both the light incident surface and the light emitting surface of a substrate, light of a desired wavelength band can be transmitted by configuring one of the dielectric multilayer films as a long-pass filter and configuring the other dielectric multilayer film as a short-pass filter.

Moreover, in a Fabry-Perot interference filter 10, a second layer structure 40 may not have a laminated structure symmetrical to a first layer structure 30 with respect to the substrate 21 as long as the second layer structure 40 is structured to correspond to the first layer structure 30. In the case where the second layer structure 40 has a layer structure capable of suppressing warpage or the like of the substrate 21 as compared with the case where the second layer structure 40 is not included, the second layer structure 40 can be said to correspond to the first layer structure 30. In addition, the Fabry-Perot interference filter 10 may not include the second layer structure 40.

In the light detection devices 1D to 1G, the bonding members 15 may not protrude outward from the perimeter of the band pass filters 14. In the light detection devices 1D to 1G, the second portions 15*b* of the bonding members 15 protruding outward from the perimeter of the band pass filter 14 may not extend to the inner surface 5*a* of the side wall 5 and may be separated from the inner surface 5*a* of the side wall 5. For example, in a case where a material of the bonding member 15 is light transmitting resin, from the viewpoint of improving the securing strength of the band pass filter 14 to the inner surface 6*a* of the top wall 6, it is preferable that the second portion 15*b* extends to the inner surface 5*a* of the side wall 5. However, for example in a case where the material of the bonding members 15 is a resin having a high hardness, from the viewpoint of preventing a crack from occurring in the bonding members 15 due to a stress acting on the bonding members 15 from the side wall 5, it is preferable that the second portions 15*b* do not extend to the inner surface 5*a* of the side wall 5.

In the light detection devices 1D and 1F, the thickness of the second portions 15*b* in a direction parallel to line L may be maximized at the portion being in contact with the inner surface 5*a* of the side wall 5 depending on the viscosity of the bonding members 15. As a result, for example at the time of curing the bonding members 15, it is possible to suppress occurrence of a crack in the bonding members 15 at portions corresponding to the corners 14*d* of the band pass filter 14. This also prevents the bonding members 15 from reaching onto the light emitting surface 14*b* of the band pass filter 14.

Since the bonding members 15 are not arranged in a region facing the opening 2*a* on line L in the light detection devices 1E to 1G, the bonding members 15 may be made of a material which does not transmit light.

Furthermore, in the light detection devices 1D to 1G, the shape of the band pass filter 14 is not limited to a rectangular plate shape, and may be a polygonal plate shape. In this case also, the band pass filter 14 is positioned with high accuracy by the respective corners, and the band pass filter 14 becomes less likely to be thermally affected by the package 2. Therefore, even in a case where the band pass filter 14 has a polygonal plate shape, the band pass filter 14 is allowed to function properly.

Furthermore, depending on the type of a light receiving element used as the light detector 8, the band pass filter 14 is required not only to cut off multi-order light having an order higher than or equal to three appearing on a shorter wavelength side but also to cut off light appearing on a longer wavelength (for example, a=1) side. That is, in a light detection device for obtaining an optical spectrum with respect to an A-th order light (a=A), it is necessary to cut off both higher order light (a>A) appearing on the shorter wavelength side and lower order light (a<A) appearing on the longer wavelength side.

Moreover, the package 2 is not limited to the CAN package as described above and may be any package as the following. That is, the package 2 may be any package as long as the package includes a first wall formed with an opening 2*a*, a Fabry-Perot interference filter 10, a second wall facing the first wall with a band pass filter 14 and a light detector 8 interposed therebetween, and a side wall surrounding the Fabry-Perot interference filter 10, the band pass filter 14, and the light detector 8.

REFERENCE SIGNS LIST 1A, 1B, 1C, 1D, 1E, 1F, 1G . . . light detection device, 2 . . . package, 2*a* . . . opening, 8 . . . light detector, 10 . . . Fabry-Perot interference filter, 13 . . . light transmitting member, 13*a* . . . light incident surface, 13*b* . . . light emitting surface, 14 . . . band pass filter, 14*b* . . . light emitting surface, 16 . . . lens unit, 35 . . . first mirror, 36 . . . second mirror, 100 . . . light transmitting unit

The invention claimed is:

1. A light detection device comprising:
    a package including an opening configured to allow light to enter therefrom;
    a light transmitting unit arranged on an inner surface of the package so as to close the opening;
    a Fabry-Perot interference filter arranged in the package and having a first mirror and a second mirror, a distance between the first mirror and the second mirror being variable, the Fabry-Perot interference filter configured to transmit the light transmitted by the light transmitting unit; and
    a light detector arranged in the package and configured to detect the light transmitted by the Fabry-Perot interference filter,
    wherein the light transmitting unit is integrally configured by including:
    a band pass filter arranged in the package and configured to transmit the light to be incident on the Fabry-Perot interference filter; and
    at least one lens unit configured to condense the light to be incident on the Fabry-Perot interference filter.

2. The light detection device according to claim 1, wherein a perimeter of the Fabry-Perot interference filter is positioned outside a perimeter of the opening, and a perimeter of the light transmitting unit is positioned outside the perimeter of the Fabry-Perot interference filter when viewed from an incident direction of the light.

3. The light detection device according to claim 1,
    wherein the light transmitting unit includes a light transmitting member and is integrally formed with the band pass filter and the lens unit,
    the band pass filter is provided on a light emitting surface of the light transmitting member, and
    the lens unit is formed on a light incident surface side of the light transmitting member as a part of the light transmitting member.

4. The light detection device according to claim 1,
    wherein the light transmitting unit includes a light transmitting member and is integrally formed with the band pass filter and the lens unit,
    the band pass filter is provided on a light emitting surface of the light transmitting member, and the lens unit is provided on a light emitting surface of the band pass filter.

5. The light detection device according to claim 1, wherein the light transmitting unit including a light transmitting member and is integrally formed with the band pass filter and the lens unit,
the band pass filter is provided on a light emitting surface of the light transmitting member,
the at least one lens unit is a pair of lens units,
one of the pair of lens units is formed on a light incident surface side of the light transmitting member as a part of the light transmitting member, and
another one of the pair of lens units is provided on a light emitting surface of the band pass filter.

6. The light detection device according to claim 3, wherein a perimeter of the light transmitting member is positioned outside the perimeter of the Fabry-Perot interference filter when viewed from an incident direction of the light.

7. The light detection device according to claim 6, wherein a perimeter of the band pass filter is positioned outside the perimeter of the Fabry-Perot interference filter when viewed from an incident direction of the light.

8. The light detection device according to claim 4, wherein a perimeter of the light transmitting member is positioned outside the perimeter of the Fabry-Perot interference filter when viewed from an incident direction of the light.

9. The light detection device according to claim 8, wherein a perimeter of the band pass filter is positioned outside the perimeter of the Fabry-Perot interference filter when viewed from an incident direction of the light.

10. The light detection device according to claim 5, wherein a perimeter of the light transmitting member is positioned outside the perimeter of the Fabry-Perot interference filter when viewed from an incident direction of the light.

11. The light detection device according to claim 10, wherein a perimeter of the band pass filter is positioned outside the perimeter of the Fabry-Perot interference filter when viewed from an incident direction of the light.

* * * * *